(12) United States Patent
Park et al.

(10) Patent No.: US 12,200,980 B2
(45) Date of Patent: Jan. 14, 2025

(54) DISPLAY PANEL

(71) Applicant: Samsung Display Co., Ltd., Yongin-si (KR)

(72) Inventors: Hyungjun Park, Yongin-si (KR); Wonkyu Kwak, Yongin-si (KR); Jintae Jeong, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/558,409

(22) Filed: Dec. 21, 2021

(65) Prior Publication Data

US 2022/0115477 A1 Apr. 14, 2022

Related U.S. Application Data

(63) Continuation of application No. 16/597,746, filed on Oct. 9, 2019.

(30) Foreign Application Priority Data

Jan. 18, 2019 (KR) ................. 10-2019-0006924
May 8, 2019 (KR) ................. 10-2019-0053907

(51) Int. Cl.
  *H10K 59/10* (2023.01)
  *H10K 59/124* (2023.01)
  (Continued)

(52) U.S. Cl.
  CPC ......... *H10K 59/124* (2023.02); *H10K 59/131* (2023.02); *H10K 50/15* (2023.02);
  (Continued)

(58) Field of Classification Search
  CPC .... H10K 59/124; H10K 59/131; H10K 50/17; H10K 50/16; H10K 50/171; H10K 50/15
  (Continued)

(56) References Cited

U.S. PATENT DOCUMENTS 6,280,273 B1 8/2001 Codama
7,538,354 B2 5/2009 Hayashi et al.
(Continued)

FOREIGN PATENT DOCUMENTS

CN 104218054 A 12/2014
CN 106887523 A 6/2017
(Continued)

OTHER PUBLICATIONS

Advisory Action for U.S. Appl. No. 16/597,746 dated Feb. 1, 2022, 3 pages.
(Continued)

*Primary Examiner* — Ori Nadav
(74) *Attorney, Agent, or Firm* — Lewis Roca Rothgerber Christie LLP

(57) ABSTRACT

A display panel includes: a substrate including a first region, a second region, and a third region between the first region and the second region; a display element located in the second region and including a pixel electrode, an opposite electrode, an intermediate layer; a multi-layered film arranged between the substrate and the pixel electrode and including an organic insulating layer and an inorganic layer on the organic insulating layer; and at least one groove formed in the multi-layered film and located in the third region, wherein at least one organic material layer is included in the intermediate layer and is disconnected by the at least one groove.

8 Claims, 50 Drawing Sheets

(51) Int. Cl.
  *H10K 59/131* (2023.01)
  *H10K 50/15* (2023.01)
  *H10K 50/16* (2023.01)
  *H10K 50/17* (2023.01)

(52) U.S. Cl.
  CPC ............ *H10K 50/16* (2023.02); *H10K 50/17* (2023.02); *H10K 50/171* (2023.02)

(58) Field of Classification Search
  USPC .......................................................... 257/40
  See application file for complete search history.

(56) References Cited

U.S. PATENT DOCUMENTS

| | | | |
|---|---|---|---|
| 8,659,021 | B2 | 2/2014 | You et al. |
| 8,659,224 | B1 | 2/2014 | Moon |
| 8,698,147 | B2 | 4/2014 | Choi et al. |
| 9,287,342 | B2 | 3/2016 | Kwon et al. |
| 9,818,807 | B2 | 11/2017 | Park |
| 10,205,122 | B2 | 2/2019 | Choi et al. |
| 11,068,092 | B2 | 7/2021 | Han et al. |
| 2004/0224241 | A1 | 11/2004 | Park et al. |
| 2006/0087042 | A1 | 4/2006 | Kameyama et al. |
| 2008/0116544 | A1 | 5/2008 | Grinman et al. |
| 2014/0353609 | A1 | 12/2014 | Song |
| 2015/0221893 | A1* | 8/2015 | Teraguchi ............ H10K 50/856 438/35 |
| 2016/0062161 | A1 | 3/2016 | Lee et al. |
| 2017/0148856 | A1 | 5/2017 | Choi et al. |
| 2017/0162637 | A1 | 6/2017 | Choi et al. |
| 2017/0194404 | A1 | 7/2017 | Park et al. |
| 2018/0102373 | A1 | 4/2018 | Sashida et al. |
| 2018/0151834 | A1 | 5/2018 | Kanaya |
| 2018/0183015 | A1 | 6/2018 | Yun et al. |
| 2018/0366586 | A1 | 12/2018 | Son et al. |
| 2019/0348476 | A1 | 11/2019 | Kato |
| 2020/0020752 | A1 | 1/2020 | Shi et al. |
| 2020/0119304 | A1 | 4/2020 | Choi et al. |
| 2020/0168683 | A1 | 5/2020 | Son et al. |

FOREIGN PATENT DOCUMENTS

| | | |
|---|---|---|
| CN | 106935628 A | 7/2017 |
| CN | 107039493 A | 8/2017 |
| CN | 107579171 A | 1/2018 |
| CN | 109148514 A | 1/2019 |
| CN | 110416435 A | 11/2019 |
| EP | 3 565 004 A1 | 11/2019 |
| JP | 11-307240 A | 11/1999 |
| JP | 2018-124816 A | 8/2018 |
| KR | 10-2010-0133725 A | 12/2010 |
| KR | 10-2017-0059864 A | 5/2017 |
| KR | 10-2017-0066767 A | 6/2017 |
| KR | 10-2018-0076429 A | 7/2018 |

OTHER PUBLICATIONS

Office Action for U.S. Appl. No. 16/597,746 dated Apr. 29, 2021, 6 pages.
Office Action for U.S. Appl. No. 16/597,746 dated Apr. 28, 2022, 14 pages.
Office Action for U.S. Appl. No. 16/597,746 dated Aug. 4, 2021, 12 pages.
Office Action for U.S. Appl. No. 16/597,746 dated Nov. 26, 2021, 15 pages.
Extended European Search Report for corresponding European Patent Application No. 20150647.4, dated Jul. 1, 2020, 12 pages.
U.S. Final Office Action dated Jul. 29, 2022, issued in U.S. Appl. No. 16/597,746 (15 pages).
U.S. Advisory Action dated Oct. 13, 2022, issued in U.S. Appl. No. 16/597,746 (3 pages).
U.S. Office Action dated Dec. 8, 2022, issued in U.S. Appl. No. 16/597,746 (11 pages).
Final Rejection for U.S. Appl. No. 16/597,746 dated Mar. 16, 2023, 13 pages.
U.S. Notice of Allowance dated Nov. 2, 2023, issued in U.S. Appl. No. 16/597,746 (8 pages).
U.S. Office Action dated Jul. 7, 2023, issued in U.S. Appl. No. 16/597,746 (12 pages).

* cited by examiner

DISPLAY PANEL

CROSS-REFERENCE TO RELATED APPLICATIONS

This application is a continuation of U.S. patent application Ser. No. 16/597,746, filed Oct. 9, 2019, which claims priority to and the benefit of Korean Patent Application No. 10-2019-0006924, filed Jan. 18, 2019 and Korean Patent Application No. 10-2019-0053907, filed May 8, 2019, the entire content of all of which is incorporated herein by reference.

BACKGROUND

1. Field

One or more aspects of embodiments of the present disclosure are directed toward a display panel including a first region inside a display area, and a display device including the display panel.

2. Description of the Related Art

Recently, the purposes of a display device have become more diversified. Also, as display devices have become thinner and more lightweight, their range of use has gradually been extended.

As the display area of display devices increases, functions that may be combined or associated with a display device are being added. As a way of adding various functions while increasing the display area, research into a display device in which various elements may be arranged in a display area is in progress.

SUMMARY

One or more aspects of embodiments of the present disclosure are directed toward a display panel including a first region and a display device including the display panel, where the first region may be utilized for various purposes such as a region for arranging various kinds of components inside a display area. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more embodiments, a display panel includes: a substrate including a first region in which a through hole is formed, a second region, and a third region, the third region being between the first region and the second region; a display element located in the second region and including a pixel electrode, an opposite electrode, an intermediate layer, the intermediate layer being between the pixel electrode and the opposite electrode; a multi-layered film between the substrate and the pixel electrode and including an organic insulating layer and an inorganic layer on the organic insulating layer; and at least one groove formed in the multi-layered film and in the third region, wherein at least one organic material layer included in the intermediate layer is disconnected by the at least one groove.

The inorganic layer may include at least one of a metal layer or an inorganic insulating layer.

The display panel may further include: a pixel circuit including a thin film transistor and a storage capacitor, each being electrically connected to the display element, wherein the inorganic layer may include the same material as that of a contact metal layer connecting the pixel circuit and the thin film transistor.

The at least one organic material layer may include one or more selected from a hole transport layer, a hole injection layer, an electron injection layer, and an electron transport layer.

The organic insulating layer may include at least one opening adjacent to the groove, and the inorganic layer may directly contact a lower layer arranged under the organic insulating layer through the at least one opening.

The at least one opening of the organic insulating layer may include a first opening and a second opening, the at least one groove being between the first opening and the second opening, and the inorganic layer may directly contact the lower layer through the first opening and the second opening.

The lower layer may include an inorganic insulating layer.

The lower layer may include a metal layer.

The lower layer may include the same material as that of the inorganic layer.

The at least one groove may include: a first hole defined in the inorganic layer; and a second hole or a recess defined in the organic insulating layer.

The multi-layered film may include at least one lower insulating layer arranged under the organic insulating layer, the at least one lower insulating layer including an inorganic insulating layer.

A bottom surface of the at least one groove may be located on a virtual surface between a top surface of the substrate and a top surface of the at least one lower insulating layer.

The at least one lower insulating layer may have an opening overlapping the at least one groove.

The multi-layered film may further include at least one top insulating layer arranged on the organic insulating layer, the at least one top insulating layer including a hole overlapping the at least one groove.

The at least one top insulating layer may cover a lateral surface of the inorganic layer that defines the at least one groove.

According to one or more embodiments, a display panel includes: a substrate including a first region, a second region in which a pixel is arranged, and a third region between the first region and the second region; a thin film transistor located in the second region; a multi-layered film located in the third region and including an organic insulating layer and an inorganic layer, a portion of the organic insulating layer covering the thin film transistor, and the inorganic layer being on the organic insulating layer; at least one groove defined in the multi-layered film; and a stacked body arranged on the multi-layered film and including a pixel electrode, an opposite electrode, and an intermediate layer, the pixel electrode corresponding to the pixel, and the intermediate layer being between the pixel electrode and the opposite electrode, wherein the intermediate layer may include at least one organic material layer disconnected around the at least one groove.

The at least one groove may have an undercut shape.

The inorganic layer of the multi-layered film may include at least one of a metal or an inorganic insulating material.

The at least one organic material layer may include one or more selected from a hole transport layer, a hole injection layer, an electron injection layer, and an electron transport layer.

The third region may include an inorganic contact region adjacent to the at least one groove.

The organic insulating layer may include at least one opening located in the third region and adjacent to the at least one groove, and the inorganic layer may define the inorganic contact region by directly contacting a lower inorganic layer arranged under the organic insulating layer through the at least one opening.

The lower inorganic layer may include an inorganic insulating layer.

The lower inorganic layer may include a metal layer.

The at least one groove may include a first groove and a second groove apart from each other, and the inorganic contact region may be between the first groove and the second groove.

The multi-layered film may further include at least one top insulating layer located on the inorganic layer, and the at least one top insulating layer may include a hole corresponding to the at least one groove.

The at least one top insulating layer may cover a lateral surface of an end of the inorganic layer that faces a center of the at least one groove.

The at least one top insulating layer may include at least one of an organic insulating layer or an inorganic insulating layer.

The at least one groove may include a first hole defined in the inorganic layer; and a second hole or a recess defined in the organic insulating layer.

The multi-layered film may include at least one lower insulating layer arranged under the organic insulating layer, the at least one lower insulating layer including an inorganic insulating layer.

The at least one lower insulating layer may have an opening overlapping the at least one groove.

These and/or other aspects will become apparent and more readily appreciated from the following description of the embodiments, taken in conjunction with the accompanying drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
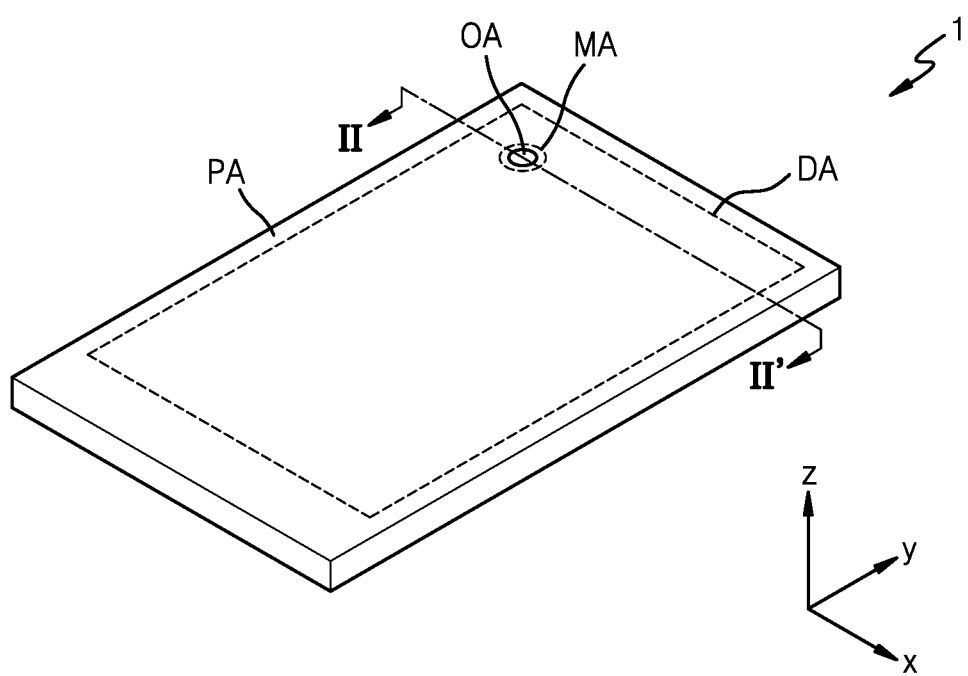
FIG. 1 is a perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. In the present specification, "A and/or B" represents A or B, or A and B. Throughout the disclosure, the expression "at least one of a, b or c" indicates only a, only b, only c, both a and b, both a and c, both b and c, all of a, b, and c, or variations thereof. Further, the use of "may" when describing embodiments of the present invention refers to "one or more embodiments of the present invention."

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will not be provided.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises," "includes," "comprising," and/or "including" used herein specify the presence of stated features or components, but do not preclude the presence or addition of one or more other features or components.

It will be understood that when a layer, region, or component is referred to as being "formed on" or "on" another layer, region, or component, it can be directly or indirectly formed on the other layer, region, or component. That is, for example, intervening layers, regions, or components may be present. In contrast, when a layer, region, or component is referred to as being "directly formed on" or "directly on" another layer, region, or component, no intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a perspective view of a display device 1 according to an embodiment.

Referring to FIG. 1, the display device 1 includes a first area OA and a display area DA (which may be referred to herein as a second area) at least partially surrounding the first area OA. The display device 1 may provide a predetermined (or set) image by using light emitted from a plurality of pixels arranged in the display area DA. It is shown in FIG. 1 that one first area OA is arranged inside the display area DA, and the first area OA may be entirely surrounded by the display area DA. The first area OA may be an area in which a component, which will be described below with reference to FIG. 2, is arranged.

An intermediate area MA may be arranged as a third area between the first area OA and the display area DA, which is the second area. The display area DA may be surrounded by a peripheral area PA, which is a fourth area. The intermediate area MA and the peripheral area PA may be non-display areas in which pixels are not arranged. The intermediate area MA may be entirely surrounded by the display area DA, and the display area DA may be entirely surrounded by the peripheral area PA (e.g., the peripheral area PA may be completely around the display area DA).

Though an organic light-emitting display device is exemplarily described as the display device 1 according to an embodiment below, the display device 1 is not limited thereto. In another embodiment, a display device such as a quantum dot light-emitting display may be used.

Though it is shown in FIG. 1 that one first area OA is provided and is approximately circular, the present disclosure is not limited thereto. The number of first areas OA may be two or more, and a shape of each of the first areas OA be a circular shape, an elliptical shape, a polygonal shape, a star shape, and/or a diamond shape, and may be variously modified.

Though it is shown in FIG. 1 that the first area OA is arranged on an upper left side of the display area DA, the present disclosure is not limited thereto. In other embodiments, the first area OA may be arranged on an upper right side, lower left side, lower right side, or center of the display area DA (for example, upper center of the display area DA), without limitation. Though it is shown in FIG. 1 that the display area DA has a substantially rectangle shape, the present disclosure is not limited thereto. A shape of the display area DA may be a circular shape, an elliptical shape, a polygonal shape, a star shape, and/or a diamond shape, and may be variously modified.

Figure 2A:
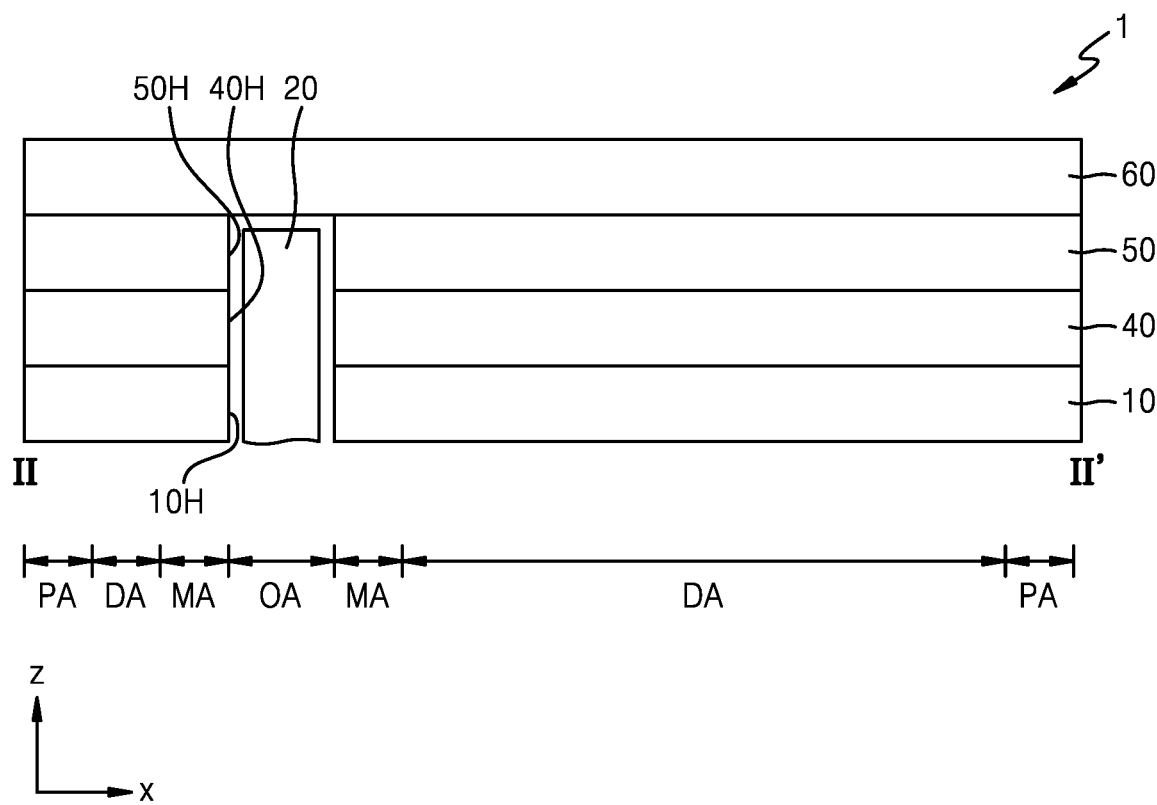
FIGS. 2A and 2B are cross-sectional views of a display device according to an embodiment.
Figure 2B:
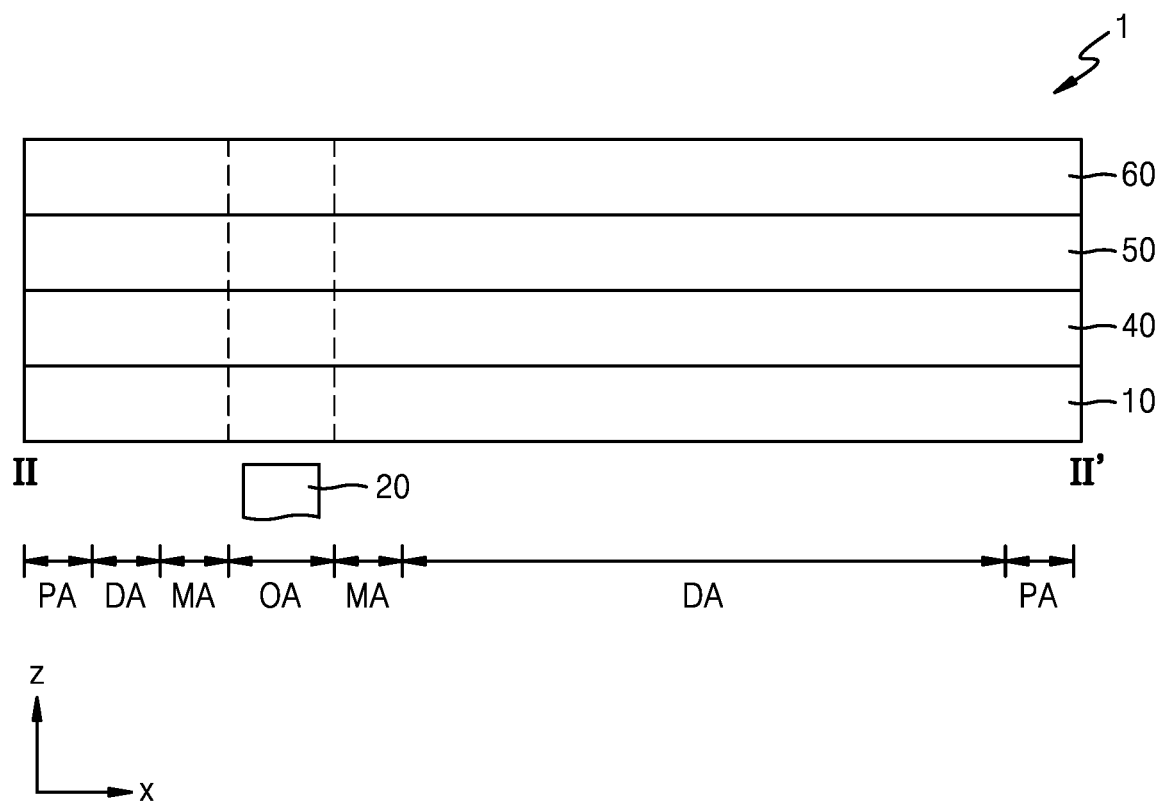

FIGS. 2A and 2B are cross-sectional views of the display device 1 according to an embodiment, taken along line II-II' of FIG. 1.

Referring to FIG. 2A, the display device 1 may include a display panel 10, an input sensing layer 40, and an optical functional layer 50 arranged on the display panel 10. These layers may be covered by a window 60. The display device 1 may be included in various electronic devices such as mobile phones, notebook computers, and/or smartwatches.

The display panel 10 may display an image. The display panel 10 includes pixels arranged in the display area DA. Each of the pixels may include a display element and a pixel circuit connected thereto. The display element may include an organic light-emitting diode, and/or a quantum dot organic light-emitting diode.

The input sensing layer 40 obtains coordinate information corresponding to an external input, for example, a touch event. The input sensing layer 40 may include a sensing electrode (or a touch electrode) and trace lines connected to the sensing electrode. The input sensing layer 40 may be arranged on the display panel 10. The input sensing layer 40 may sense an external input using a mutual cap method and/or a self cap method.

The input sensing layer 40 may be directly formed on the display panel 10 or may be formed separately and then coupled to the display panel 10 by using an adhesive layer such as an optical clear adhesive. For example, the input sensing layer 40 may be successively formed after a process of forming the display panel 10. In this case, the input sensing layer 40 may be a portion of the display panel 10, and the adhesive layer may not be arranged between the input sensing layer 40 and the display panel 10. Though FIG. 2A shows that the input sensing layer 40 is arranged between the display panel 10 and the optical functional layer 50, the input sensing layer 40 may be arranged on the optical functional layer 50 in another embodiment.

The optical functional layer 50 may include a reflection prevention layer. The reflection prevention layer may reduce reflectivity of light (external light) incident from the outside toward the display panel 10 through the window 60. The reflection prevention layer may include a retarder and a polarizer. The retarder may include a film retarder or a liquid crystal retarder. The retarder may include a $\lambda/2$ retarder and/or a $\lambda/4$ retarder. The polarizer may include a film polarizer or a liquid crystal polarizer. The film polarizer may include a stretchable synthetic resin film, and the liquid crystal polarizer may include liquid crystals arranged in a predetermined (or set) arrangement. Each of the retarder and the polarizer may further include a protective film. Protective films of the retarder and the polarizer may be defined as a base layer of the reflection prevention layer.

In one or more embodiments, the reflection prevention layer may include a black matrix and color filters. The color filters may be arranged by taking into account colors of light emitted respectively from pixels of the display panel 10. In another embodiment, the reflection prevention layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference, and thus the reflectivity of external light may be reduced.

The optical functional layer 50 may include a lens layer. The lens layer may improve the emission efficiency of light emitted from the display panel 10 or reduce the color deviation of light. The lens layer may include a layer having a concave or convex lens shape and/or include a plurality of layers respectively having different refractive indexes. The optical functional layer 50 may include both the reflection prevention layer and the lens layer or include one of the reflection prevention layer and the lens layer.

In one or more embodiments, the optical functional layer 50 may be successively formed after a process of forming the display panel 10 and/or the input sensing layer 40. In this case, an adhesive layer may not be arranged between the optical function layer 50 and the input sensing layer 40 and/or the display panel 10.

The display panel 10, the input sensing layer 40, and/or the optical functional layer 50 may include an opening (a hole or a through hole). With regard to this, it is shown in FIG. 2A that the display panel 10, the input sensing layer 40, and the optical functional layer 50 respectively include first to third openings 10H, 40H, and 50H and that the first to third openings 10H, 40H, and 50H overlap each other. The first opening 10H may pass through an uppermost surface to a lowermost surface of the display panel 10, the second opening 40H may pass through an uppermost surface to a lowermost surface of the input sensing layer 40, and the third opening 50H may pass through an uppermost surface to a lowermost surface of the optical functional layer 50. The first to third openings 10H, 40H, and 50H are located to correspond to the first area OA. In one or more embodiments, at least one selected from the display panel 10, the input sensing layer 40, and the optical functional layer 50 may not include an opening. For example, one or two selected from the display panel 10, the input sensing layer 40, and the optical functional layer 50 may not include an opening. For example, as shown in FIG. 2B, the display panel 10, the input sensing layer 40, and the optical functional layer 50 may not include an opening.

The first area OA may be a component area (e.g. may include a component such as a sensor, a camera, a speaker, etc.) in which a component 20 for adding various functions to the display device 1 is located. As shown in FIG. 2A, the component 20 may be located in the first to third openings 10H, 40H, and 50H. Alternatively, as shown in FIG. 2B, the component 20 may be located below the display panel 10.

The component 20 may include an electronic element. For example, the component 20 may include an electronic element that uses light or sound. For example, an electronic element may be a sensor such as an infrared sensor that emits and/or receives light, a camera that receives light and captures an image, a sensor that outputs and senses light or sound to measure a distance or recognize a fingerprint, a small lamp that outputs light, or a speaker that outputs sound. An electronic element that uses light may use light in various wavelength bands such as visible light, infrared light, and/or ultraviolet light. In one or more embodiments, the first area OA may be a transmission area through which light and/or sound, which are output from the component 20 to the outside or propagate toward the electronic element from the outside, may pass.

In one or more embodiments, in the case where the display device 1 is used as a smartwatch or an instrument panel for an automobile, the component 20 may be a member including a needle of a clock or a needle, etc. indicating predetermined (or set) information (e.g. the velocity of a vehicle, etc.). In the case where the display device 1 includes the component 20 such as a needle of a clock and/or an instrument panel for an automobile, the component 20 may be exposed to the outside through the window 60, which may include an opening corresponding to the first area OA.

As described above, the component 20 may include element(s) related to a function of the display panel 10 or an element such as an accessory that increases an aesthetic appeal of the display panel 10. For example, an optical clear adhesive, etc. may be located between the window 60 and the optical functional layer 50.

FIGS. 3A to 3D are cross-sectional views of the display panel 10 according to one or more embodiments.

Figure 3A:
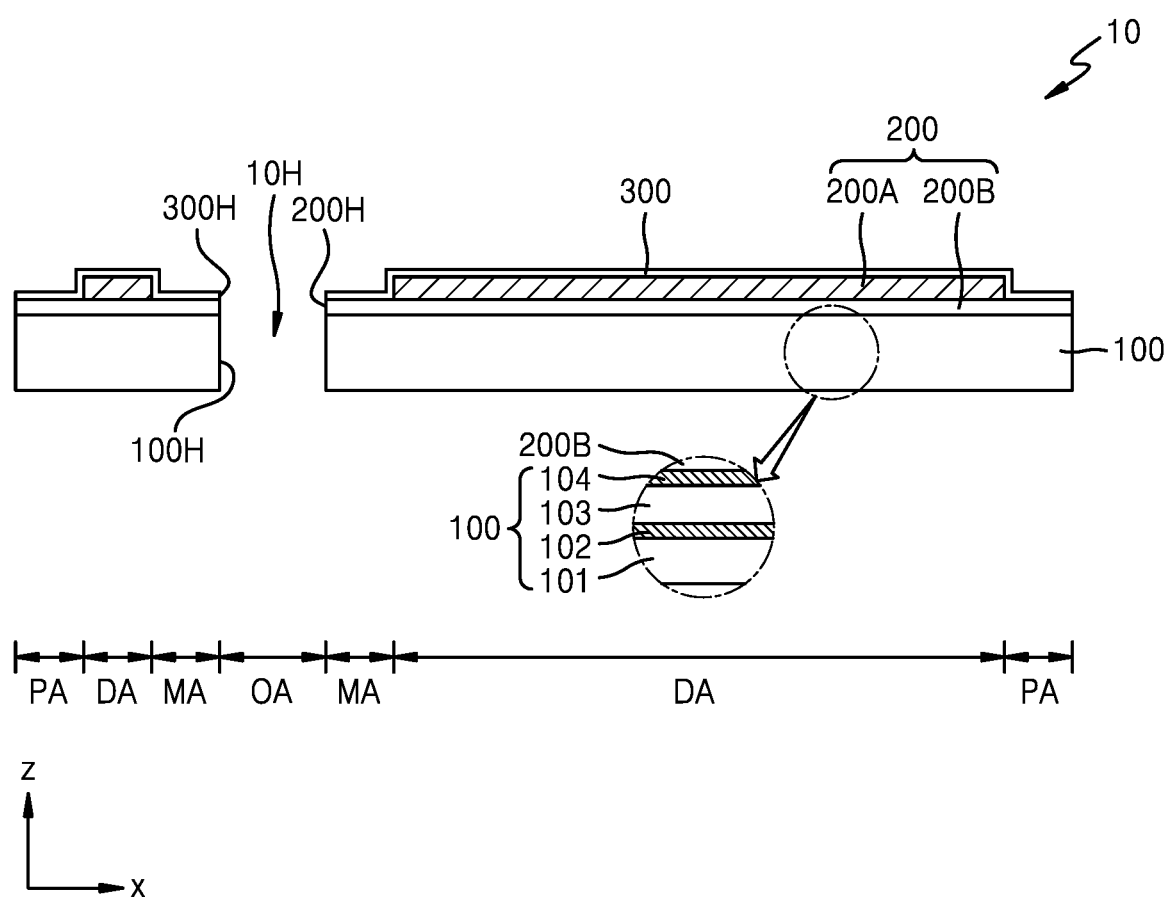
FIGS. 3A-3D are cross-sectional views of a display panel according to an embodiment.

Referring to FIG. 3A, the display panel 10 includes a display layer 200 arranged on a substrate 100. The substrate 100 may include a glass material and/or a polymer resin. The substrate 100 may include (have) a multi-layer structure. For example, as shown in an enlarged view of FIG. 3A, the substrate 100 may include a first base layer 101, a first barrier layer 102, a second base layer 103, and a second barrier layer 104.

Each of the first base layer 101 and the second base layer 103 may include a polymer resin. For example, each of the first base layer 101 and the second base layer 103 may include a polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), and/or cellulose acetate propionate (CAP). The polymer resin may be transparent.

The first barrier layer 102 and the second barrier layer 104 are barrier layers preventing (or reducing) penetration of external foreign substances and may include a single layer or a multi-layer including an inorganic material such as silicon nitride ($SiN_x$, $x>0$), silicon oxynitride (SiON), and/or silicon oxide ($SiO_x$, $x>0$).

The display layer 200 may include a plurality of pixels. The display layer 200 may include a display element layer 200A and a pixel circuit layer 200B. The display element layer 200A may include display elements respectively arranged in the pixels, and the pixel circuit layer 200B may include insulating layers and a pixel circuit arranged in each pixel. Each pixel circuit may include a thin film transistor and a storage capacitor, and each display element may include an organic light-emitting diode OLED.

The display elements of the display layer 200 may be covered by an encapsulation member such as a thin-film encapsulation layer 300. The thin-film encapsulation layer 300 may include at least one inorganic encapsulation layer and at least one organic encapsulation layer. In the case where the display panel 10 includes the substrate 100 including a polymer resin, and the thin-film encapsulation layer 300 including an inorganic encapsulation layer and an organic encapsulation layer, the flexibility of the display panel 10 may be improved.

The display panel 10 may include the first opening 10H passing through the display panel 10. The first opening 10H may be located in the first area OA (e.g., may overlap with the first area OA). In this case, the first area OA may include an opening area. It is shown in FIG. 3A that the substrate 100 and the thin-film encapsulation layer 300 respectively include through holes 100H and 300H, each corresponding to the first opening 10H of the display panel 10. The display layer 200 may also include a through hole 200H corresponding to the first area OA.

Figure 3B:
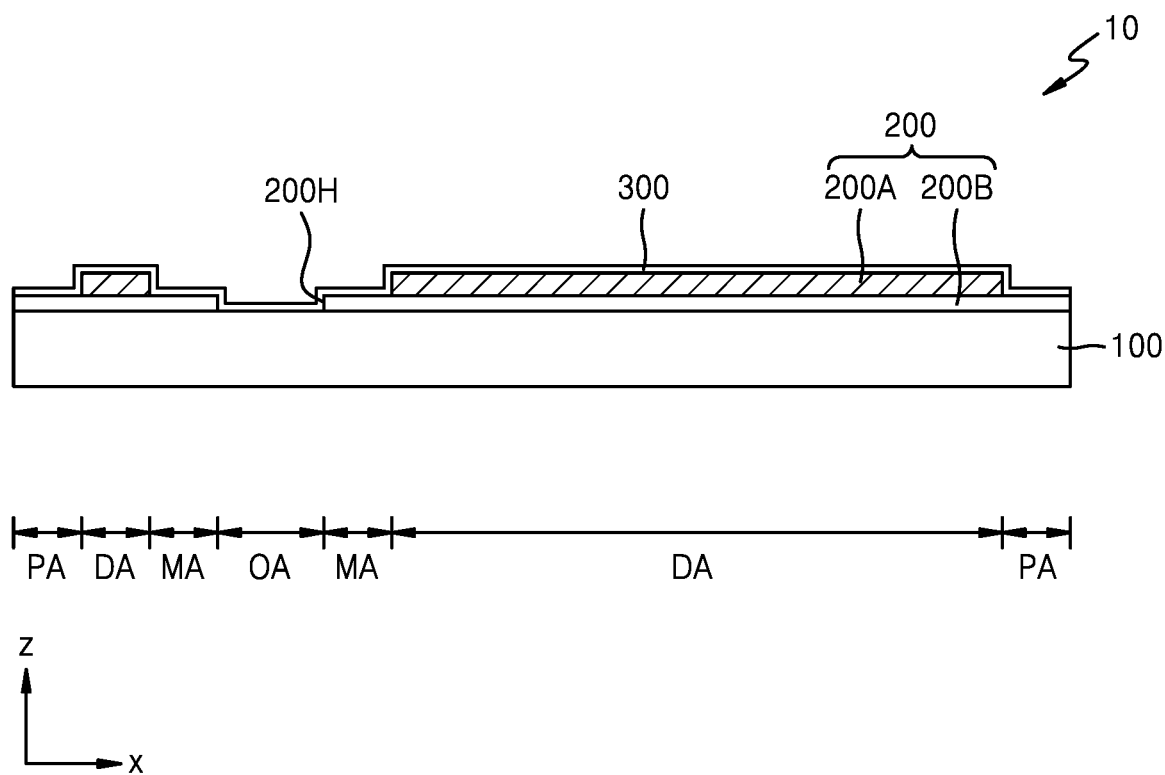

In one or more embodiments, as shown in FIG. 3B, the substrate 100 may not include a through hole corresponding to the first area OA. The display layer 200 may include the through hole 200H corresponding to the first area OA. The thin-film encapsulation layer 300 may not include a through hole corresponding to the first area OA. In one or more embodiments, as shown in FIG. 3C, the display layer 200 may not include the through hole 200H corresponding to the first area OA, and the display element layer 200A may not be located in the first area OA.

Figure 3C:
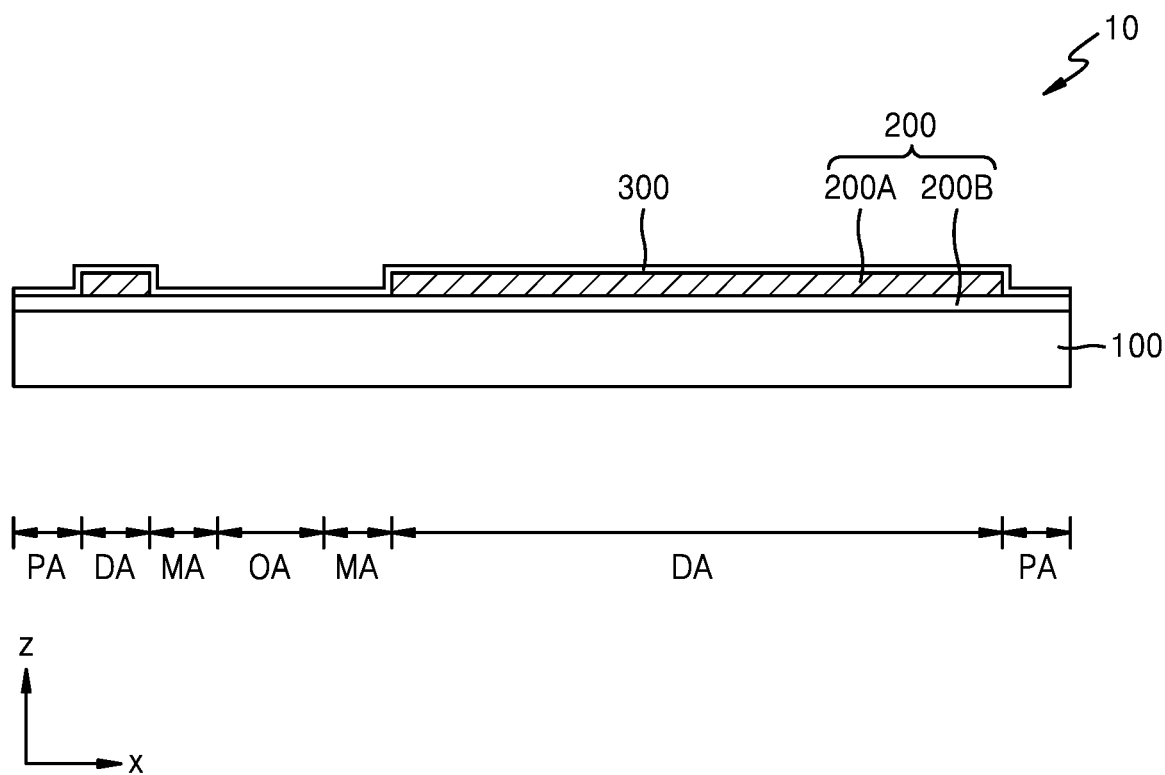
Figure 3D:
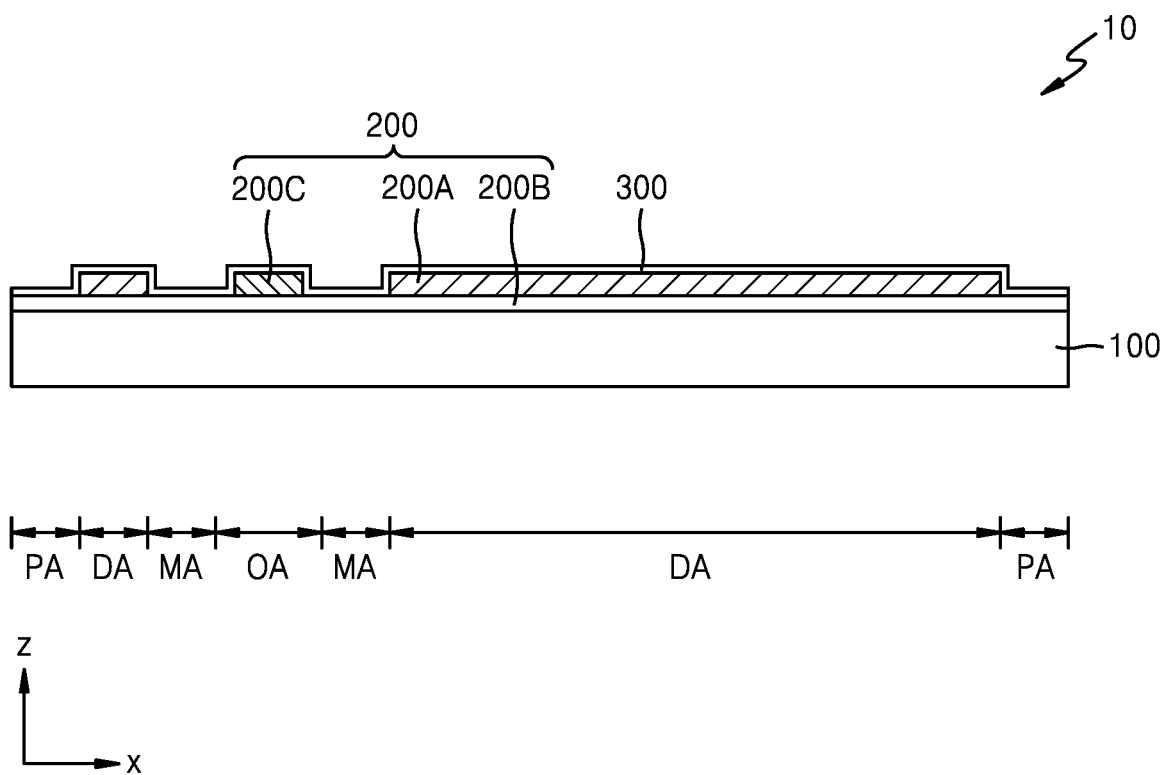

Though it is shown in FIGS. 3A to 3C that the display element layer 200A is not arranged in the first area OA, the present disclosure is not limited thereto. In one or more embodiments, as shown in FIG. 3D, an auxiliary display element layer 200C may be located in the first area OA. The auxiliary display element layer 200C may include a display element having a structure different from that of the display element of the display element layer 200A, and/or operating in a different way.

In one or more embodiments, the display element layer 200A may include pixels, each including an active organic light-emitting diode, and the auxiliary display element layer 200C may include pixels, each including a passive organic light-emitting diode. In the case where the auxiliary display element layer 200C includes a passive organic light-emitting diode as a display element, there may be no elements constituting a pixel circuit below the relevant (corresponding) passive organic light-emitting diode. For example, a portion of the pixel circuit layer 200B that is under the auxiliary display element layer 200C does not include a transistor and a storage capacitor.

In one or more embodiments, though the auxiliary display element layer 200C may include a display element (e.g. an active organic light-emitting diode) that is the same type (or kind) as that of the display element of the display element layer 200A, a structure of a pixel circuit therebelow may be different. For example, the pixel circuit (e.g. a pixel circuit including a light-blocking layer between a substrate and a transistor) below the auxiliary display element layer 200C may include a structure different from that of a pixel circuit below the display element layer 200A. In one or more embodiments, display elements of the auxiliary display element layer 200C may operate according to a control signal different from that of the display elements of the display element layer 200A. A component (e.g. an infrared sensor) that does not require a relatively high transmittance may be arranged (placed) in the first area OA in which the auxiliary display element layer 200C is arranged. In this case, the first area OA may be understood as (e.g., may function as) a component area and an auxiliary display area.

FIGS. 4A to 4D are cross-sectional views of a display panel 10' according to one or more embodiments. Unlike the display panel 10 described with reference to FIGS. 3A to 3D that includes the thin-film encapsulation layer 300, a display panel 10' of FIGS. 4A to 4D may include an encapsulation substrate 300A and a sealant 340.

Figure 4A:
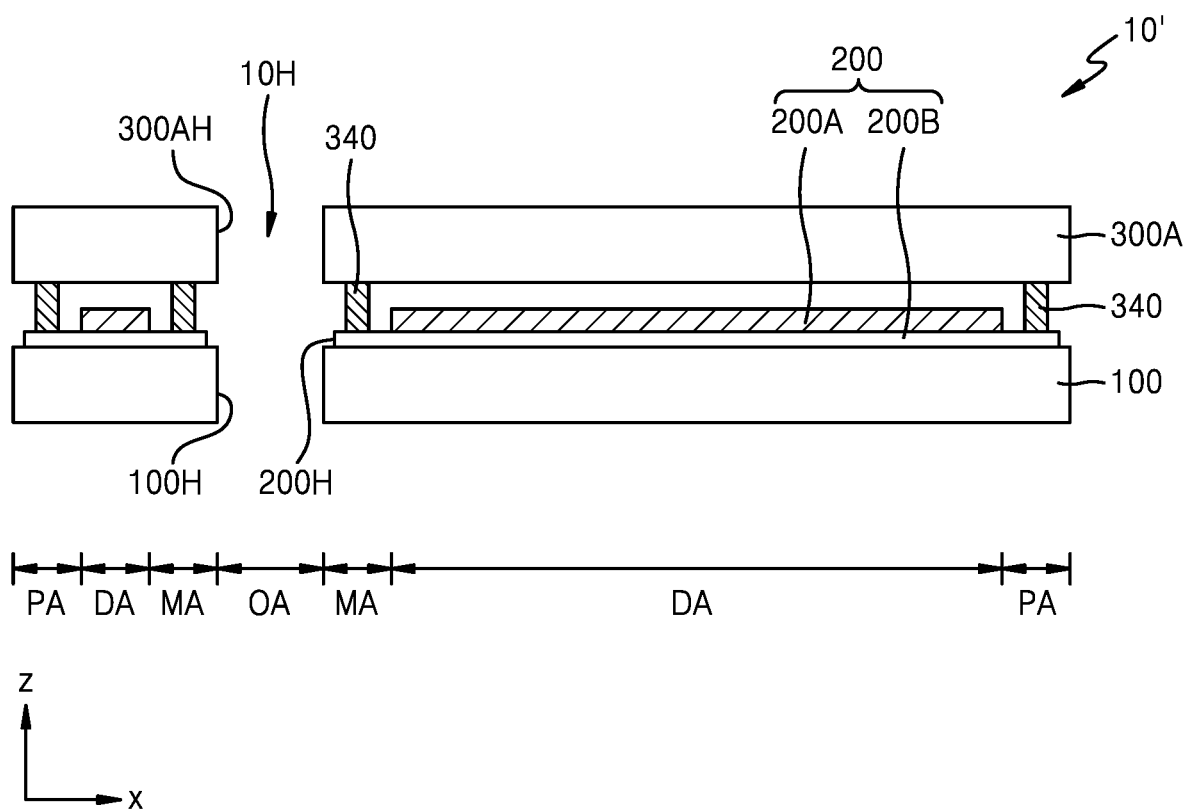
FIGS. 4A-4D are cross-sectional views of a display panel according to another embodiment.
Figure 4B:
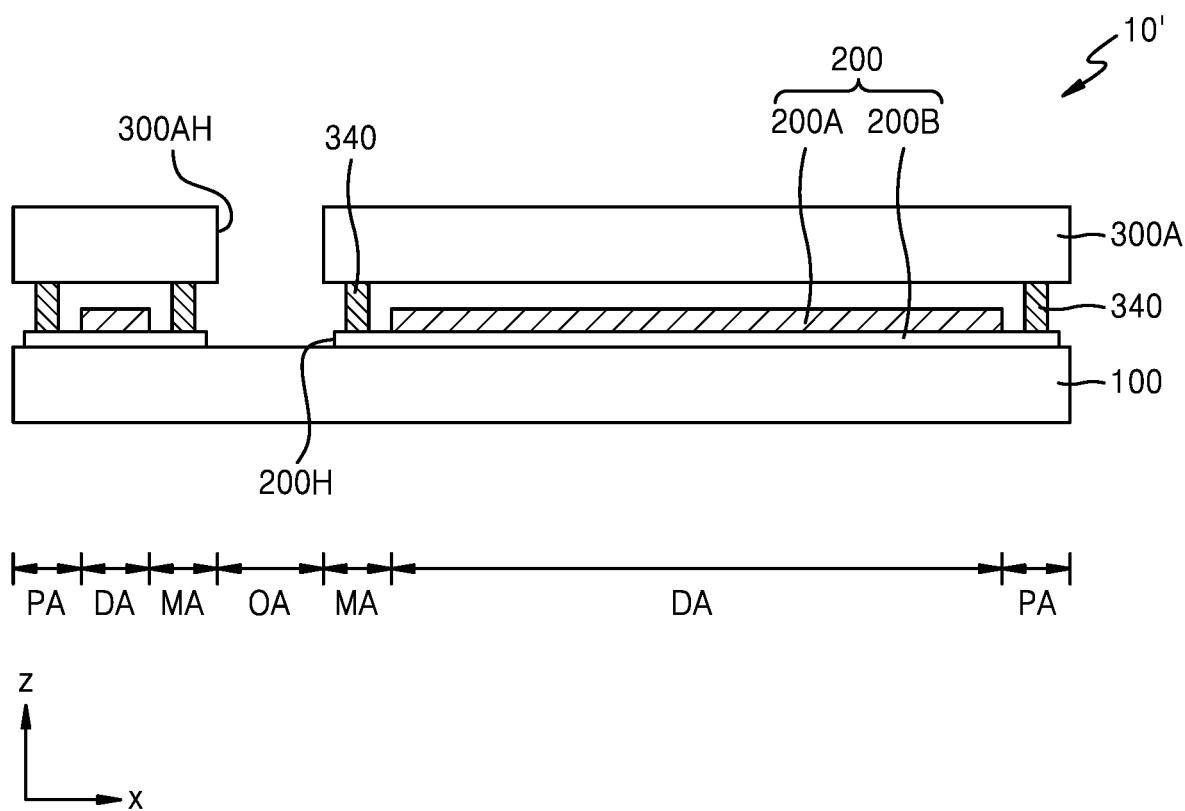
Figure 4C:
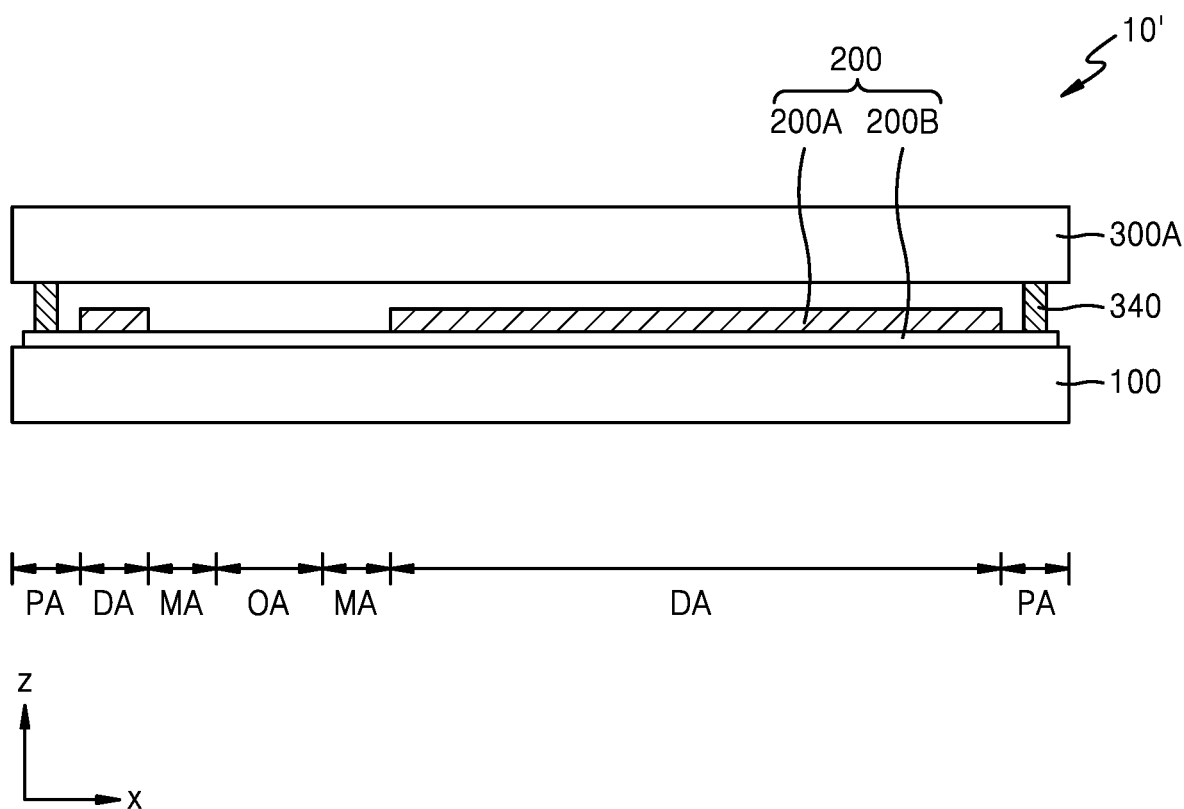
Figure 4D:
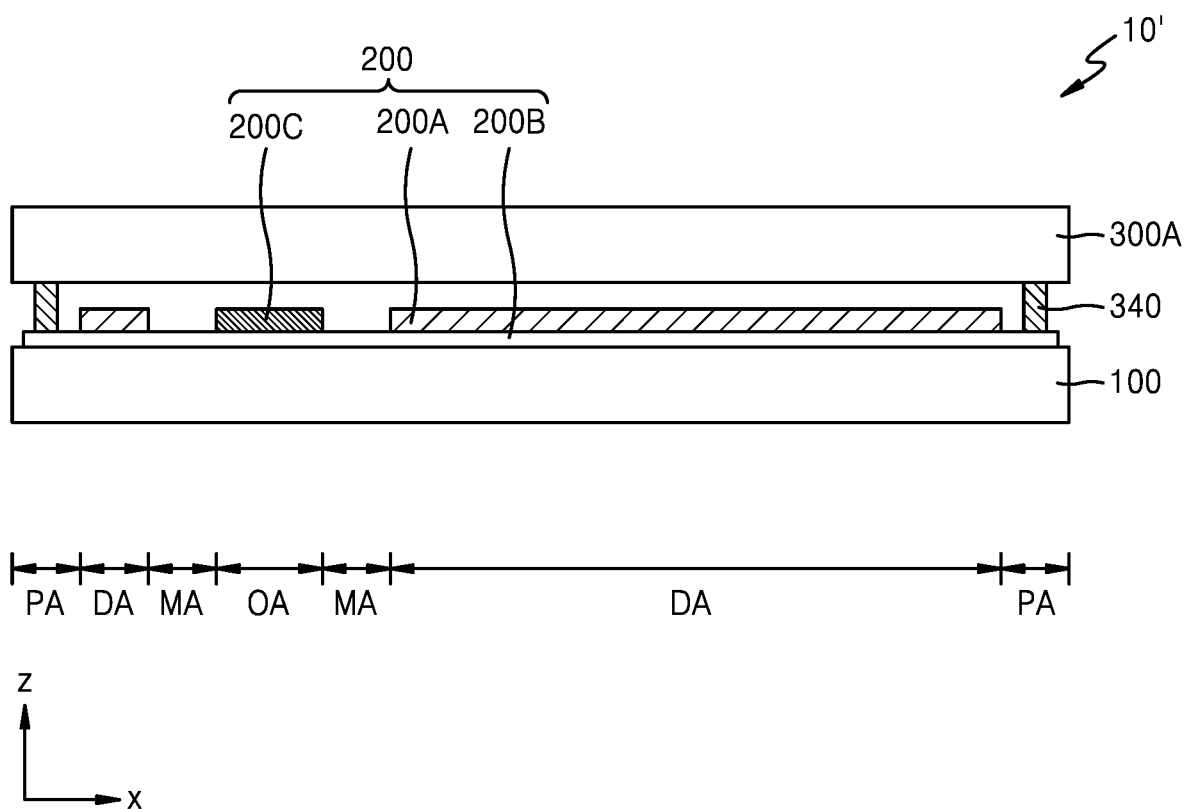

As shown in FIGS. 4A to 4C, at least one selected from the substrate 100, the display layer 200, and the encapsulation substrate 300A may include through holes 100H, 200H, and 300AH corresponding to the first area OA. The display element layer 200A may not be arranged in the first area OA, or as shown in FIG. 4D, the auxiliary display element layer 200C may be arranged in the first area OA. The auxiliary display element layer 200C is the same as that described with reference to FIG. 3D.

Figure 5:
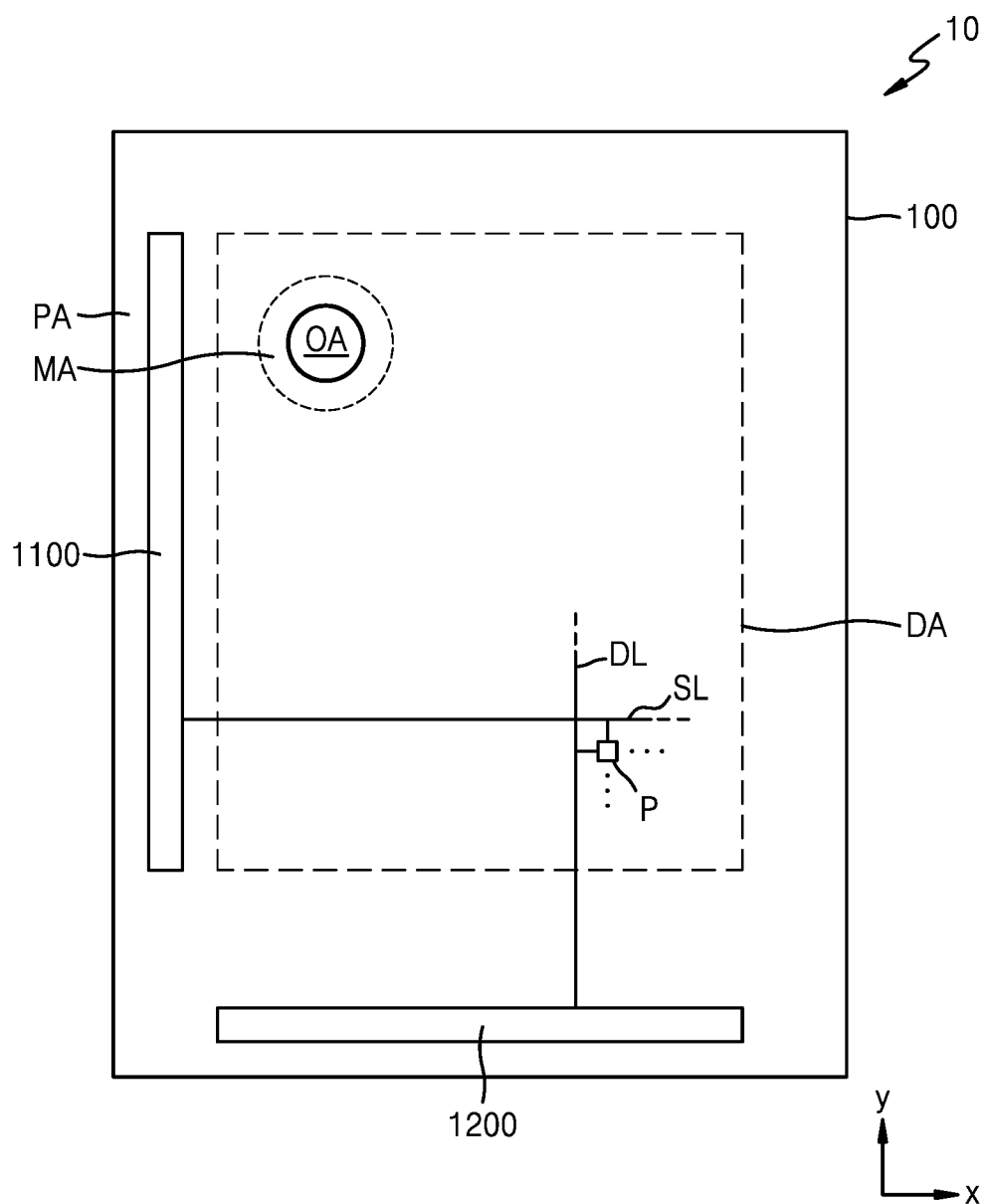
FIG. 5 is a plan view of a display panel according to an embodiment.
Figure 6:
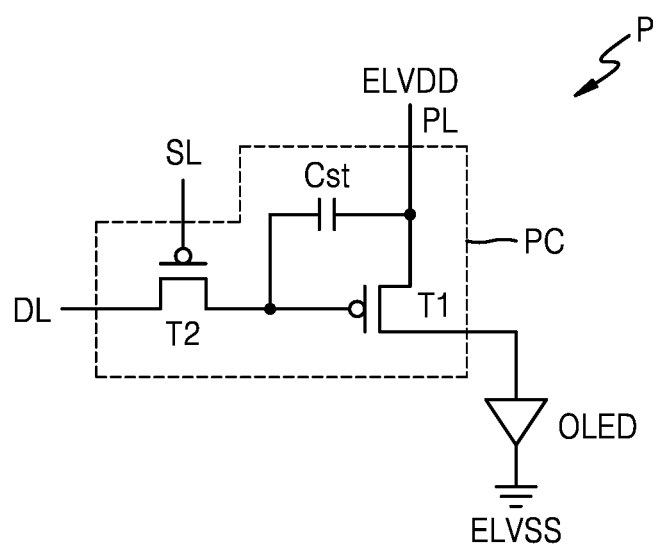
FIG. 6 is an equivalent circuit diagram of one of pixels of a display panel according to an embodiment.

FIG. 5 is a plan view of the display panel 10 according to one or more embodiments, and FIG. 6 is an equivalent circuit diagram of one of the pixels of the display panel 10 according to one or more embodiments.

Referring to FIG. 5, the display panel 10 may include the first area OA, the display area DA (which is the second area), the intermediate area MA (which is the third area), and the peripheral area PA (which is the fourth area). FIG. 5 may be understood as a figure of the substrate 100 of the display panel 10. For example, it may be understood that the substrate 100 includes the first area OA, the display area DA, the intermediate area MA, and the peripheral area PA.

The display panel 10 includes a plurality of pixels P arranged in the display area DA. As shown in FIG. 6, each pixel P may include a pixel circuit PC and an organic light-emitting diode OLED as a display element connected to the pixel circuit PC. The pixel circuit PC may include a first thin film transistor T1, a second thin film transistor T2, and a storage capacitor Cst. Each pixel P may emit, for example, red, green, or blue light, or red, green, blue, or white light through the organic light-emitting diode OLED.

The second thin film transistor T2 is a switching thin film transistor and is connected to a scan line SL and a data line DL and may transfer a data voltage input from the data line DL to the first thin film transistor T1 in response to a switching voltage input from the scan line SL. The storage capacitor Cst may be connected to the second thin film transistor T2 and a driving voltage line PL and may store a voltage corresponding to a difference between a voltage transferred from the second thin film transistor T2 and a first power voltage ELVDD supplied to the driving voltage line PL.

The first thin film transistor T1 is a driving thin film transistor and may be connected to the driving voltage line PL and the storage capacitor Cst and may control a driving current flowing through the organic light-emitting diode OLED from the driving voltage line PL in response to the voltage value stored in the storage capacitor Cst. The organic light-emitting diode OLED may emit light having predetermined (or set) brightness by using the driving current. An opposite electrode (e.g. a cathode) of the organic light-emitting diode OLED may receive a second power voltage ELVSS.

Though it is shown in FIG. 4 that the pixel circuit PC includes two thin film transistors and one storage capacitor, the present disclosure is not limited thereto. The number of thin film transistors and the number of storage capacitors may be variously modified depending on a design of the pixel circuit PC. For example, the pixel circuit PC may further include four or five or more thin film transistors, in addition to the two thin film transistors.

Referring to FIG. 5 again, the intermediate area MA may surround the first area OA in a plan view. The intermediate area MA is an area in which a display element such as the organic light-emitting diode OLED is not arranged. Trace lines configured to provide a signal to pixels P arranged around the first area OA may pass across the intermediate area MA. A scan driver 1100 configured to provide a scan signal to each pixel P, a data driver 1200 configured to provide a data signal to each pixel P, main power wirings configured to provide first and second power voltages, etc. may be arranged in the peripheral area PA. Though it is shown in FIG. 5 that the data driver 1200 is adjacent to one side of the substrate 100, the data driver 1200 may be arranged on a flexible printed circuit board (FPCB) electrically connected to a pad arranged on one side of the display panel 10 according to one or more embodiments.

Figure 7:
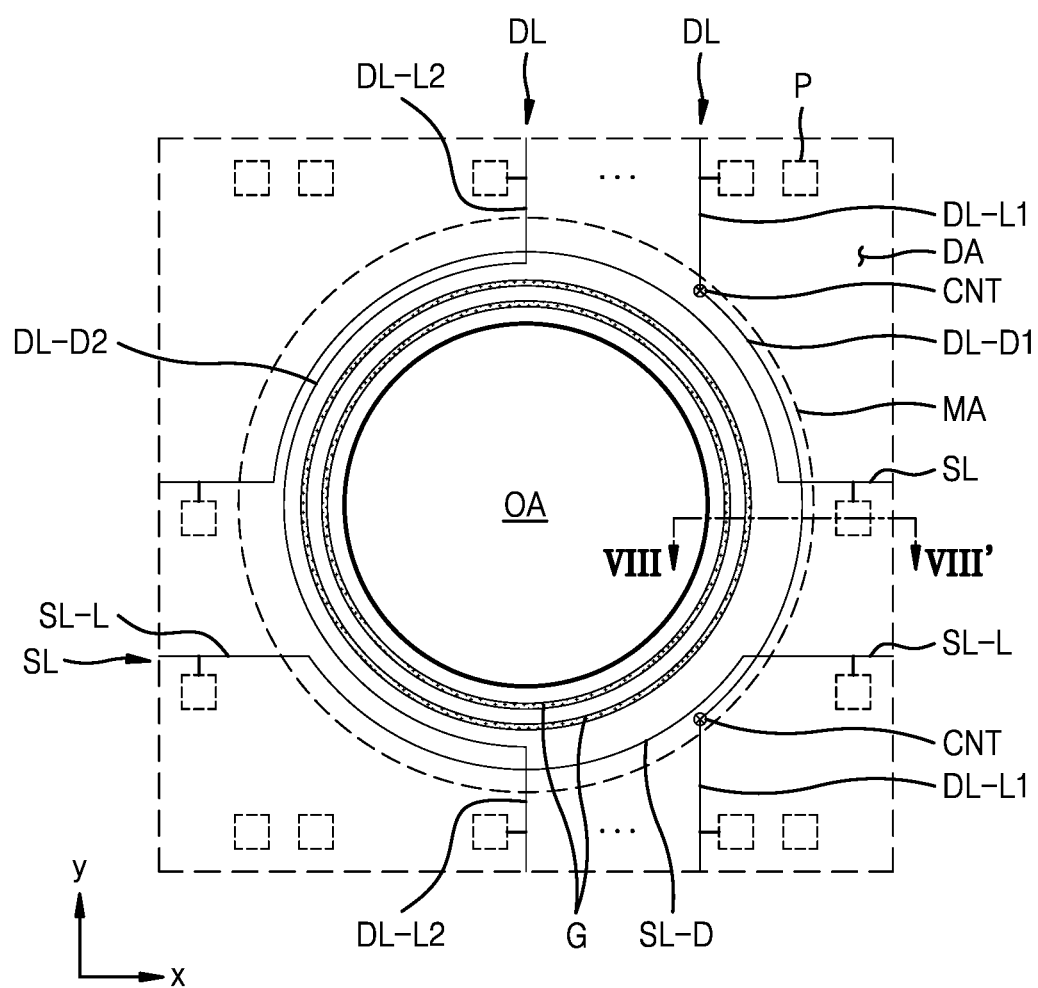
FIG. 7 is a plan view of a portion of a display panel according to an embodiment.

FIG. 7 is a plan view of a portion of the display panel 10 according to one or more embodiments.

Referring to FIG. 7, pixels P may be arranged around the first area OA in the display area DA. Some pixels P may be spaced apart from each other around the first area OA, and the first area OA may be defined between the pixels P. For example, in a plan view of FIG. 7, the pixels P may be spaced apart up and down around the first area OA, or spaced apart left and right around the first area OA.

Trace lines adjacent to the first area OA among the trace lines configured to supply a signal to the pixels P may detour (or bypass) around the first area OA. In the plan view of FIG. 7, at least one of the data lines DL that pass across the display area DA may extend in a y-direction so as to provide a data signal to the pixels P arranged up and down, with the first area OA therebetween, and detour along an edge of the first area OA in the intermediate area MA. At least one of the scan lines SL that pass across the display area DA may extend in an x-direction so as to provide a scan signal to the pixels P arranged left and right, with the first area OA therebetween, and detour along an edge of the first area OA in the intermediate area MA.

A circuitous portion (a detouring portion or a bypass portion) SL-D of the scan line SL may be located on the same layer as a layer on which an extension portion SL-L passing across the display area DA is arranged and may be formed as one body with the extension portion SL-L. A detouring portion DL-D1 of at least one of the data lines DL may be arranged on a layer different from a layer on which an extension portion DL-L1 passing across the display area DA is arranged. The detouring portion DL-D1 of the data line DL may be connected to the extension portion DL-L1 through a contact hole. A detouring portion DL-D2 of at least one of the data lines DL may be located on the same layer as a layer on which an extension portion DL-L2 is arranged and may be formed as one body with the extension portion DL-L2.

One or more grooves G may be arranged between the first area OA and a region of the intermediate area MA in which the scan lines SL and the data lines DL detour. In a plan view, the grooves G may have a ring shape surrounding the first area OA. The grooves G may be spaced apart from each other.

Figure 8:
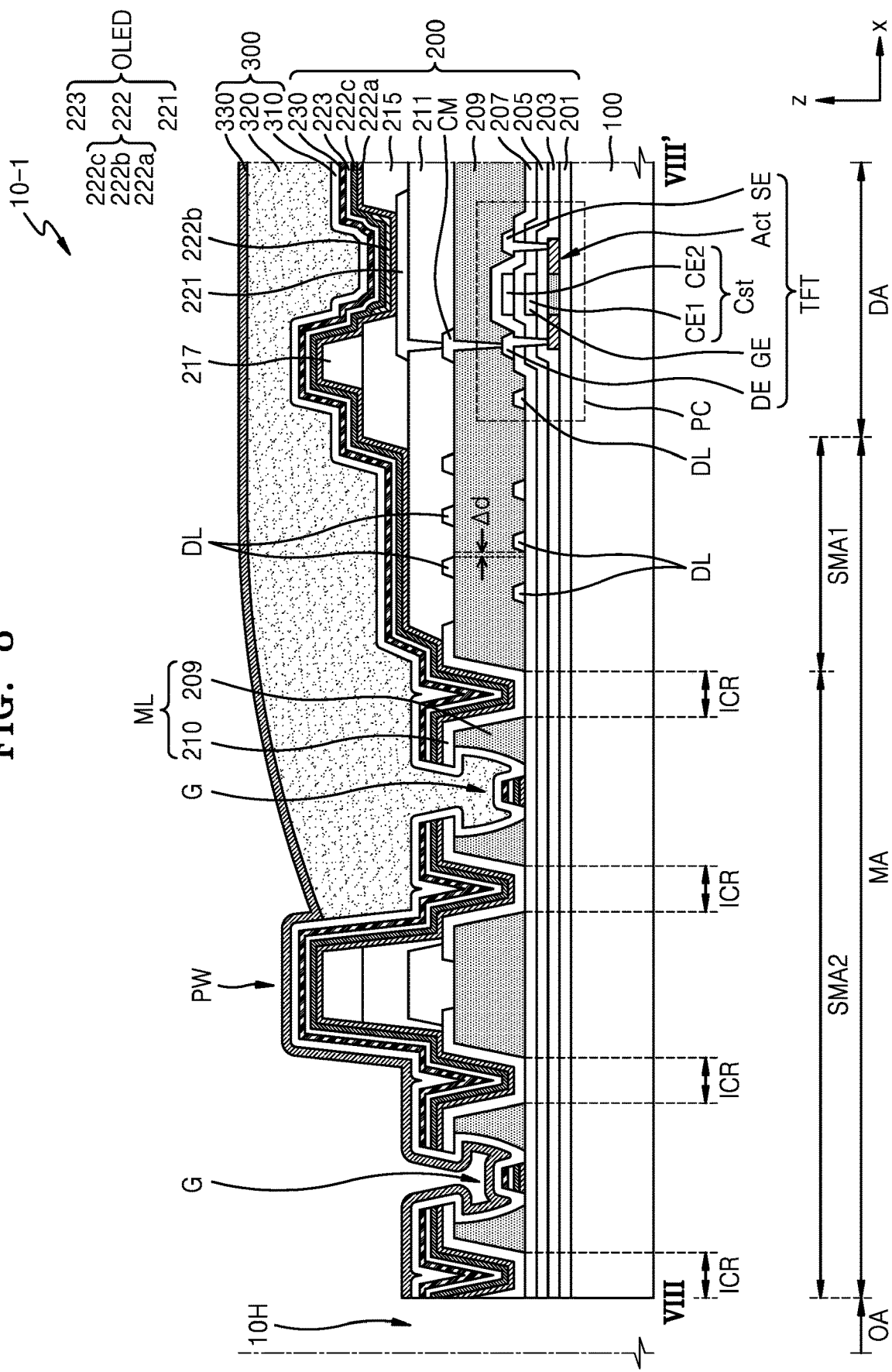
FIG. 8 is a cross-sectional view of a display panel according to an embodiment.

FIG. 8 is a cross-sectional view of the display panel 10 according to one or more embodiments and may correspond to a cross-section taken along line VIII-VIII' of FIG. 7. FIGS. 9A to 9D are cross-sectional views of acts of a process of manufacturing the display panel 10 according to one or more embodiments and show the intermediate area MA.

Referring to the display area DA of FIG. 8, the substrate 100 may include a glass material and/or a polymer resin. In one or more embodiments, as shown in the enlarged view of FIG. 3A, the substrate 100 may include a plurality of sub-layers.

A buffer layer 201 may be provided on the substrate 100, the buffer layer 201 being configured to prevent or block impurities from penetrating into a semiconductor layer "Act" of the thin film transistor TFT. The buffer layer 201 may include an inorganic insulating material (such as silicon nitride, silicon oxynitride, and/or silicon oxide) and may include a single layer or a multi-layer including the above-described inorganic insulating materials.

The pixel circuit PC may be arranged on the buffer layer 201. The pixel circuit PC includes the thin film transistor TFT and the storage capacitor Cst. The thin film transistor TFT may include the semiconductor layer Act, a gate electrode GE, a source electrode SE, and a drain electrode DE. The thin film transistor TFT shown in FIG. 8 may correspond to the driving thin film transistor described with reference to FIG. 6. A data line DL of the pixel circuit PC may be electrically connected to a switching thin film transistor included in the pixel circuit PC. Though the present embodiment shows a top-gate type (or kind) thin film transistor in which the gate electrode GE is arranged over the semiconductor layer Act with a gate insulating layer 203 therebetween, the thin film transistor TFT may be a bottom-gate type (or kind) thin film transistor according to one or more embodiments.

The semiconductor layer Act may include polycrystalline silicon. In one or more embodiments, the semiconductor layer Act may include amorphous silicon, an oxide semiconductor, and/or an organic semiconductor. The gate electrode GE may include a low resistance metal material. The gate electrode GE may include a conductive material Mo, Al, Cu, and/or Ti. The gate electrode GE may include a single layer or a multi-layer including the above materials.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and/or hafnium oxide. The gate insulating layer 203 may include a single layer or a multi-layer including any of the above materials.

The source electrode SE and the drain electrode DE may be located on the same layer as a layer on which the data line DL is arranged and may include the same material as that of the data line DL. The source electrode SE, the drain electrode DE, and the data line DL may include a material having excellent conductivity. The source electrode SE and the drain electrode DE may include a conductive material including Mo, Al, Cu, and/or Ti. The source electrode SE and the drain electrode DE may include a single layer or a multi-layer including the above materials. In one or more embodiments, the source electrode SE, the drain electrode DE, and the data line DL may have a multi-layered structure of Ti/Al/Ti.

The storage capacitor Cst includes a lower electrode CE1 and an upper electrode CE2 that overlap each other with a first interlayer insulating layer 205 therebetween. The storage capacitor Cst may overlap the thin film transistor TFT. With regard to this, it is shown in FIG. 8 that the gate electrode GE of the thin film transistor TFT serves as the lower electrode CE1 of the storage capacitor Cst. In one or more embodiments, the storage capacitor Cst may not overlap the thin film transistor TFT. The storage capacitor Cst may be covered by a second interlayer insulating layer 207. The upper electrode CE2 of the storage capacitor Cst may include a conductive material including Mo, Al, Cu, and/or Ti and may include a single layer or a multi-layer including any of the above materials.

The first and second interlayer insulating layers 205 and 207 may include an inorganic insulating material such as silicon oxide, silicon nitride, and silicon oxynitride, aluminum oxide, titanium oxide, tantalum oxide, and/or hafnium oxide. The first and second interlayer insulating layers 205 and 207 may include a single layer or a multi-layer including any of the above materials.

The pixel circuit PC including the thin film transistor TFT and the storage capacitor Cst may be covered by a first organic insulating layer 209. The first organic insulating layer 209 may include an approximately (substantially) flat top surface.

The pixel circuit PC may be electrically connected to a pixel electrode 221. For example, as shown in FIG. 8, a contact metal layer CM may be arranged between the thin film transistor TFT and the pixel electrode 221. The contact metal layer CM may be connected to the thin film transistor TFT through a contact hole formed in the first organic insulating layer 209, and the pixel electrode 221 may be connected to the contact metal layer CM through a contact hole formed in a second organic insulating layer 211. The contact metal layer CM may include a conductive material including Mo, Al, Cu, and/or Ti and may include a single layer or a multi-layer including any of the above materials. In one or more embodiments, the contact metal layer CM may include a multi-layer of Ti/Al/Ti.

The first organic insulating layer 209 and the second organic insulating layer 211 may each independently include an organic insulating material including a general-purpose polymer (such as polymethylmethacrylate (PMMA) and/or polystyrene (PS)), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In one or more embodiments, the first organic insulating layer 209 and the second organic insulating layer 211 may include polyimide.

The pixel electrode 221 may be formed on the second organic insulating layer 211. The pixel electrode 221 may include a conductive oxide such as indium tin oxide (ITO), zinc oxide (IZO), zinc oxide (ZnO), indium oxide ($In_2O_3$), indium gallium oxide (IGO), and/or aluminum zinc oxide (AZO). In one or more embodiments, the pixel electrode 221 may include a reflective layer including Ag, Mg, Al, Pt, Pd, Au, Ni, Nd, Ir, Cr, and/or a compound thereof. In one or more embodiments, the pixel electrode 221 may further include a layer including ITO, IZO, ZnO, and/or $In_2O_3$ over and/or under the reflective layer.

A pixel-defining layer 215 may be formed on the pixel electrode 221. The pixel-defining layer 215 may include an opening that exposes a top surface of the pixel electrode 221 and cover edges of the pixel electrode 221. The pixel-defining layer 215 may include an organic insulating material. In one or more embodiments, the pixel-defining layer 215 may include an inorganic insulating material such as silicon nitride ($SiN_x$), silicon oxynitride (SiON), and/or silicon oxide ($SiO_x$). In one or more embodiments, the pixel-defining layer 215 may include an organic insulating material and an inorganic insulating material.

An intermediate layer 222 includes an emission layer 222b. The intermediate layer 222 may include a first functional layer 222a arranged under the emission layer 222b and/or a second functional layer 222c arranged on the emission layer 222b. The emission layer 222b may include a low molecular weight or polymer organic material that emits light of a predetermined (or set) color.

The first functional layer 222a may include a single layer or a multi-layer. For example, in the case where the first functional layer 222a includes a polymer material, the first functional layer 222a includes a hole transport layer (HTL), which has a single-layered structure, and may include poly-(3,4)-ethylene-dihydroxy thiophene (PEDOT) and/or polyaniline (PANI). In the case where the first functional layer 222a includes a low molecular weight material, the first functional layer 222a may include a hole injection layer (HIL) and/or a hole transport layer (HTL).

The second functional layer 222c may be omitted. However, in the case where the first functional layer 222a and the emission layer 222b include a polymer material, it is preferable that the second functional layer 222c is provided. The second functional layer 222c may be a single layer or a multi-layer. The second functional layer 222c may include an electron transport layer (ETL) and/or an electron injection layer (EIL).

The emission layer 222b of the intermediate layer 222 may be arranged in all pixels in the display area DA. The emission layer 222b may be patterned to correspond to the pixel electrode 221. Unlike the emission layer 222b, the first functional layer 222a and/or the second functional layer 222c of the intermediate layer 222 may extend toward the intermediate area MA such that the first functional layer 222a and/or the second functional layer 222c are located in not only the display area DA but also the intermediate area MA.

The opposite electrode 223 may include a conductive material having a low work function. For example, the opposite electrode 223 may include a (semi) transparent layer including Ag, Mg, Al, Pt, Pd, Au, Ni, Nd, Ir, Cr, Li, Ca, and/or an alloy thereof. In one or more embodiments, the opposite electrode 223 may further include a layer including ITO, IZO, ZnO, and/or $In_2O_3$ on the (semi) transparent layer including any of the above-mentioned materials. The opposite electrode 223 may be provided in not only the display area DA but also the intermediate area MA. The first functional layer 222a, the second functional layer 222c, and the opposite electrode 223 may each independently be formed by a thermal deposition method.

A capping layer 230 may be arranged on the opposite electrode 223. For example, the capping layer 230 may include LiF and may be formed by a thermal deposition method. In one or more embodiments, the capping layer 230 may be omitted.

A spacer 217 may be provided on the pixel-defining layer 215. The spacer 217 may include an organic insulating material such as polyimide. In one or more embodiments, the spacer 217 may include an inorganic insulating material, or include an organic insulating material and an inorganic insulating material.

The spacer 217 may include a material different from that of the pixel-defining layer 215, or include the same material as that of the pixel-defining layer 215. In one or more embodiments, the pixel-defining layer 215 and the spacer 217 may include polyimide. The pixel-defining layer 215 and the spacer 217 may be simultaneously (or concurrently) formed during a mask process that uses a half-tone mask.

The organic light-emitting diode OLED is covered by the thin-film encapsulation layer 300. The thin-film encapsulation layer 300 may include at least one organic encapsulation layer and at least one inorganic encapsulation layer. In one or more embodiments, it is shown in FIG. 8 that the thin-film encapsulation layer 300 includes first and second inorganic encapsulation layers 310 and 330, and an organic encapsulation layer 320 therebetween. In one or more embodiments, the number of organic encapsulation layers, the number of inorganic encapsulation layers, and a stacking sequence may be modified.

The first and second inorganic encapsulation layers 310 and 330 may include one or more inorganic materials such as aluminum oxide, titanium oxide, tantalum oxide, hafnium oxide, zinc oxide, silicon oxide, silicon nitride, and/or silicon oxynitride. The first and second inorganic encapsulation layers 310 and 330 may include a single layer or a multi-layer including any of the above materials. The organic encapsulation layer 320 may include a polymer-based material. The polymer-based material may include an acrylic-based resin such as PMMA, poly acrylic acid, an epoxy-based resin, polyimide, and/or polyethylene. In one or more embodiments, the organic encapsulation layer 320 may include acrylate polymer.

Materials of the first inorganic encapsulation layer 310 and the second inorganic encapsulation layer 330 may be different from each other. For example, the first inorganic encapsulation layer 310 may include silicon oxynitride, and the second inorganic encapsulation layer 330 may include silicon nitride. Thicknesses of the first inorganic encapsulation layer 310 and the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the thicknesses of the first inorganic encapsulation layer 310 and the second inorganic encapsulation layer 330 may be the same.

Referring to the intermediate area MA of FIG. 8, the intermediate area MA may include a first sub-intermediate area SMA1 that is relatively away from the first area OA, and a second sub-intermediate area SMA2 that is relatively close to the first area OA. Lines that detour the first area OA and the grooves G may be arranged in the intermediate area MA.

Lines, for example, the data lines DL, may be located in the first sub-intermediate area SMA1 as shown in FIG. 8. The data lines DL in the first sub-intermediate area SMA1 shown in FIG. 8 correspond to the detouring portions DL-D1 and DL-D2 of the data lines described with reference to FIG. 7. The first sub-intermediate area SMA1 may be a line region or a detour region which lines such as the data lines DL may detour.

The data lines DL may be alternately arranged with an insulating layer therebetween. For example, as one of neighboring data lines DL may arranged under an insulating layer (e.g. the first organic insulating layer 209) and another of the neighboring data lines DL may be arranged on an insulating layer (e.g. the first organic insulating layer 209), the data lines DL may be alternately arranged. In the case where the data lines DL are alternately arranged with an insulating layer therebetween, a distance Δd (a pitch) between the data lines may be reduced. Though FIG. 8 shows the data lines DL located in the first sub-intermediate area SMA1, the scan lines SL that have been described with reference to FIG. 7, for example, the detouring portions of the scan lines SL may be also located in the first sub-intermediate area SMA1.

One or more grooves G may be arranged in the second sub-intermediate area SMA2. The organic material layer included in the intermediate layer 222, for example, the first functional layer 222a and the second functional layer 222c may be disconnected (or separated, or broken up) by the groove G. The second sub-intermediate area SMA2 may be a groove region or a disconnection region (or a separation region) of the organic material layer.

The groove G may be formed in a multi-layered film ML arranged between the substrate 100 and the pixel electrode 221. The multi-layered film ML may include at least two layers including different materials. The multi-layered film ML may include a first sub-layer including an organic layer, and a second sub-layer including an inorganic layer (e.g. a metal layer and/or an inorganic insulating layer). The inorganic layer may comprise an inorganic material. The inorganic material may comprise a conductive inorganic material and/or a non-conductive inorganic material. The conductive inorganic material may include a metal material, and the non-conductive inorganic material may includes an inorganic insulating material. The groove G includes a recess or a hole formed in the first sub-layer, and a hole formed in the second sub-layer.

In one or more embodiments, it is shown in FIG. 8 that the multi-layered film ML includes the first organic insulating layer 209 as an organic layer and a metal layer 210 as an inorganic layer. The metal layer 210 may be located on the same layer as a layer on which the contact metal layer CM is arranged and be formed during the same mask process as a mask process of forming the contact metal layer CM.

The metal layer 210 may include the same material as that of the contact metal layer CM. For example, the metal layer 210 may have a structure in which a titanium layer, an aluminum layer, and a titanium layer (Ti/Al/Ti) are stacked.

Figure 9A:
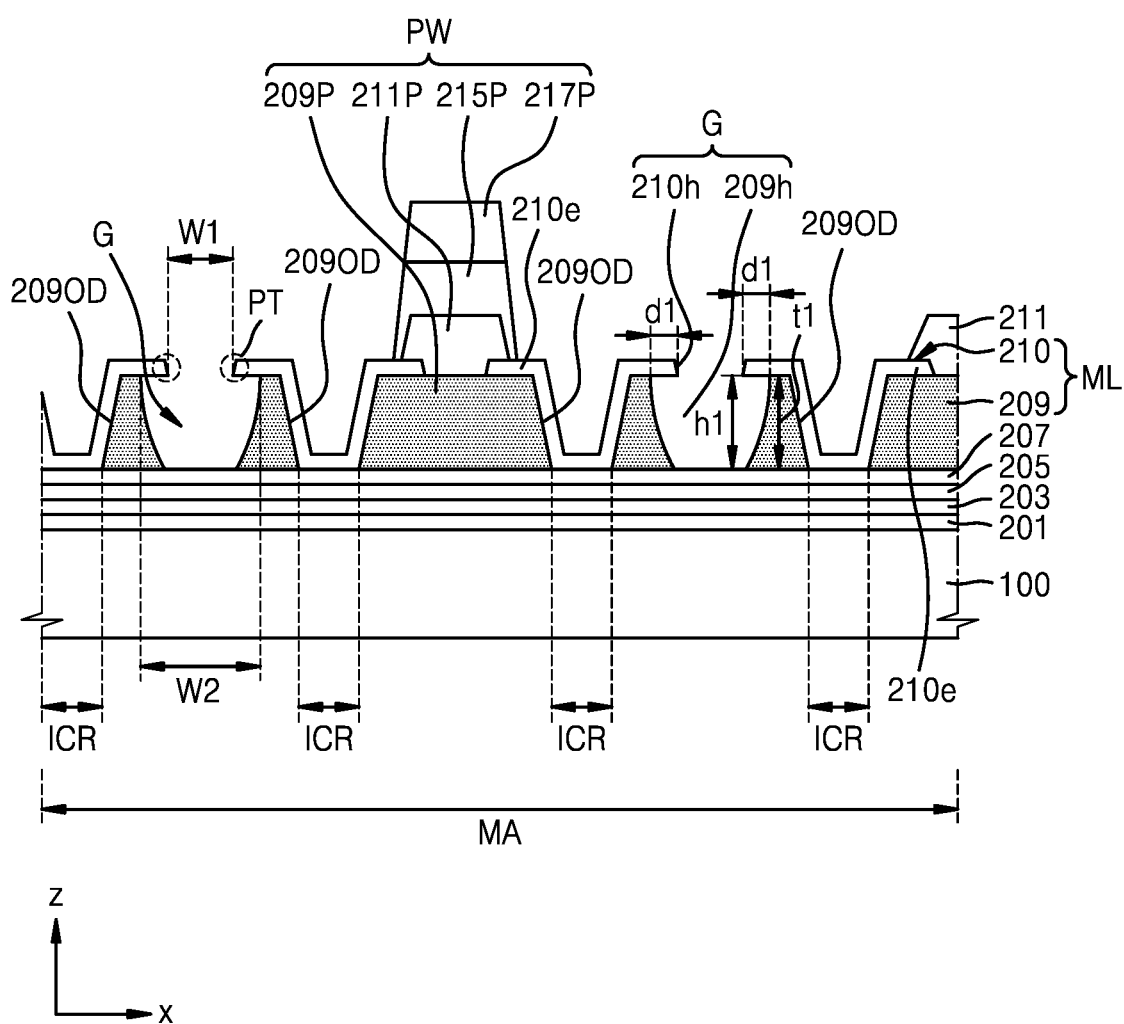
FIGS. 9A-9D are cross-sectional views of acts of a process of manufacturing a display panel according to an embodiment.

Referring to FIGS. 8 and 9A, the groove G of the multi-layered film ML may be formed before a process of forming the intermediate layer 222. The groove G may have an undercut structure (or shape). The groove G may be formed by removing a portion of the multi-layered film ML. Since a width of the hole of the metal layer 210 is formed to be less than the hole (or the recess) of the first organic insulating layer 209, the groove G having an undercut structure may be formed. In one or more embodiments, it is shown in FIG. 9A that a first hole 210h formed in the metal layer 210 and a second hole 209h formed in the first organic insulating layer 209 overlap each other and constitute the groove G. A bottom surface of the groove G may be located on a virtual surface between a top surface of the substrate 100 and a top surface of the first organic insulating layer 209. With regard to this, it is shown in FIG. 9A that the bottom surface of the groove G is located on a virtual surface that is the same as a top surface of the second interlayer insulating layer 207.

Ends of the metal layer 210 that define the first hole 210h may protrude further toward a center of the groove G than an inner lateral surface of the first organic insulating layer 209 arranged below the metal layer 210. For example, a first width W1 of the first hole 210h may have a value less than that of a second width W2 of the second hole 209h. Here, the second width W2 of the second hole 209h may be measured at a portion of the first organic insulating layer 209 right under the ends of the metal layer 210 that define the first hole 210h. The ends of the metal layer 210 that protrude toward the center of the groove G and/or the first hole 210h may constitute a pair of eaves (or a pair of protruding tips, or tips PT). A protruding length d1 of each tip PT may be less than a depth h1 of the second hole 209h described below. For example, the protruding length d1 of each tip PT may be less than 2 μm. For example, the length d1 of each tip PT may be less than 2.0 μm. In one or more embodiments, the protruding length d1 may be about 1 μm to about 1.5 μm.

As described above, a first end of the metal layer 210 that constitutes the tip PT may be exposed but the other end, for example, a second end located opposite to the first end, may be covered by the second organic insulating layer 211 as shown in FIG. 9A.

The depth h1 of the second hole 209h may be the same as a thickness t1 of the first organic insulating layer 209. The depth h1 of the second hole 209h may correspond to a depth of the groove G. In one or more embodiments, the depth of the groove G may be 1.5 μm or more. For example, the depth of the groove G may be 2 μm or more.

The first organic insulating layer 209 may include an opening 2090D. The opening 2090D may be adjacent to the groove G and be spaced apart from the groove G by a predetermined (or set) interval. In one or more embodiments, as shown in FIG. 9A, the openings 2090D may be arranged on two opposite sides of the groove G. For example, around the groove G, one opening 2090D may be arranged on a side of the display area DA, and the other opening 2090D may be arranged on a side of the first area OA.

The metal layer 210 may directly contact a lower inorganic layer, for example, the second interlayer insulating layer 207 under the first organic insulating layer 209 through the opening 2090D. The metal layer 210 and the second interlayer insulating layer 207 contacting each other through the opening 2090D may constitute an inorganic contact region ICR.

A layer including an organic material among layers over the substrate 100 may serve as a path through which moisture progresses. In one or more embodiments, as shown in FIG. 8, in the case where a display panel 10-1 includes the first opening 10H corresponding to the first area OA, moisture may progress in a direction (an x-direction, referred to as a lateral direction hereinafter) parallel to the top surface of the substrate 100 through the first opening 10H. However, since the intermediate area MA includes the inorganic contact region ICR, progression of moisture to the display area DA through the first organic insulating layer 209 may be blocked or reduced.

A partition wall PW may be arranged between the grooves G. The partition wall PW may include a plurality of sub-organic insulating layers that are sequentially stacked. In one or more embodiments, as shown in FIG. 9A, the partition wall PW may have a structure in which a portion 209P of the first organic insulating layer 209, a portion 211P of the second organic insulating layer 211, a portion 215P of the pixel-defining layer 215, and a portion 217P of the spacer 217 are stacked. In one or more embodiments, at least one of the portion 209P of the first organic insulating layer 209, the portion 211P of the second organic insulating layer 211, the portion 215P of the pixel-defining layer 215, or the portion 217P of the spacer 217 may be omitted. In this case, a height from the substrate 100 to a top surface of the partition wall PW may be less than a height from the substrate 100 to a top surface of the spacer 217.

Figure 9B:
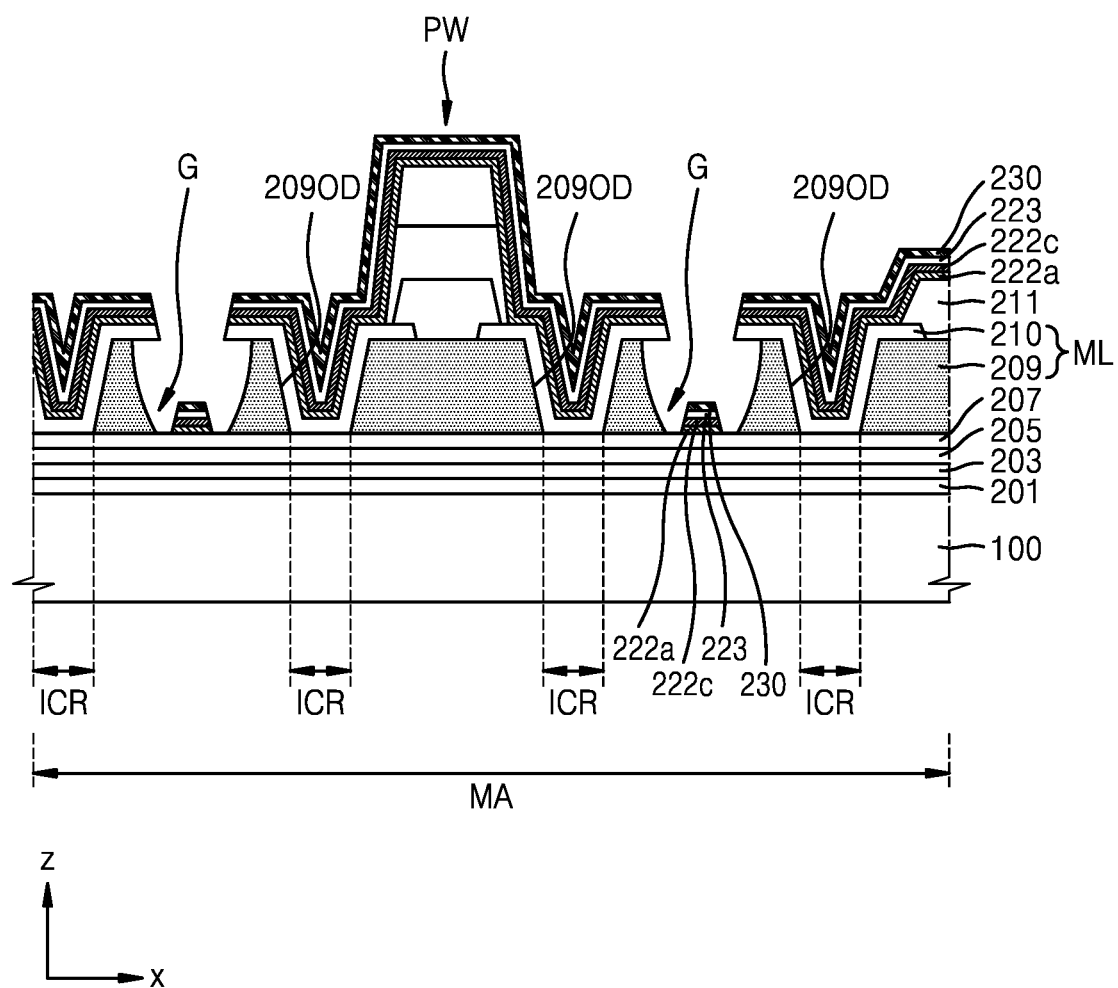

Referring to FIGS. 8 and 9B, the intermediate layer 222 may be formed after the groove G is formed. Each of the first functional layer 222a and/or the second functional layer 222c of the intermediate layer 222 may be formed by using an open mask such that each of the first functional layer 222a and/or the second functional layer 222c is located in the display area DA and the intermediate area MA. In this case, the first functional layer 222a and/or the second functional layer 222c may be disconnected or separated (or broken up, or patterned) by the groove G.

A layer including an organic material among layers over the substrate 100 may serve as a path through which moisture progresses. Since the first functional layer 222a and/or the second functional layer 222c include an organic material, the first functional layer 222a and/or the second functional layer 222c may serve as a moisture transmission path. However, since the first functional layer 222a and/or the second functional layer 222c are disconnected or separated (or broken up, or patterned) by the groove G, progression of moisture through the first functional layer 222a and/or the second functional layer 222c to an organic light-emitting diode OLED may be prevented or reduced.

Like the first functional layer 222a and/or the second functional layer 222c, the opposite electrode 223 formed by a thermal deposition method may be disconnected by the groove G. The capping layer 230 including LiF may be also disconnected by the groove G.

Figure 9C:
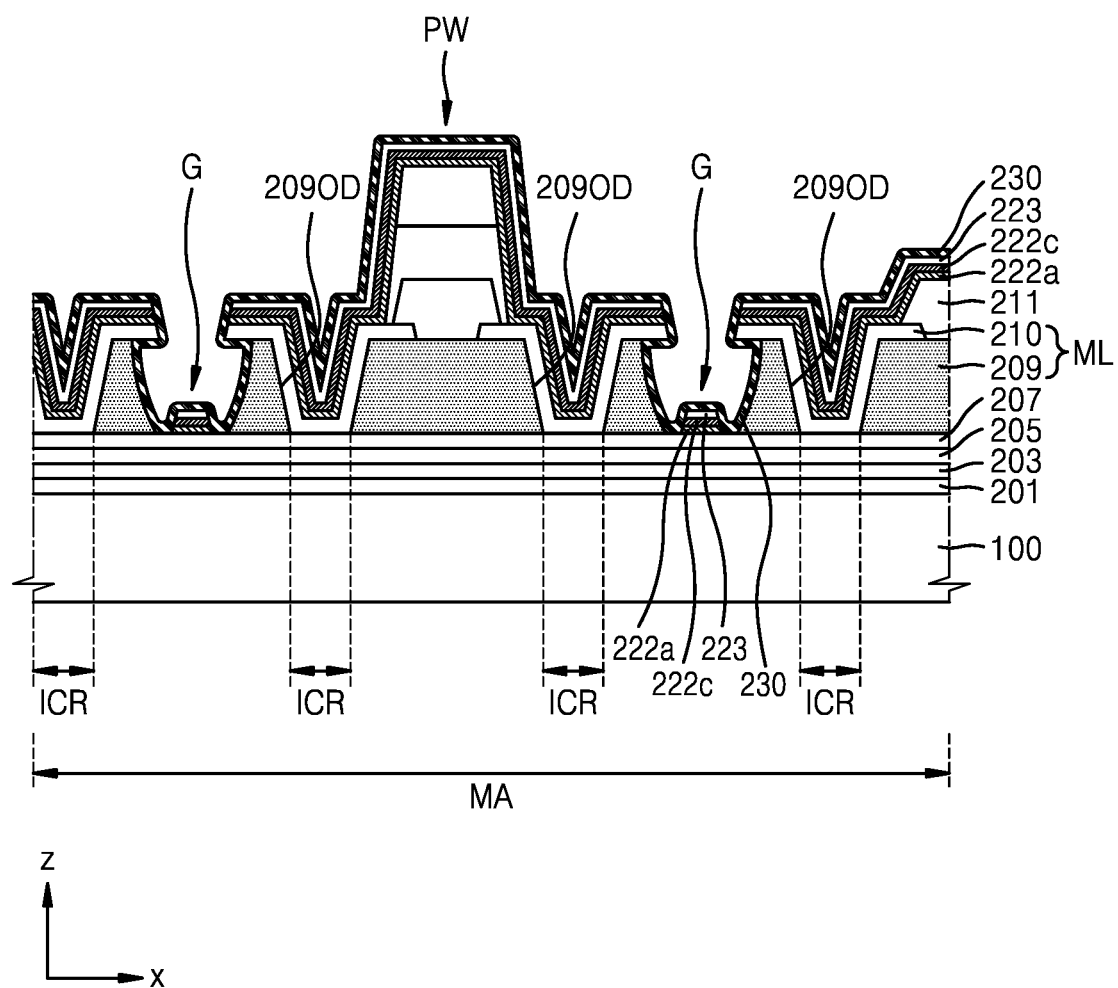

In one or more embodiments, in the case where the capping layer 230 includes an inorganic material such as silicon nitride, silicon oxynitride, and/or silicon oxide, the capping layer 230 may be continuously formed without disconnection by the groove G as shown in FIG. 9C. In one or more embodiments, the capping layer 230 may be omitted. For convenience of description, though it is shown in FIG. 9B that the capping layer 230 is disconnected by the groove G, the structure described with reference to FIG. 9C is applicable to other embodiments described below and embodiments derived therefrom.

Figure 9D:
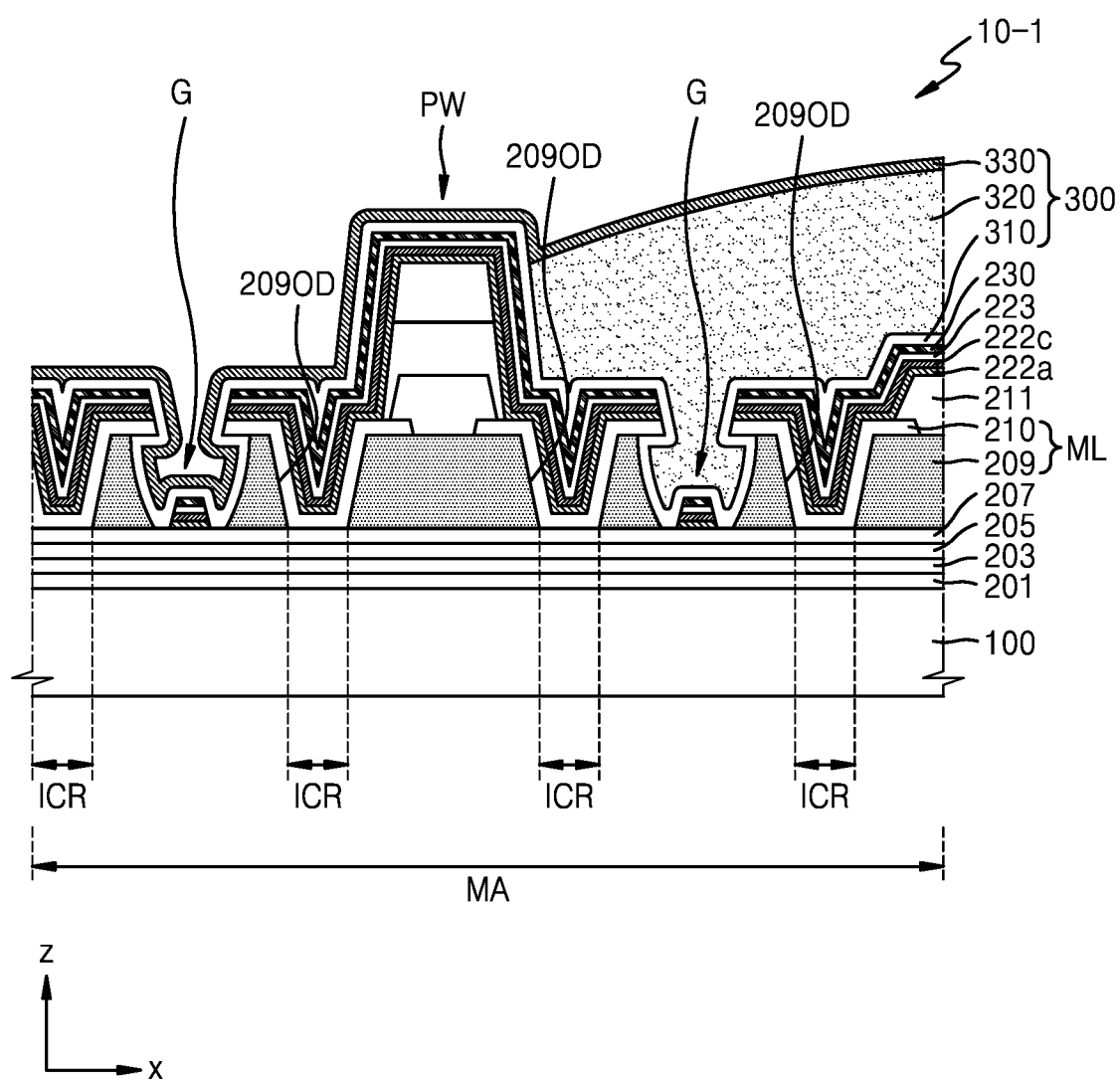

Referring to FIGS. 8 and 9D, the thin-film encapsulation layer 300 may be formed. The thin-film encapsulation layer 300 may prevent (or substantially prevent) an organic light-emitting diode OLED from being damaged or deteriorated by external impurities by covering the organic light-emitting diode OLED of the display area DA.

The thin-film encapsulation layer 300 may include at least one organic encapsulation layer and at least one inorganic encapsulation layer. The first inorganic encapsulation layer 310 formed by chemical vapor deposition (CVD) may have relatively excellent (or suitable) step coverage compared to the first functional layer 222a, the second functional layer 222c, and the opposite electrode 223. As shown in FIG. 9D, the first inorganic encapsulation layer 310 may be continuously formed. For example, the first inorganic encapsulation layer 310 may cover an entire inner surface of the groove G.

The organic encapsulation layer 320 may be formed by coating a monomer and hardening the monomer. In some embodiments, the organic encapsulation layer 320 may be formed by coating a polymer. An end of the organic encapsulation layer 320 that faces the first area OA may be adjacent to one side of the partition wall PW.

The second inorganic encapsulation layer 330 may be located on the organic encapsulation layer 320. The second inorganic encapsulation layer 330 may directly contact the first inorganic encapsulation layer 310 in a partial region of the intermediate area MA. For example, as shown in FIGS. 8 and 9D, the first inorganic encapsulation layer 310 and the second inorganic encapsulation layer 330 may contact each other in a partial region of the intermediate area MA that is adjacent to the first area OA.

Though it is shown in FIGS. 8 to 9D that the display panel 10-1 includes the first opening 10H corresponding to the first area OA, the display panel 10-1 may not include the first opening 10H corresponding to the first area OA as described with reference to FIGS. 3B to 3D. The above-described characteristics are equally applicable to display panel(s) described with reference to FIGS. 10A to 30.

A cross-section of the display panel 10-1 shown in FIG. 8 may be understood as a structure surrounding the first area OA. For example, each of the grooves G of FIG. 8 may have a ring shape surrounding the first area OA when viewed in a direction perpendicular (or normal) to the top surface of the substrate 100 as shown in FIG. 7. Similarly, the partition wall PW may also have a ring shape surrounding the first area OA when viewed in a direction perpendicular to the top surface of the substrate 100. Similarly, an element shown in FIG. 8, for example, elements (e.g. the inorganic layer 210, etc.) provided to the intermediate area MA, may have a ring shape surrounding the first area OA when viewed in a direction perpendicular to the top surface of the substrate 100. The above-described characteristics are equally applicable to display panel(s) described with reference to FIGS. 10A to 30.

Figure 10A:
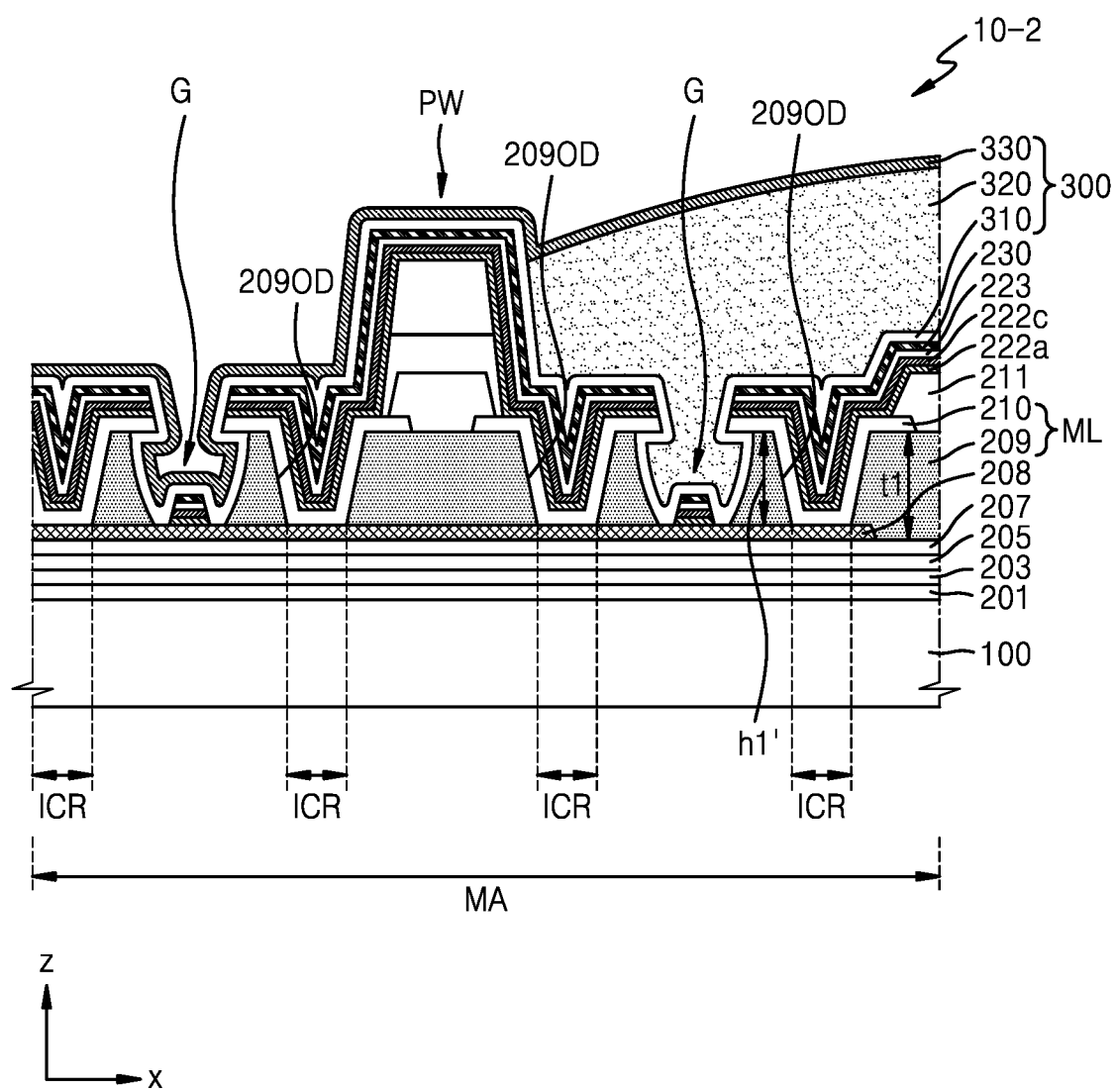
FIG. 10A is a cross-sectional view of an intermediate region of a display panel according to another embodiment.
Figure 10B:
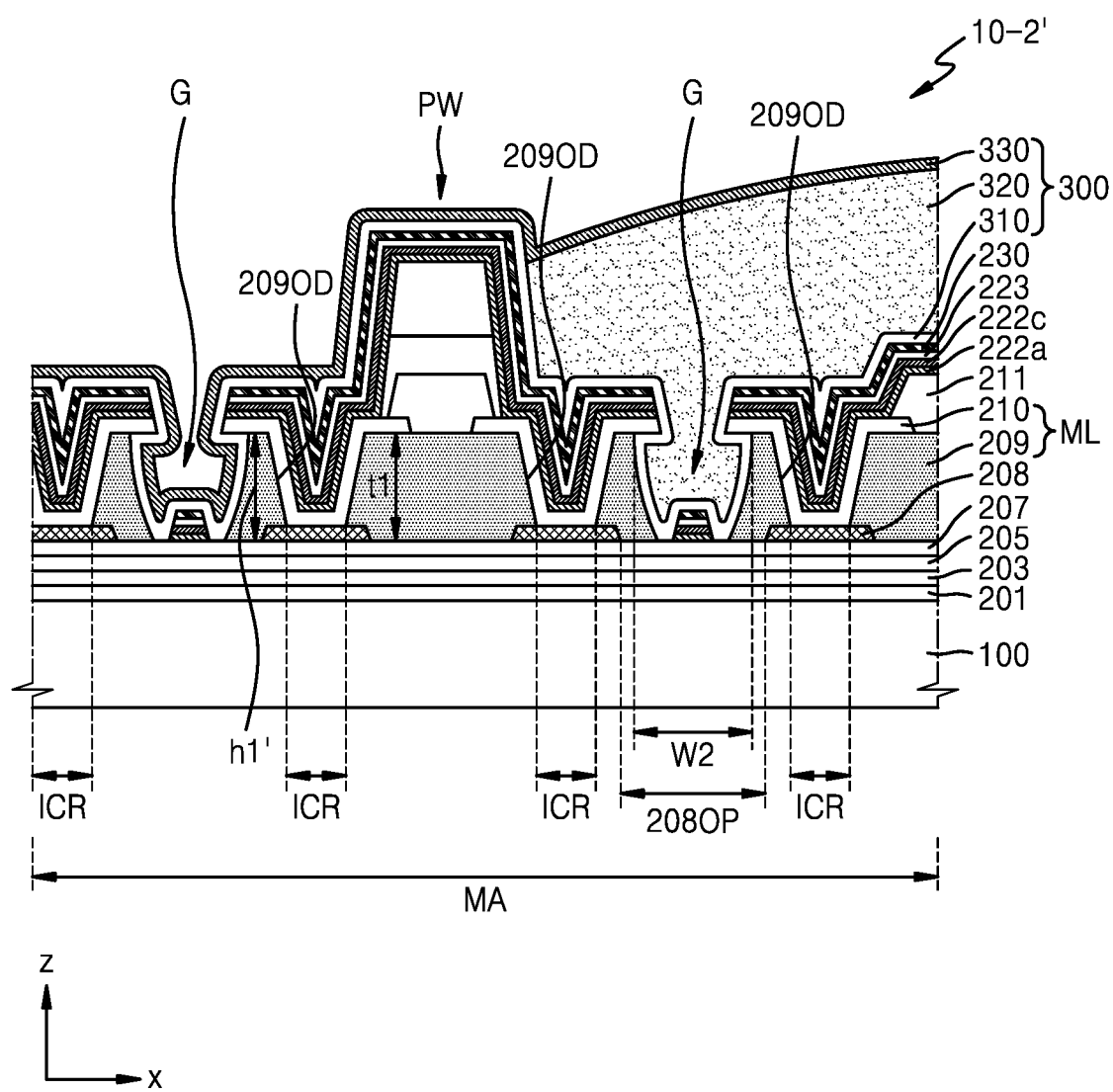
FIG. 10B is a cross-sectional view of an intermediate region of a display panel according to another embodiment.

FIG. 10A is a cross-sectional view of the intermediate area MA of a display panel 10-2 according to one or more embodiments, and FIG. 10B is a cross-sectional view of the intermediate area MA of a display panel 10-2' according to one or more embodiments.

Though it is shown in FIGS. 8 to 9D that, in the display panel 10-1, the metal layer 210 contacts the second interlayer insulating layer 207, which is an inorganic insulating layer, in the inorganic contact region ICR, the present disclosure is not limited thereto. In one or more embodiments, it is shown in FIGS. 10A and 10B that the display panel 10-2 may include a metal layer 208 (referred to as a lower metal layer hereinafter) arranged in the intermediate area MA, and the metal layer 210 may contact the lower metal layer 208 in the inorganic contact region ICR.

Referring to FIG. 10A, the lower metal layer 208 may be arranged between the second interlayer insulating layer 207 and the first organic insulating layer 209. The lower metal layer 208 may be located in only the intermediate area MA. The lower metal layer 208 may include the same material as those of the data line DL, the source electrode SE and/or the drain electrode DE of the thin film transistor TFT, each being included in the pixel circuit PC described with reference to FIG. 8. For example, the lower metal layer 208 may include three sub-layers of Ti/Al/Ti.

The metal layer 210 may directly contact a top surface of the lower metal layer 208 through the opening 2090D formed in the first organic insulating layer 209. The metal layer 210 and the lower metal layer 208 contacting each other may constitute the inorganic contact region ICR. As described with reference to FIG. 8, the metal layer 210 may include the same material as that of the contact metal layer CM. Since both the metal layer 210 and the lower metal layer 208 include a metal, adhesive force/coupling force therebetween may be suitable (e.g., relatively excellent). For example, the metal layer 210 may include the same material as that of the lower metal layer 208.

As shown in FIG. 10A, the lower metal layer 208, as a single body, may overlap the opening 2090D of the first organic insulating layer 209 and the groove G in the intermediate area MA. In some embodiments, as shown in FIG. 10B, the lower metal layer 208 of the display panel 10-2' may include an opening 2080P that overlaps the groove G, and may also include a plurality of parts spaced apart from each other around the opening 2080P. A width of the opening 2080P may be greater than a width (e.g. the second width W2) of a portion of the groove G that passes through the first organic insulating layer 209. In the opening 2080P of the lower metal layer 208, the first organic insulating layer 209 may contact the second interlayer insulating layer 207.

Though FIGS. 10A and 10B respectively show cross-sections of the display panels 10-2 and 10-2', the lower metal layer 208 may be understood as having a ring shape surrounding the first area OA when viewed in a direction perpendicular to the top surface of the substrate 100 of the display panels 10-2 and 10-2'. In one or more embodiments, in a plan view, the lower metal layer 208 may include one ring having a predetermined (or set) width (see FIG. 10A), or include a plurality of sub-rings formed by parts spaced apart from each other while the opening 2080P is formed (see FIG. 10B).

A contact between the metal layer 210 and the lower metal layer 208 is distinguished from a contact for electric connection. Since each of the metal layer 210 and the lower metal layer 208 is located in the intermediate area MA and has a ring shape when viewed in a direction perpendicular to the top surface of the substrate 100, a contact between the metal layer 210 and the lower metal layer 208 is distinguished from a contact between a metal and a metal that is intended for applying an electric signal and/or a set or predetermined voltage to elements arranged in the display area DA.

As shown in FIG. 10A, a bottom surface of the groove G may be located on a top surface of the lower metal layer 208, and a depth h1' of the groove G may be less than a thickness t1 of the first organic insulating layer 209. In one or more embodiments, the lower metal layer 208 may overlap the opening 2090D of the first organic insulating layer 209, and the depth h1' of the groove G may be equal to or less than the thickness t1 of the first organic insulating layer 209. In one or more embodiments, it is shown in FIG. 10B that a bottom surface of the groove G is located on the same planar surface as a top surface of the second interlayer insulating layer 207.

Figure 11A:
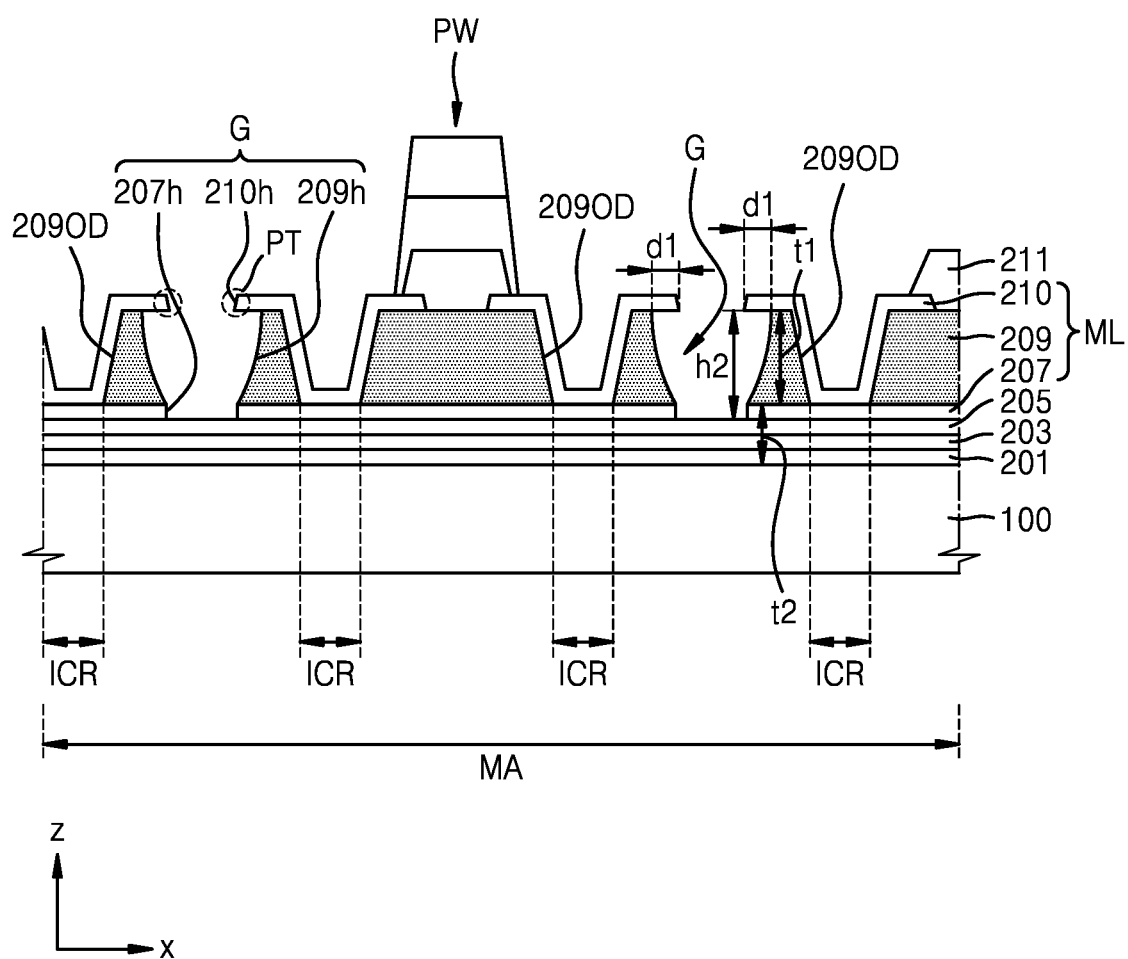
FIGS. 11A, 11B, and 11C are cross-sectional views of acts of a process of manufacturing a display panel according to an embodiment.
Figure 11B:
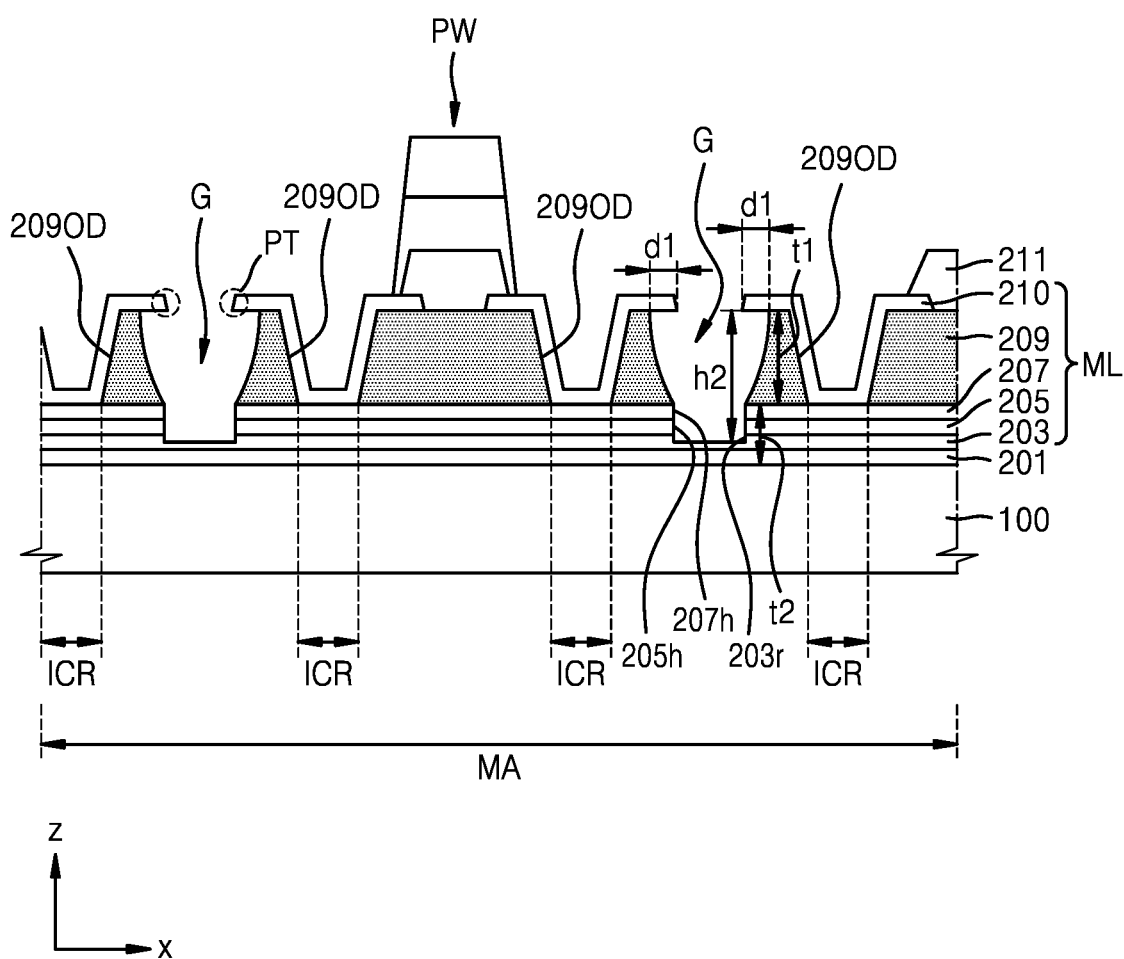
Figure 11C:
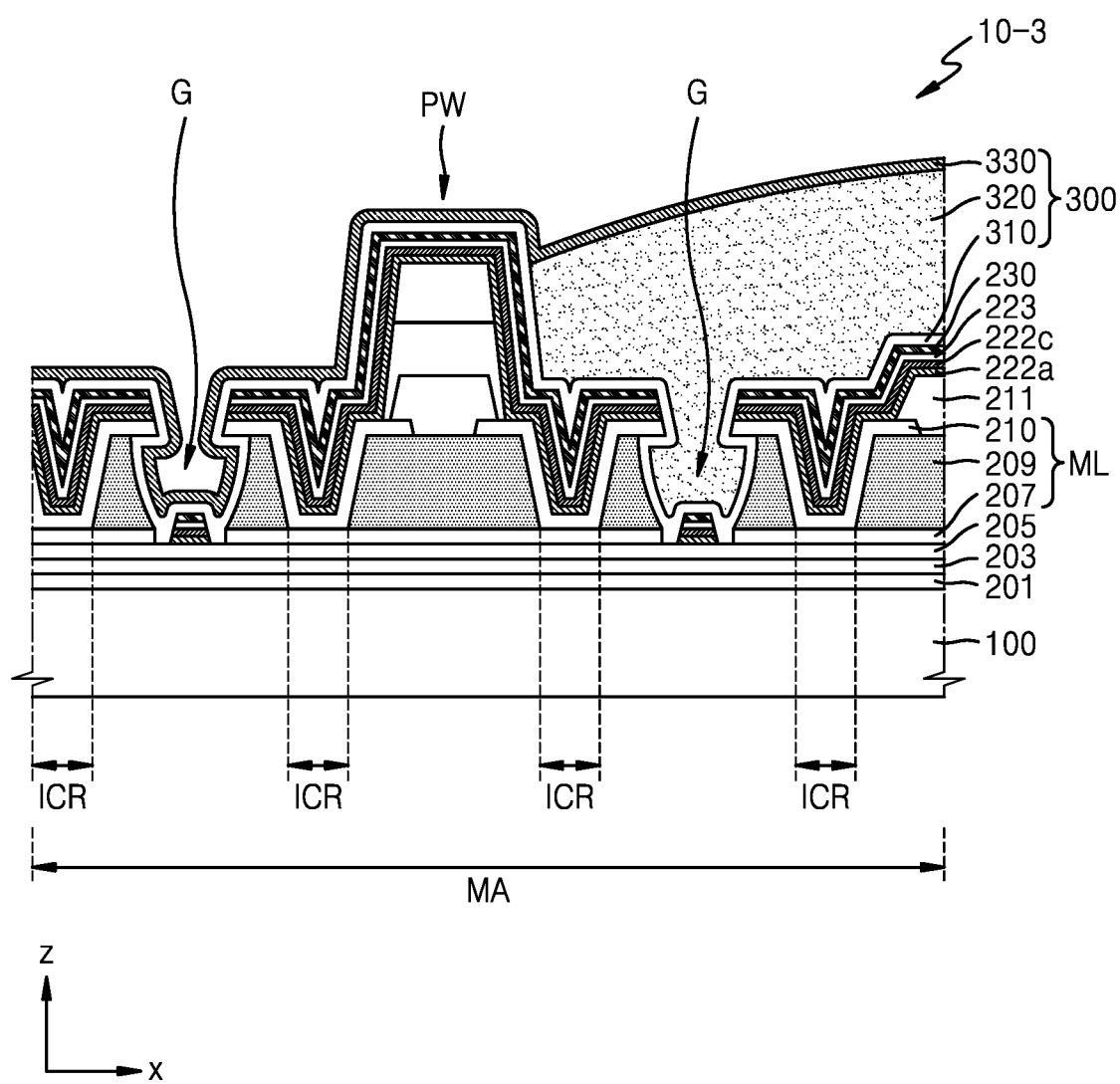

FIGS. 11A, 11B, and 11C are cross-sectional views of acts of a process of manufacturing a display panel according to one or more embodiments and show the intermediate area MA.

Referring to FIGS. 11A and 11B, the groove G is formed in the multi-layered film ML, which includes three or more layers. For example, the multi-layered film ML may include a first sub-layer including an organic layer, a second sub-layer located on the first sub-layer and including an inorganic layer, and at least one lower insulating layer (or a third sub-layer) arranged under the organic layer, the at least one lower insulating layer including an inorganic insulating layer. In one or more embodiments, as shown in FIG. 11A, the multi-layered film ML may include the first organic insulating layer 209, the metal layer 210 on the first organic insulating layer 209, and the second interlayer insulating layer 207 under the first organic insulating layer 209. In one or more embodiments, as shown in FIG. 11B, the multi-layered film ML may include the first organic insulating layer 209, the metal layer 210 on the first organic insulating layer 209, and the gate insulating layer 203, the first interlayer insulating layer 205, and the second interlayer insulating layer 207 under the first organic insulating layer 209.

During a process of forming the groove G, a portion of at least one inorganic insulating layer arranged under the first organic insulating layer 209 may be etched. For example, while a portion of the second interlayer insulating layer 207 is etched, a third hole 207h may be formed in the second interlayer insulating layer 207 (see FIG. 11A). In some embodiments, while portions of the second interlayer insulating layer 207, the first interlayer insulating layer 205, and the gate insulating layer 203 are etched, the third hole 207h may be formed in the second interlayer insulating layer 207, a fourth hole 205h may be formed in the first interlayer insulating layer 205, and a recess 203r may be formed in the gate insulating layer 203 (see FIG. 11B). In one or more embodiments, a recess may be formed in the second interlayer insulating layer 207 shown in FIG. 11A instead of the third hole 207h that passes through the second interlayer insulating layer 207. In one or more embodiments, a hole may be formed in the gate insulating layer 203 shown in FIG. 11B instead of the recess 203r.

Since the groove is formed while a portion of at least one inorganic insulating layer arranged under the first organic insulating layer 209 is removed, a depth h2 of the groove G may be greater than the thickness t1 of the first organic insulating layer 209 (h2>t1) and less than a sum of the thickness t1 of the first organic insulating layer 209 and a thickness t2 of the at least one inorganic insulating layer (t1+t2>h2). The bottom surface of the groove G may be located on a virtual surface located between the top surface of the substrate 100 and a top surface of the second interlayer insulating layer 207. The depth h2 of the groove G may be 1.5 μm or more. For example, the depth h2 of the groove G may be 2 μm or more, or 2.5 μm or more, or 3 μm or more, or 3.5 μm or more.

The groove G may have an undercut shape, and a tip PT of the metal layer 210 may extend toward a center of the groove G and may constitute an eave shape. A protruding length d1 of the tip PT may be equal to or less than 2.0 μm and, for example, may be about 1 μm to about 1.5 μm.

Next, as shown in FIG. 11C, the intermediate layer 222, the opposite electrode 223, and the capping layer 230 may be sequentially formed over the substrate 100 in which the groove is formed. In one or more embodiments, the first functional layer 222a, the second functional layer 222c, the opposite electrode 223, and the capping layer 230 may each be disconnected (or separated, or patterned) in the intermediate area MA by the groove G. In one or more embodiments, the capping layer 230 may be omitted or continuously formed without disconnection by the groove G as described with reference to FIG. 9C.

The partition wall PW may be arranged between the grooves G and the characteristics of other elements of a display panel 10-3 (e.g., an end of the organic encapsulation layer 320 adjacent to one side of the partition wall PW adjacent to the display area DA) are the same as those described with reference to FIGS. 8 to 9D.

Figure 12:
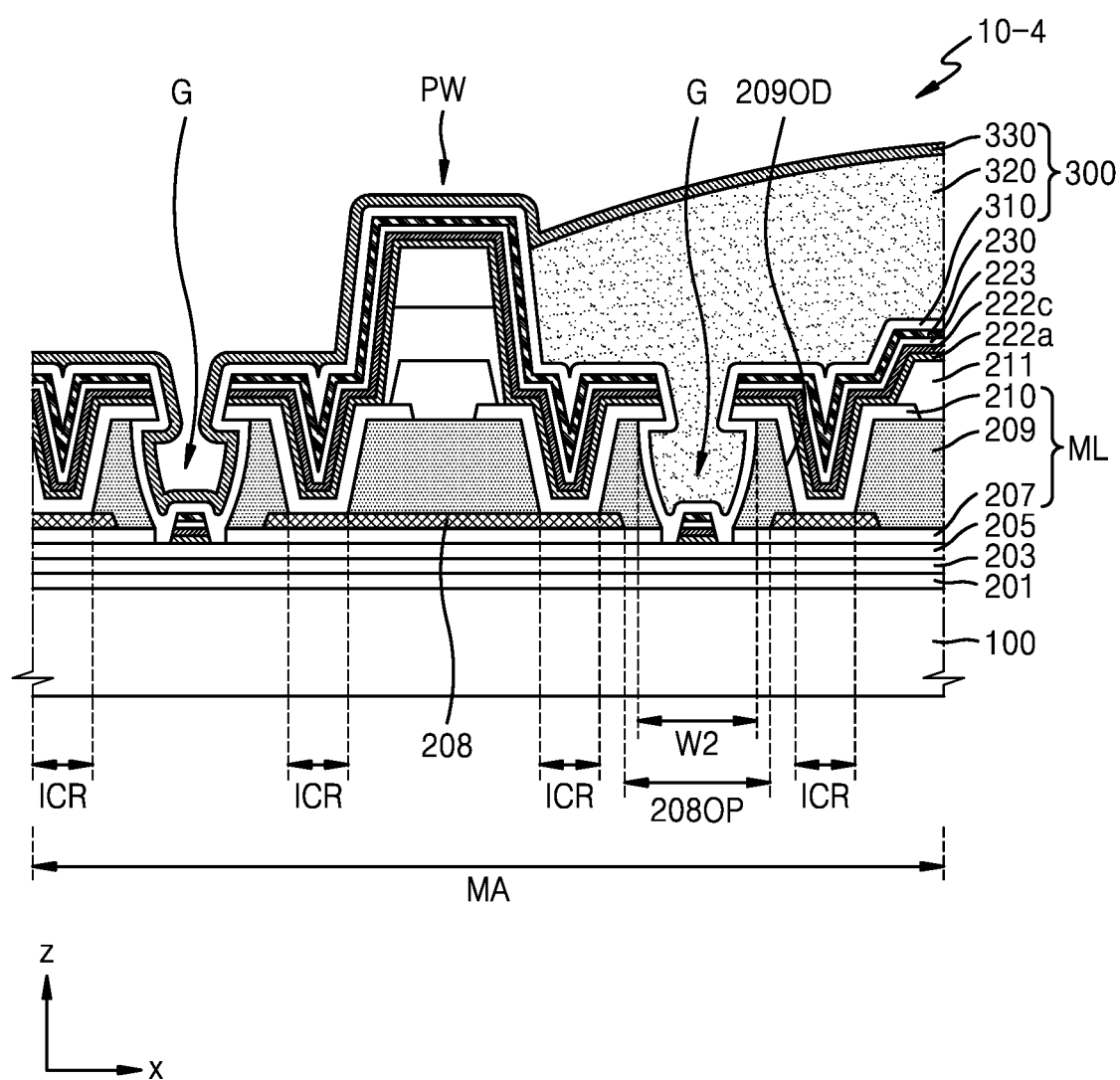
FIG. 12 is a cross-sectional view of an intermediate region of a display panel according to another embodiment.

FIG. 12 is a cross-sectional view of the intermediate area MA of a display panel 10-4 according to one or more embodiments.

Referring to FIG. 12, the display panel 10-4 may include the lower metal layer 208 arranged in the intermediate area MA. The lower metal layer 208 may be arranged between the second interlayer insulating layer 207 and the first organic insulating layer 209.

The metal layer 210 may directly contact a top surface of the lower metal layer 208 through the opening 2090D of the first organic insulating layer 209. The metal layer 210 and the lower metal layer 208 contacting each other may constitute an inorganic contact region ICR.

The lower metal layer 208 may include the same material as those of the data line DL, the source electrode SE and/or the drain electrode DE of the thin film transistor TFT, each being included in the pixel circuit PC described with reference to FIG. 8. For example, the lower metal layer 208 may include three sub-layers of Ti/Al/Ti. The metal layer 210 may include the same material as that of the lower metal layer 208.

The lower metal layer 208 may not be formed in a region corresponding to the groove G. For example, the lower metal layer 208 may include the opening 2080P formed in the region corresponding to the groove G. A width of the opening 2080P may be greater than a width (e.g. the second width W2) of a portion of the groove G that passes through the first organic insulating layer 209. In the opening 2080P of the lower metal layer 208, the first organic insulating layer 209 may contact the second interlayer insulating layer 207.

A bottom surface of the groove G may be located on a virtual surface between the top surface of the substrate 100 and a top surface of the lower metal layer 208. In one or more embodiments, it is shown in FIG. 12 that the bottom surface of the groove G is located below the bottom surface of the lower metal layer 208, for example, located on a virtual surface that is the same as a top surface of the first interlayer insulating layer 205. Depending on an etched degree of inorganic insulating layer(s) below the first organic insulating layer 209 during a process of forming the groove G, the bottom surface of the groove G may be located on one of the virtual surfaces located between the top surface of the substrate 100 and a top surface of the second interlayer insulating layer 207.

The cross-sectional structure shown in FIG. 12 may be understood as a structure surrounding the first area OA. As described above, elements shown in FIG. 12 may have a ring shape surrounding the first area OA in a plan view, for example, when viewed in a direction perpendicular to the top surface of the substrate 100.

Figure 13A:
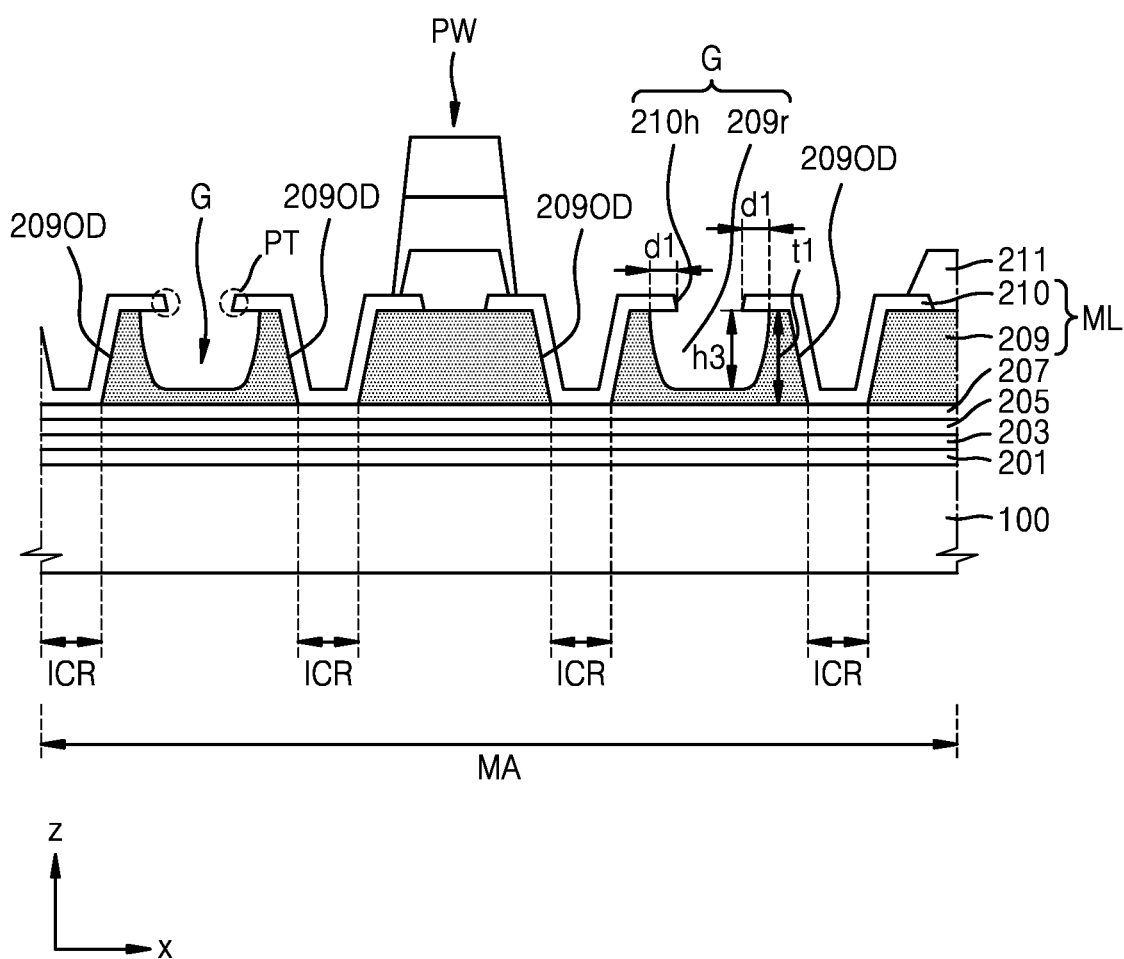
FIGS. 13A and 13B are cross-sectional views of acts of a process of manufacturing a display panel according to an embodiment.
Figure 13B:
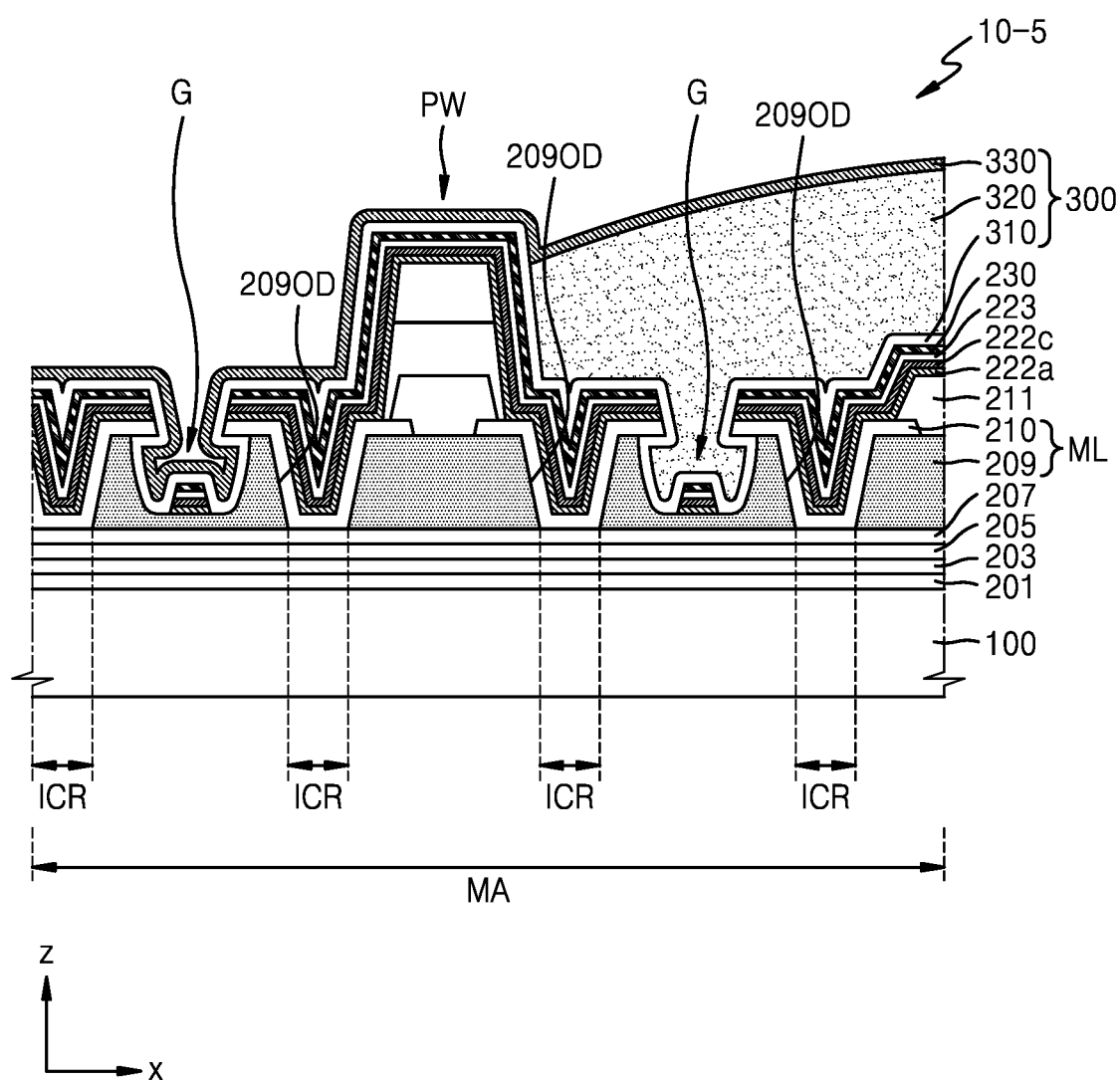

FIGS. 13A and 13B are cross-sectional views of acts of a process of manufacturing a display panel, according to one or more embodiments, and show the intermediate area MA.

Referring to FIG. 13A, the groove G may be formed in the multi-layered film ML including the first organic insulating layer 209 and the metal layer 210. The first hole 210h formed in the metal layer 210 and a recess 209r formed in the first organic insulating layer 209 may constitute the groove G. The depth of the groove G, for example, a depth h3 of the recess 209r may be less than the thickness t1 of the first organic insulating layer 209. The depth h3 of the recess 209r may be 1.5 μm or more, for example, 2 μm or more.

As shown in FIG. 13A, in the case where the depth h3 of the recess 209r is less than the thickness t1 of the first organic insulating layer 209, the bottom surface of the groove G may be located on a virtual surface between a top surface and a bottom surface of the first organic insulating layer 209. In this case, a portion of the first organic insulating layer 209 under the bottom surface of the groove G may provide a path through which moisture penetrates. However, according to one or more embodiments, since the openings 2090D are respectively arranged on two opposite sides of the groove G, and the metal layer 210 and an inorganic insulating layer, for example, the second interlayer insulating layer 207, directly contact each other through the opening 2090D and thus constitute an inorganic contact region ICR, the above-described moisture transmission issue may be prevented or reduced.

The groove G may have an undercut structure. The ends of the metal layer 210 that protrude toward the center of the groove G and/or the first hole 210*h* may constitute a pair of eaves (or a pair of protruding tips, or tips PT). A protruding length d1 of each tip PT may be about 1 µm to about 1.5 µm.

Referring to FIG. 13B, the intermediate layer 222, the opposite electrode 223, and the capping layer 230 may be sequentially formed over the substrate 100 in which the groove G is formed. A portion of the intermediate layer 222, for example, the first functional layer 222*a* and/or the second functional layer 222*c*, may be disconnected or separated by the groove G in the intermediate area MA. Similarly, the opposite electrode 223 and the capping layer 230 may be disconnected or separated in the intermediate area MA. In one or more embodiments, the capping layer 230 may be omitted or the capping layer 230 including an inorganic insulating layer may be continuously formed as described with reference to FIG. 9C. After that, the thin-film encapsulation layer 300 may be formed.

A partition wall PW may be arranged between the grooves G. Here, a characteristic in which an end of the organic encapsulation layer 320 is adjacent to one side of the partition wall PW adjacent to the display area DA, and characteristics of the elements of a display device 10-5 (such as the first inorganic encapsulation layer 310 and the second inorganic encapsulation layer 330) are the same as those described with reference to FIGS. 8 to 9D.

Characteristics in which the groove G described with reference to FIG. 13A includes the recess 209*r* of the first organic insulating layer 209 and the first hole 210*h* of the metal layer 210, and a depth of the groove G (that is, the depth h3 of the recess 209*r* is less than the thickness t1 of the first organic insulating layer 209), and a characteristic in which the bottom surface of the groove G is between a bottom surface and a top surface of the first organic insulating layer 209 are equally applicable to the embodiments described with reference to FIGS. 8 to 12 and/or one or more embodiments described below with reference to FIGS. 14 to 30.

Figure 14:
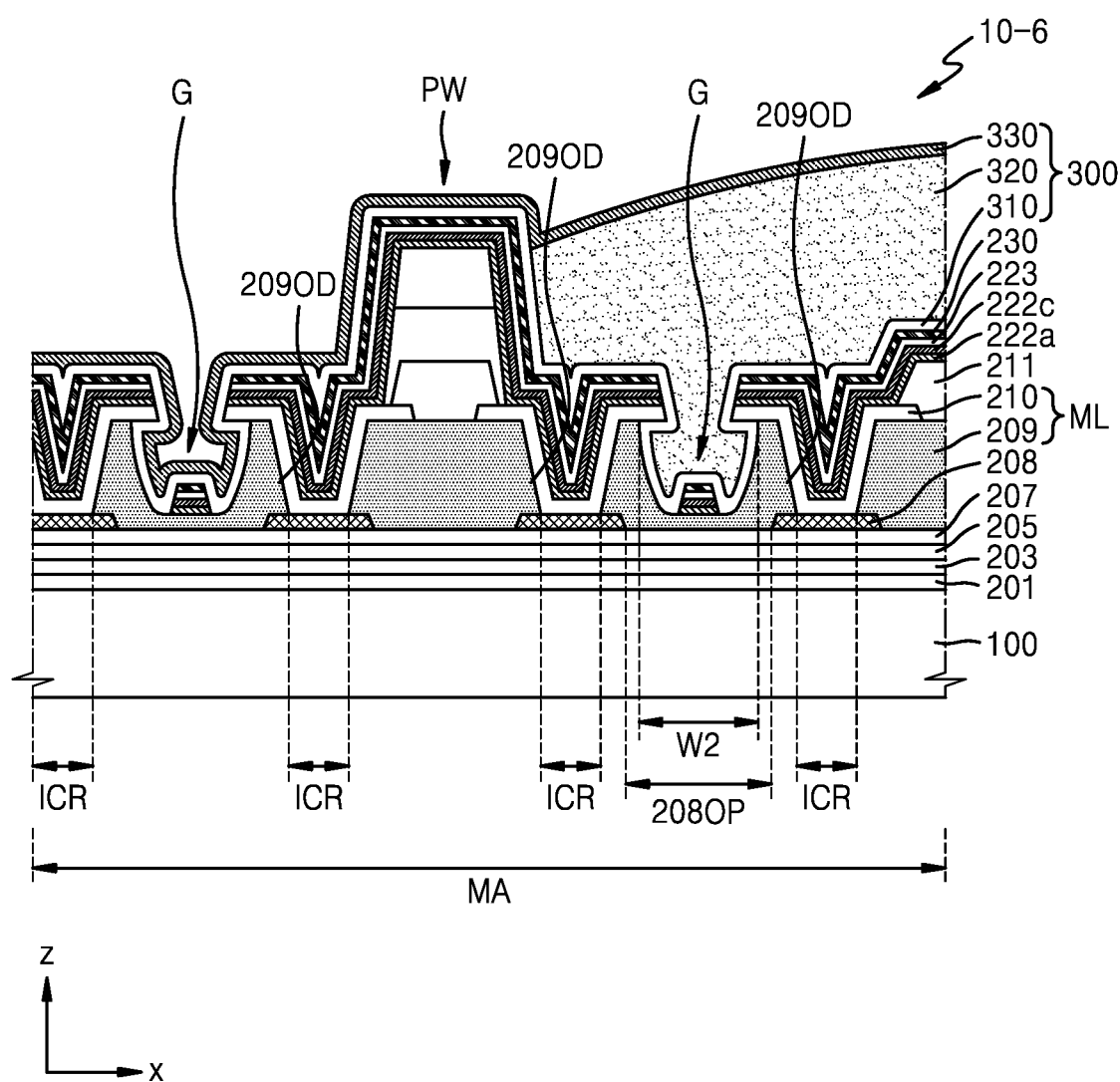
FIG. 14 is a cross-sectional view of an intermediate region of a display panel according to another embodiment.

FIG. 14 is a cross-sectional view of the intermediate area MA of a display panel 10-6 according to one or more embodiments.

Referring to FIG. 14, the display panel 10-6 may include the metal layer 208 arranged in the intermediate area MA. The lower metal layer 208 may be arranged between the second interlayer insulating layer 207 and the first organic insulating layer 209. The lower metal layer 208 may include the same material (or materials) as those of the data line DL, the source electrode SE and/or the drain electrode DE of the thin film transistor TFT, each being included in the pixel circuit PC described with reference to FIG. 8. For example, the lower metal layer 208 may include three sub-layers of Ti/Al/Ti. The metal layer 210 may include the same material as that of the lower metal layer 208.

The lower metal layer 208 may include the opening 2080P formed in a region corresponding to the groove G, and a width of the opening 2080P may be greater than a width (e.g. the second width W2) of a portion of the groove G that passes through the first organic insulating layer 209.

In one or more embodiments, the lower metal layer 208 may be formed as one body having a predetermined (or set) width so as to correspond to the intermediate area MA without including the opening 2080P as described with reference to FIG. 10A.

Figure 15A:
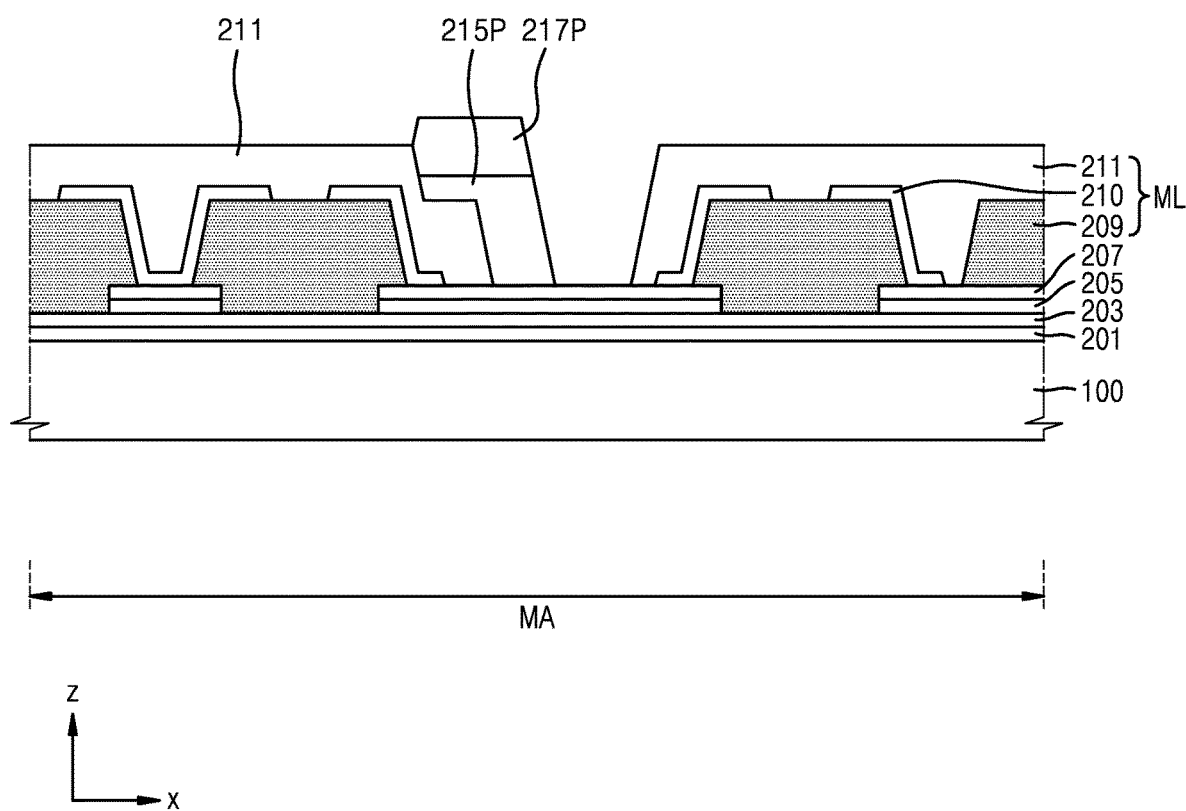
FIGS. 15A and 15D-15F are cross-sectional views of acts of a process of manufacturing a display panel according to an embodiment.
Figure 15B:
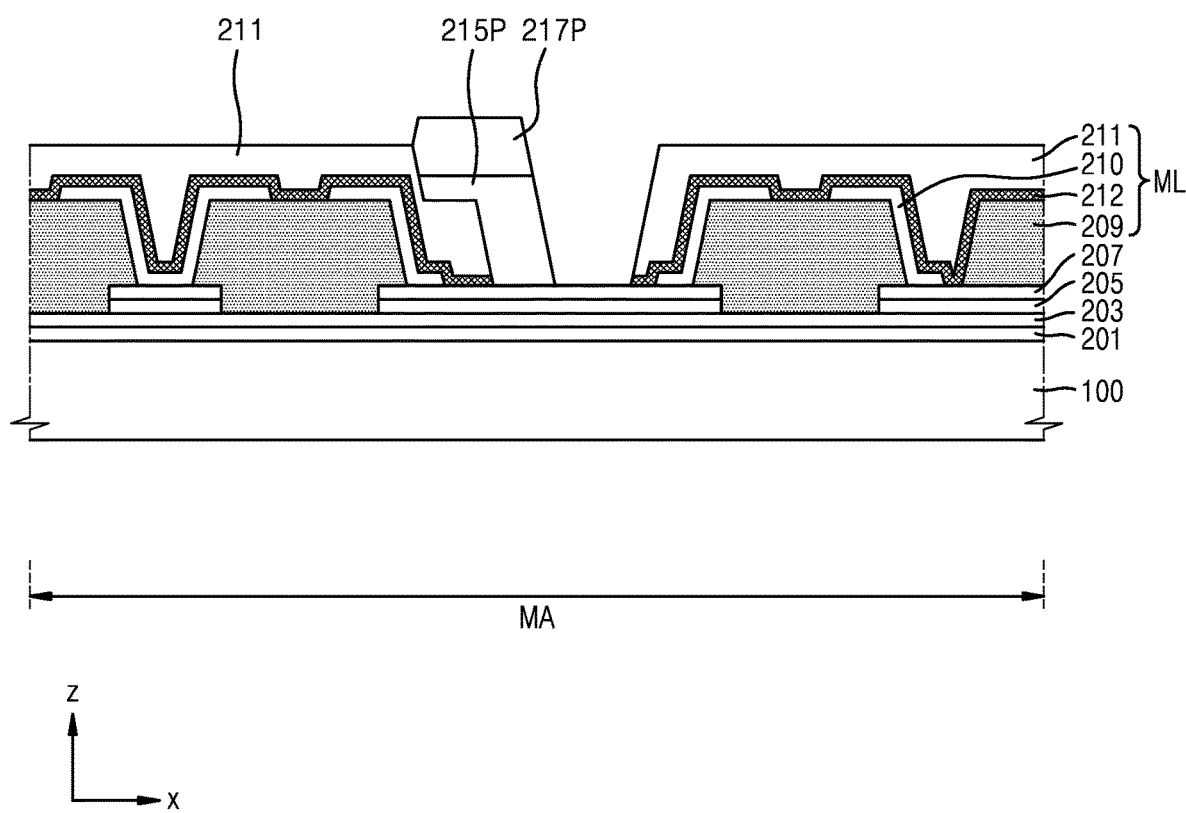
FIGS. 15B and 15C are cross-sectional views of a modified embodiment of FIG. 15A.
Figure 15C:
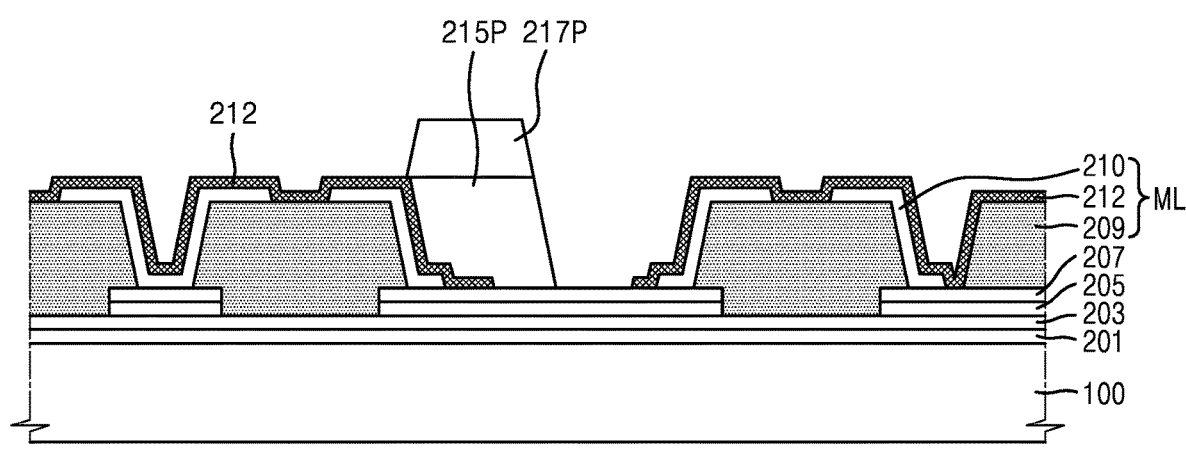
Figure 15D:
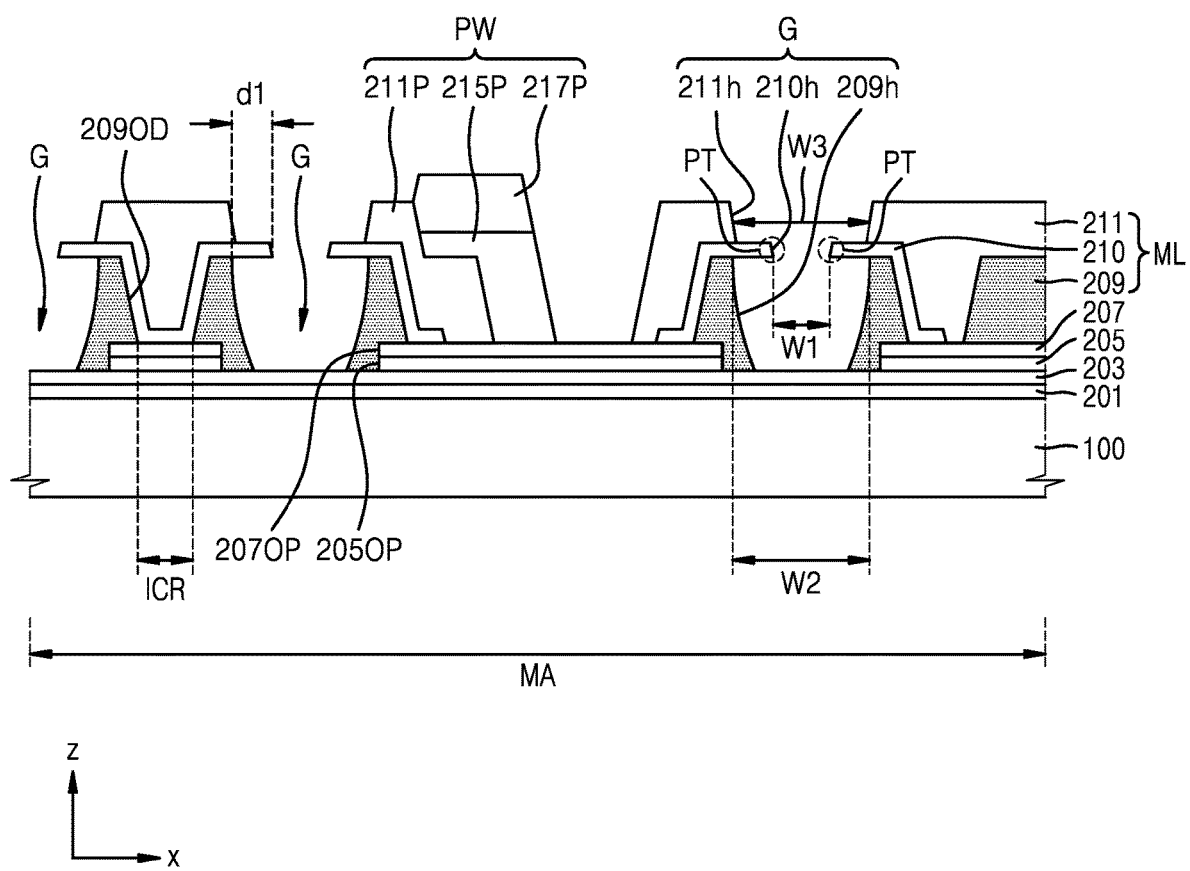
Figure 15E:
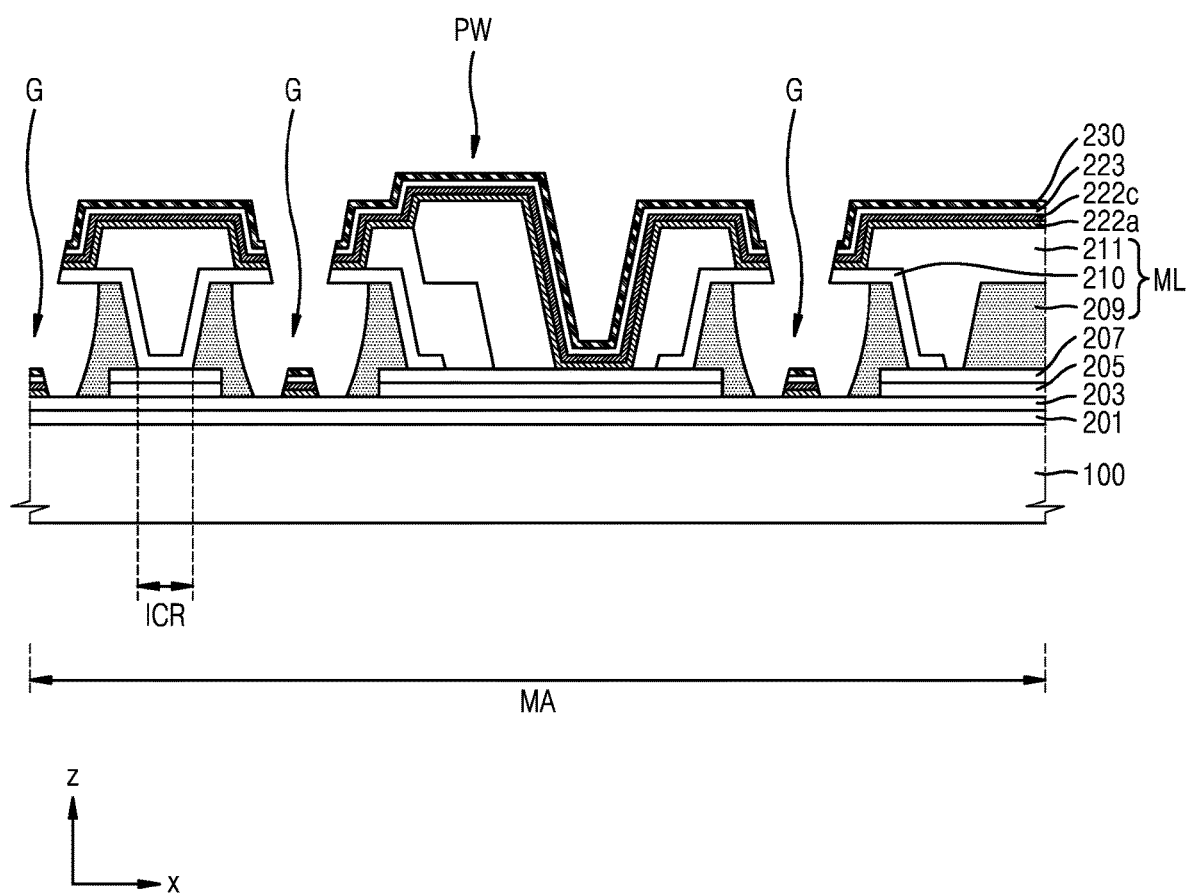
Figure 15F:
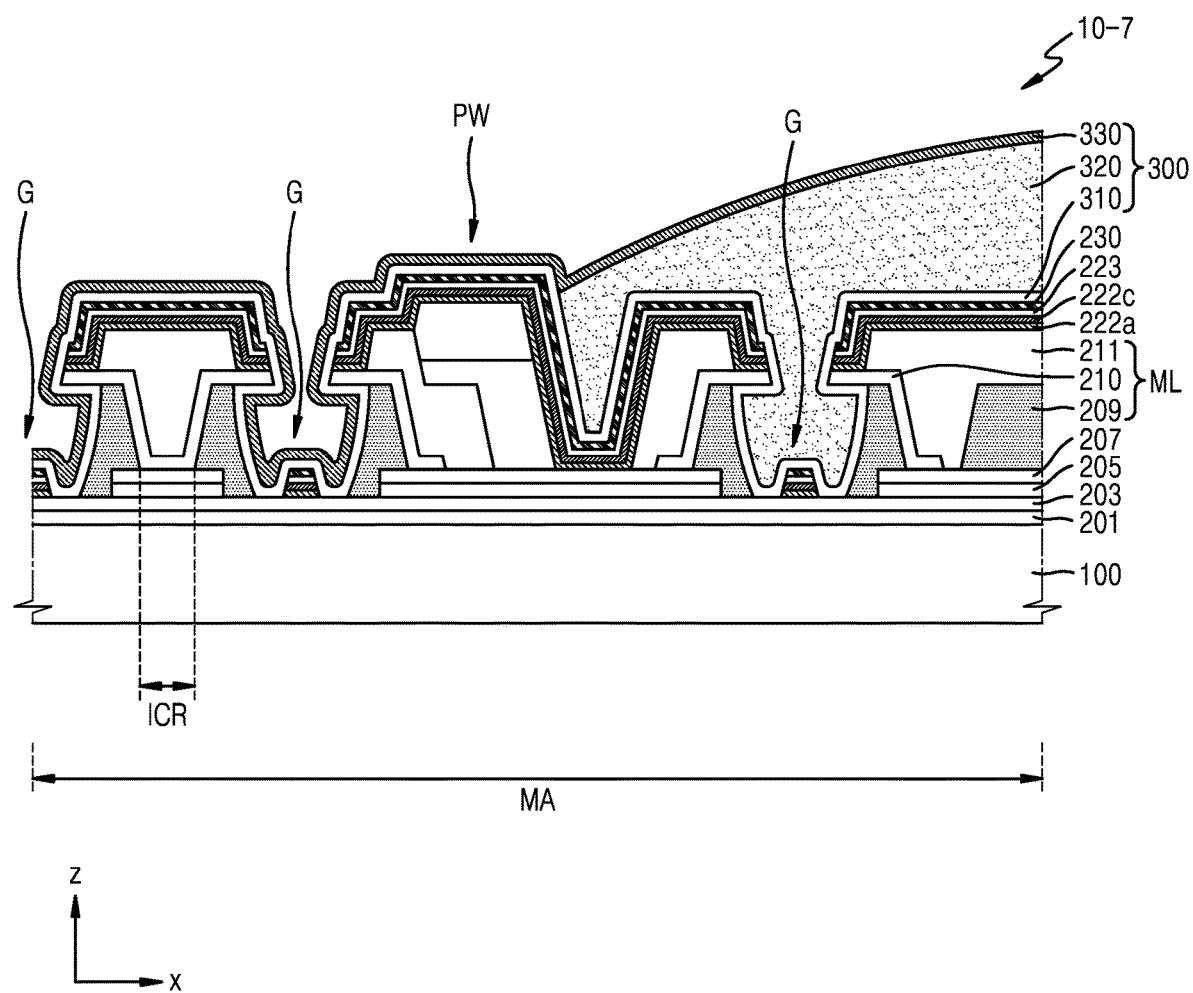
Figure 15G:
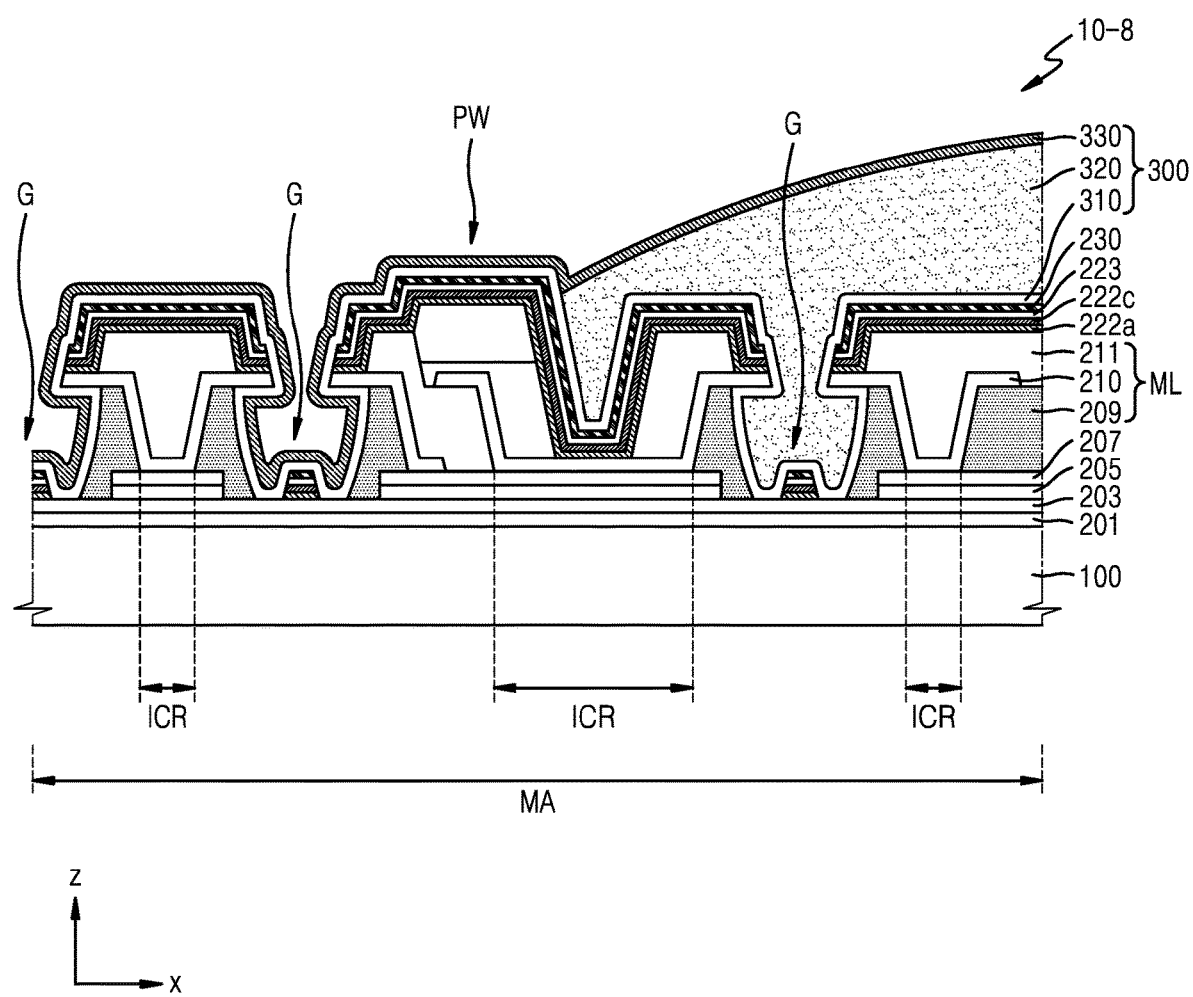
FIG. 15G is a cross-sectional view of a modified embodiment of a display panel according to FIG. 15F.

FIGS. 15A, 15D to 15F are cross-sectional views of acts of a process of manufacturing a display panel according to one or more embodiments, FIGS. 15B and 15C correspond to cross-sections according to a modified embodiment of FIG. 15A, and FIG. 15G corresponds to a modified embodiment of a display panel according to FIG. 15F.

The multi-layered film ML, in which the groove G is formed, may include the first sub-layer, which is an organic layer, the second sub-layer located on the first sub-layer and including an inorganic layer, and at least one top insulating layer (or a fourth sub-layer) located on the second sub-layer, the at least one top insulating layer including an organic insulating layer, an inorganic insulating layer, or an organic insulating layer and an inorganic insulating layer.

In one or more embodiments, as shown in FIG. 15A, the multi-layered film ML may include the first organic insulating layer 209, the metal layer 210 on the first organic insulating layer 209, and the second organic insulating layer 211 on the metal layer 210. As described above, the metal layer 210 may be located on the same layer as a layer on which the contact metal layer CM is arranged and may include the same material as that of the contact metal layer CM.

In one or more embodiments, as shown in FIG. 15B, the at least one top insulating layer may include an inorganic insulating layer 212 and the second organic insulating layer 211. Therefore, the multi-layered film ML may include the first organic insulating layer 209, the metal layer 210, the inorganic insulating layer 212, and the second organic insulating layer 211 that are sequentially stacked.

In one or more embodiments, as shown in FIG. 15C, at least one top insulating layer may include the inorganic insulating layer 212. In this case, the multi-layered film ML may include the first organic insulating layer 209, the metal layer 210, and the inorganic insulating layer 212 that are sequentially stacked.

Hereinafter, for convenience of description, described is a process for the case (one or more embodiments) in which the multi-layered film ML includes the first organic insulating layer 209, the metal layer 210 on the first organic insulating layer 209, and the second organic insulating layer 211 on the metal layer 210 as shown in FIG. 15A.

The groove G of the multi-layered film ML may be formed by an etching process (e.g. an isotropic etching, etc.). As shown in FIG. 15D, the first hole 210*h* of the metal layer 210, the second hole 209*h* of the first organic insulating layer 209, and a fifth hole 211*h* of the second organic insulating layer 211 that overlap one another may constitute the groove G. Characteristics of a protruding length d1 of each of a pair of tips PT extending toward the center of the groove G, the first width W1 of the first hole 210*h* of the metal layer 210, a width (e.g. the second width W2) of a portion of the groove G that passes through the first organic insulating layer 209 are the same as those described above. A lateral surface of the second organic insulating layer 211 that defines the fifth hole 211*h* may not protrude further toward the center of the groove G than the pair of tips PT. In other words, a width W3 (referred to as a third width) of the fifth hole 211*h* may be equal to or greater than the first width W1 of the first hole 210*h* of the metal layer 210. In the case where the lateral surface of the second organic insulating layer 211 has an inclined surface, it may be understood that the third width W3 of the fifth hole 211*h* is a minimum value between the lateral surfaces of the second organic insulating layer 211 that define the fifth hole 211*h*.

For example, as shown in FIG. 15D, the groove G may include the fifth hole 211*h* of the second organic insulating layer 211, the first hole 210*h* of the metal layer 210, and the second hole 209*h* of the first organic insulating layer 209.

The bottom surface of the groove G may be located on a virtual surface that is the same as a bottom surface of the first organic insulating layer 209.

In one or more embodiments, the groove G may include the first hole 210h of the metal layer 210, the first recess 209r (see FIG. 13A) of the first organic insulating layer 209, and the fifth hole 211h of the second organic insulating layer 211. In this case, the bottom surface of the groove G may be located on a virtual surface between a bottom surface and a top surface of the first organic insulating layer 209.

Inorganic insulating layers located under the first organic insulating layer 209, for example, the second interlayer insulating layer 207 and/or the first interlayer insulating layer 205, may respectively include openings 2070P and 2050P that overlap the groove G. In this case, the depth of the groove G may deepen accordingly. In one or more embodiments, as shown in FIGS. 8 to 14, inorganic insulating layers located under the first organic insulating layer 209, for example, the second interlayer insulating layer 207 and/or the first interlayer insulating layer 205, may not include the openings 2070P and 2050P that overlap the groove G.

Referring to FIGS. 15A to 15D, a top insulating layer, for example, the inorganic insulating layer 212 and/or the second organic insulating layer 211 shown in FIGS. 15A to 15C, may cover an end of the metal layer 210 corresponding to the tip PT (see FIG. 15D) before an etching process of forming the groove G. Therefore, the end of the metal layer 210 that corresponds to the tip PT may be prevented (or protected) from being damaged during a process of manufacturing the display panel.

The partition wall PW may be adjacent to the groove G. For example, the partition wall PW may be formed on a portion of the multi-layered film ML that constitutes the groove G, for example, the second organic insulating layer 211. In one or more embodiments, the partition wall PW may be formed while a portion 211P of the second organic insulating layer 211, a portion 215P of the pixel-defining layer 215, and a portion 217P of the spacer 217 are stacked. A portion of the metal layer 210 located under the portion 211P of the second organic insulating layer 211 may also constitute the partition wall PW.

The first organic insulating layer 209 may include the opening 2090D. The metal layer 210 and an inorganic layer under the first organic insulating layer 209, for example, the second interlayer insulating layer 207, may directly contact each other through the opening 2090D, thereby constituting an inorganic contact region ICR.

Referring to FIG. 15E, the intermediate layer 222, the opposite electrode 223, and the capping layer 230 may be sequentially formed over the substrate 100 in which the groove G is formed. The first functional layer 222a, the second functional layer 222c, the opposite electrode 223, and the capping layer 230 may be disconnected or separated by the groove G in the intermediate area MA. In one or more embodiments, the capping layer 230 may be omitted or continuously formed without disconnection by the groove G as described with reference to FIG. 9C.

Referring to FIG. 15F, the thin-film encapsulation layer 300 is formed over the substrate 100. For example, the first inorganic encapsulation layer 310, the organic encapsulation layer 320, and the second inorganic encapsulation layer 330 may be sequentially formed. Since the first inorganic encapsulation layer 310 and the second inorganic encapsulation layer 330 have suitable (e.g., relatively excellent) step coverage, the first inorganic encapsulation layer 310 and the second inorganic encapsulation layer 330 may cover an entire inner surface of the groove G. An end of the organic encapsulation layer 320 may be adjacent to one lateral surface of the partition wall PW.

Though it is shown in FIG. 15F that, in a display panel 10-7, an inorganic contact region ICR is located on one side of the groove G (e.g. on the left of the groove G located on the left in FIG. 15F), the present disclosure is not limited thereto. In one or more embodiments, referring to a display panel 10-8 of FIG. 15G, inorganic contact regions ICR may be respectively located on two opposite sides around the groove G, that is, a first side adjacent to the display area DA and a second side adjacent to the first area OA. In the inorganic contact region ICR, the metal layer 210 may contact a top surface of an inorganic insulating layer, for example, the second interlayer insulating layer 207 exposed through the opening of the first organic insulating layer 209. A partial region of the metal layer 210 may correspond to a portion of a sub-layer of the partition wall PW including a plurality of layers.

Though in the display panel 10-7 described with reference to FIGS. 15A, 15D, 15E, and 15F, the at least one top insulating layer of the multi-layered film ML includes the second organic insulating layer 211, the above process is equally applicable to the embodiments including the top insulating layer described with reference to FIG. 15B or 15C. For example, a structure of the multi-layered film ML and a structure of the groove G may be variously modified, as shown in FIGS. 16 to 24, depending on a stacked structure of insulating layers arranged on the metal layer 210 and a process for forming thereof.

Figure 16:
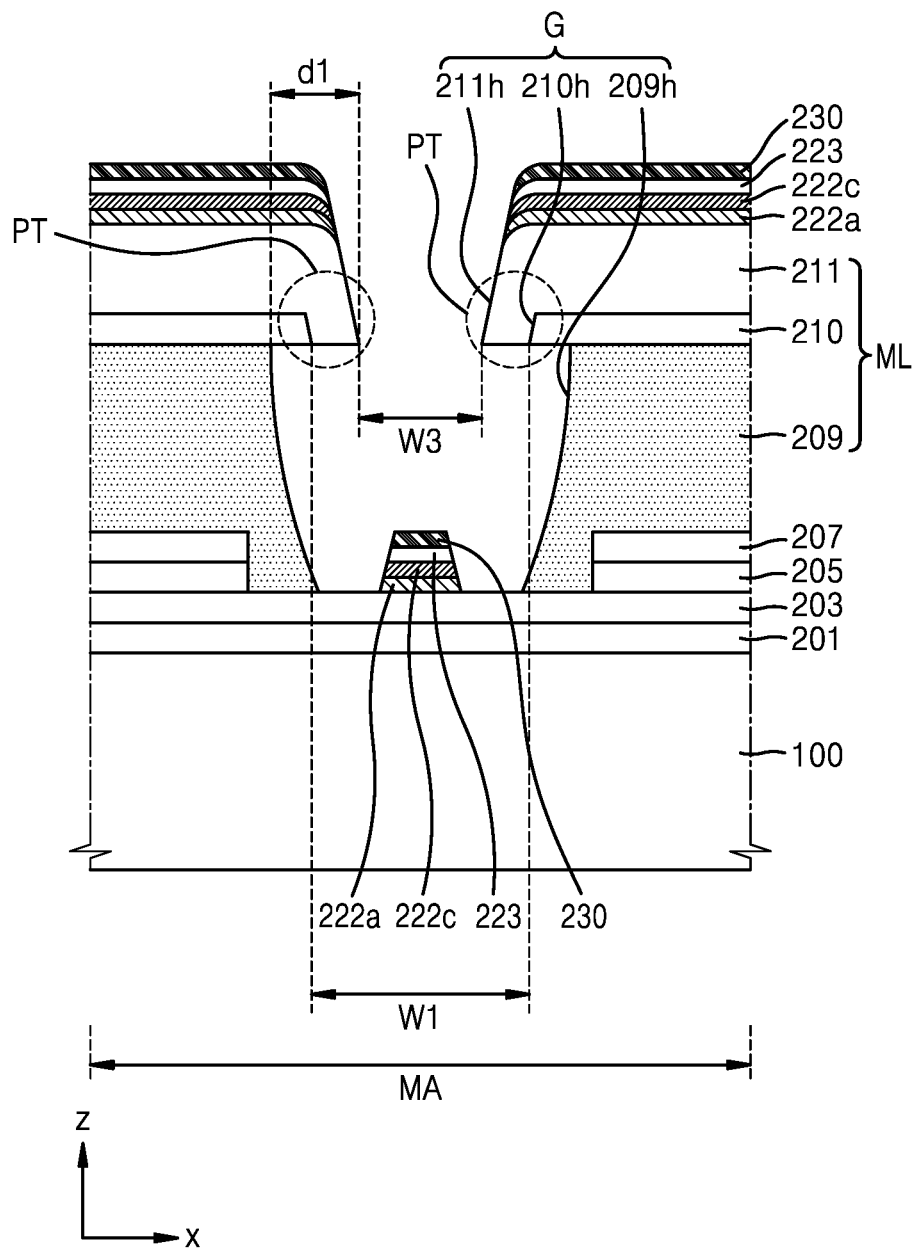
FIG. 16 is a cross-sectional view of a groove of a display panel according to another embodiment.
Figure 17:
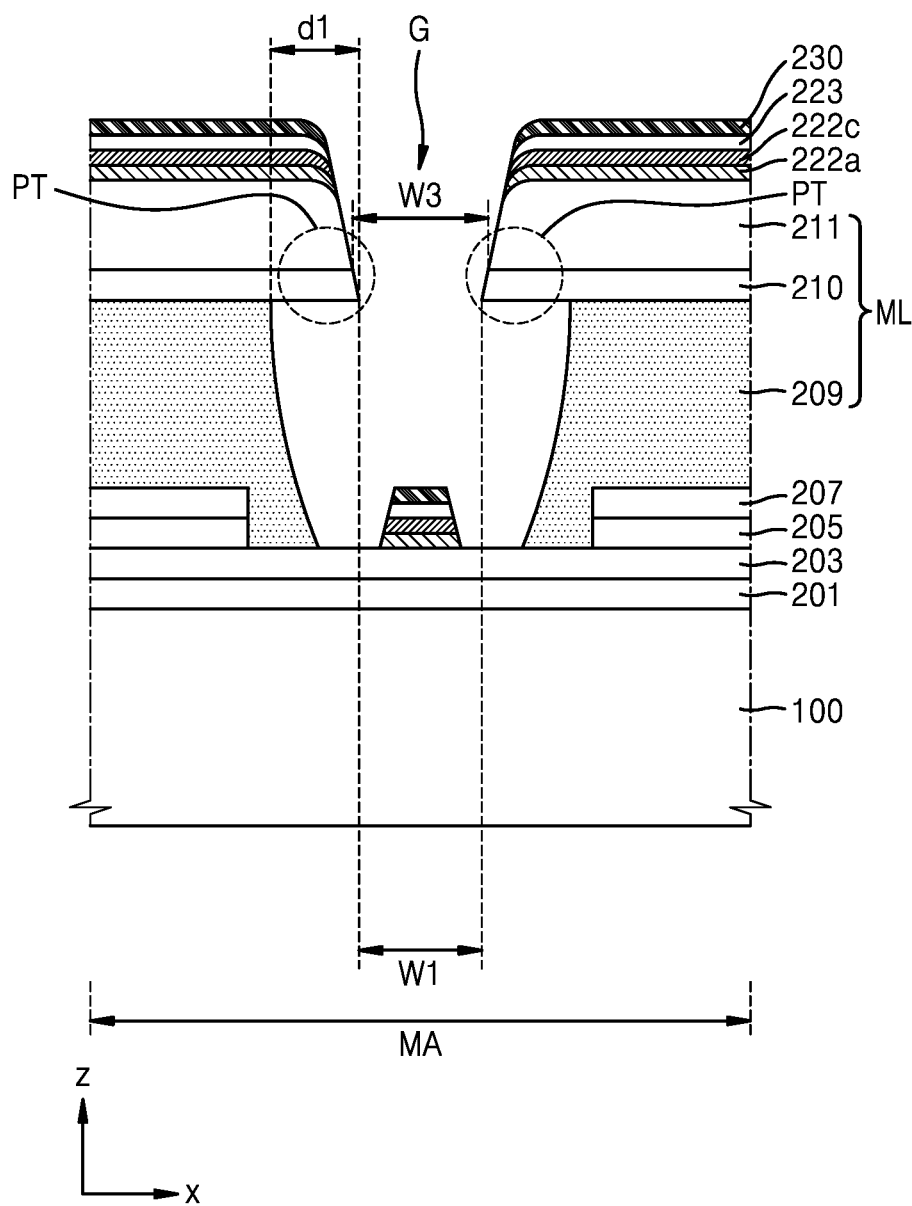
FIG. 17 is a cross-sectional view of a groove of a display panel according to another embodiment.

FIGS. 16 and 17 are extracted cross-sectional views of the groove G of a display panel according to one or more embodiments.

Referring to FIG. 16, the groove G is formed in the multi-layered film ML arranged over the substrate 100. The multi-layered film ML may include the first organic insulating layer 209, the metal layer 210, and the second organic insulating layer 211. The groove G may include the second hole 209h or the recess of the first organic insulating layer 209, the first hole 210h of the metal layer 210, and the fifth hole 211h of the second organic insulating layer 211 that overlap one another.

Though it is shown in the embodiment of FIG. 15D that the width W3 (see FIG. 15D) of the fifth hole 211h of the second organic insulating layer 211 is greater than the first width W1 of the first hole 210h of the metal layer 210, it is shown in FIG. 16 that the width W3 of the fifth hole 211h of the second organic insulating layer 211 is less than the first width W1 of the first hole 210h of the metal layer 210. A lateral surface of an end of the metal layer 210 that defines the first hole 210h may be covered by the second organic insulating layer 211, and the end of the metal layer 210 and an end of the second organic insulating layer 211 may constitute a tip PT. A protruding length d1 of the tip PT is a distance in a horizontal direction from an inner surface of the first organic insulating layer 209 located right under the tip PT to the end of the tip PT. The protruding length d1 may be a distance from the inner surface of the first organic insulating layer 209 to a lateral surface of the second organic insulating layer 211.

In one or more embodiments, referring to FIG. 17, the third width W3 of the fifth hole 211h of the second organic insulating layer 211 may be substantially equal to the first width W1 of the first hole 210h of the metal layer 210. The second organic insulating layer 211 may cover a top surface of an end of the metal layer 210 that defines the first hole 210h but may not cover a lateral surface of the end of the metal layer 210. In this case, the protruding length d1 of the tip PT may be a distance from the inner surface of the first organic insulating layer 209 located right under the tip PT to the lateral surface of the metal layer 210.

Figure 18:
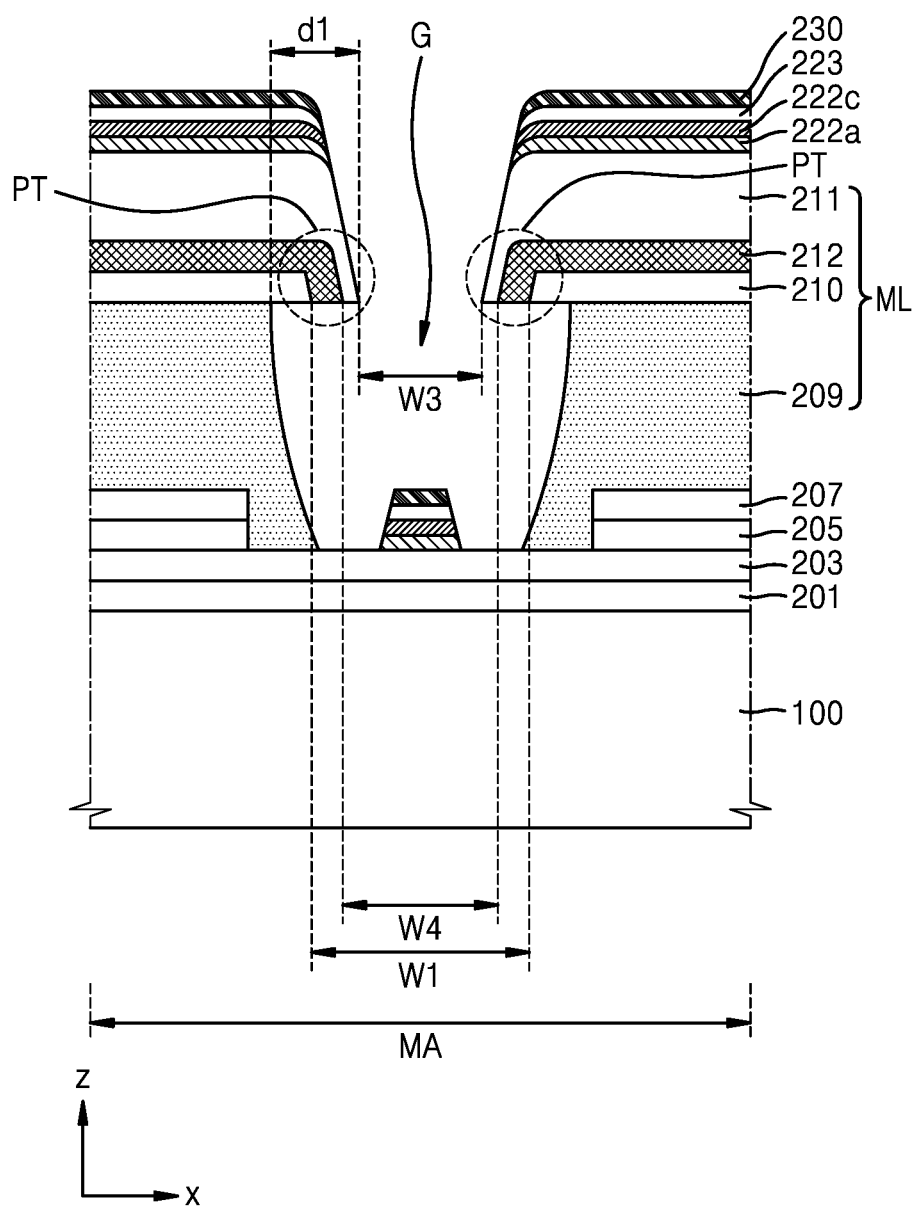
FIG. 18 is a cross-sectional view of a groove of a display panel according to another embodiment.
Figure 19:
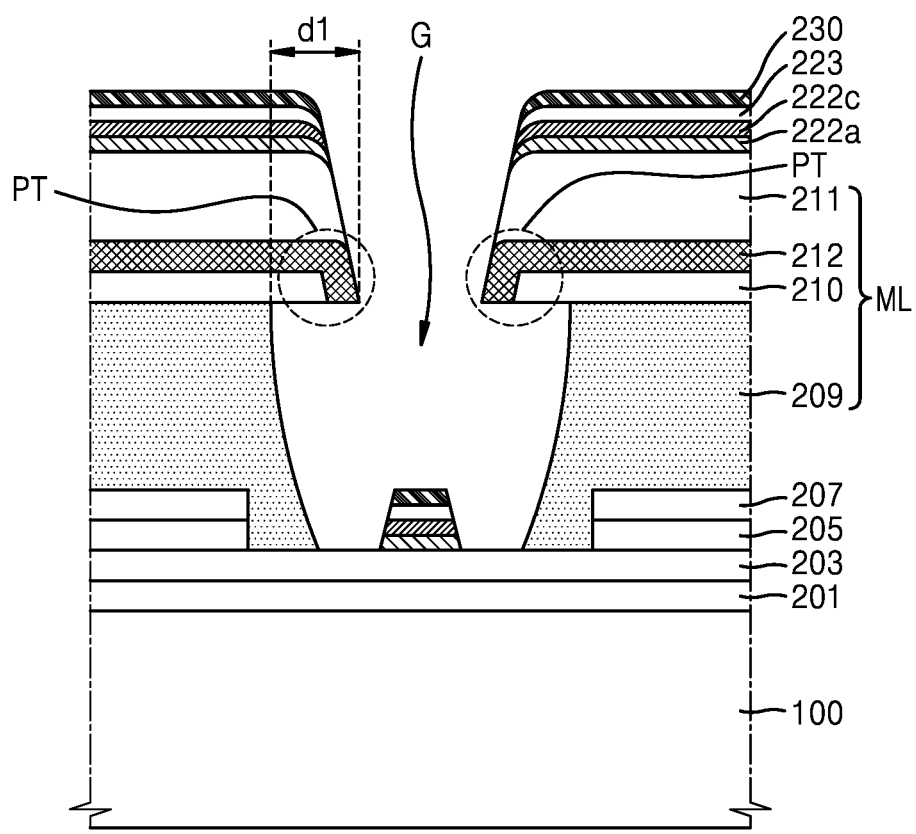
FIG. 19 is a cross-sectional view of a groove of a display panel according to another embodiment.
Figure 20:
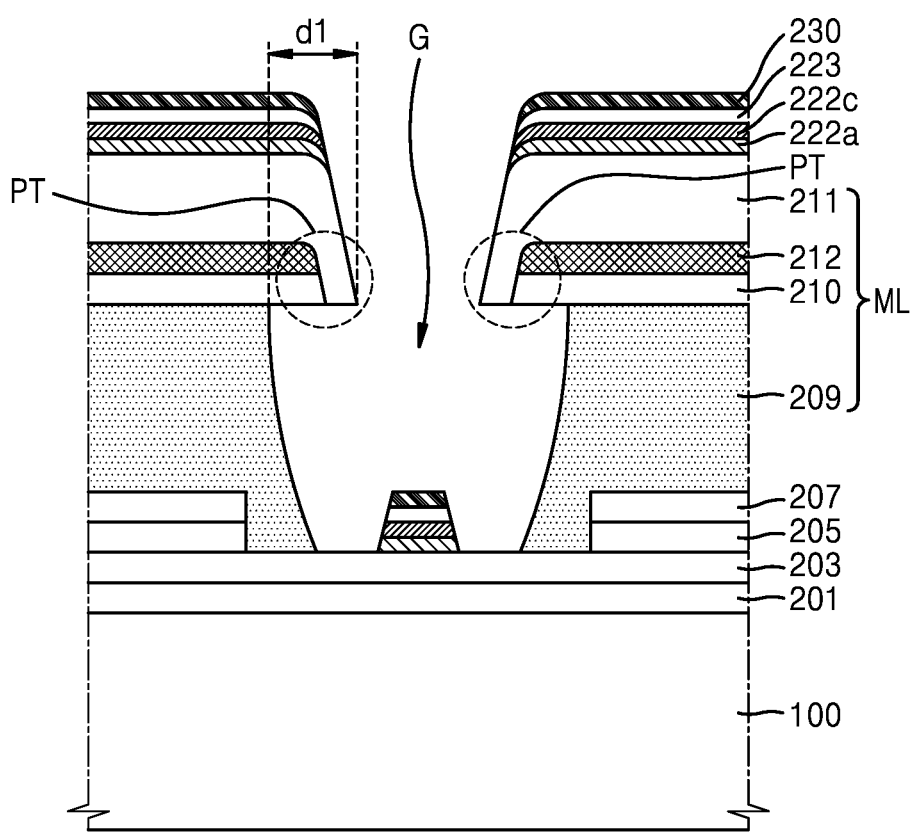
FIG. 20 is a cross-sectional view of a groove of a display panel according to another embodiment.

FIGS. 18 to 20 are extracted cross-sectional views of the groove G of a display panel according to one or more embodiments.

Referring to FIGS. 18 to 20, the groove G may be formed in the multi-layered film ML arranged over the substrate 100. The multi-layered film ML may include the first organic insulating layer 209, the metal layer 210, the inorganic insulating layer 212, and the second organic insulating layer 211. A hole or a recess formed in the first organic insulating layer 209, a hole of the metal layer 210, a hole of the inorganic insulating layer 212, and a hole of the second organic insulating layer 211 may overlap one another and constitute the groove G.

Referring to FIG. 18, the third width W3 of the hole of the second organic insulating layer 211 may be less than the fourth width W4 of the hole of the inorganic insulating layer 212 and the first width W1 of the first hole 210h of the metal layer 210. The fourth width W4 of the hole of the inorganic insulating layer 212 may be less than the first width W1 of the hole of the metal layer 210. A lateral surface of an end of the metal layer 210 that faces the center of the groove G may be sequentially covered by the inorganic insulating layer 212 and the second organic insulating layer 211. The end of the metal layer 210, an end of the inorganic insulating layer 212, and an end of the second organic insulating layer 211 that face the center of the groove G may constitute the tip PT. A protruding length d1 of the tip PT corresponds to a horizontal distance from the inner surface of the first organic insulating layer 209 to a lateral surface of the second organic insulating layer 211.

Referring to FIG. 19, a lateral surface of the end of the metal layer 210 that faces the center of the groove G may be covered by the inorganic insulating layer 212 but may not be covered by the second organic insulating layer 211. For example, the second organic insulating layer 211 may cover only a top surface of the inorganic insulating layer 212 and may not cover a lateral surface of an end of the inorganic insulating layer 212. The end of the metal layer 210 and the end of the inorganic insulating layer 212 may constitute the tip PT, and a protruding length d1 of the tip PT corresponds to a horizontal distance from the inner surface of the first organic insulating layer 209 right under the tip PT to the end of the inorganic insulating layer 212.

Referring to FIG. 20, an inorganic layer, for example, the metal layer 210 and the inorganic insulating layer 212 may be sequentially stacked and may extend further toward the center of the groove G than the inner surface of the first organic insulating layer 209. The inorganic insulating layer 212 may cover only the top surface of the metal layer 210.

An end of the inorganic layer that faces the groove G (for example, an end of a stacked structure including the metal layer 210 and the inorganic insulating layer 212) may be covered by the second organic insulating layer 211. A protruding length d1 of the tip PT corresponds to a horizontal distance from the inner surface of the first organic insulating layer 209 to the second organic insulating layer 211.

FIGS. 21 to 24 are extracted cross-sectional views of a display panel according to one or more embodiments.

Figure 21:
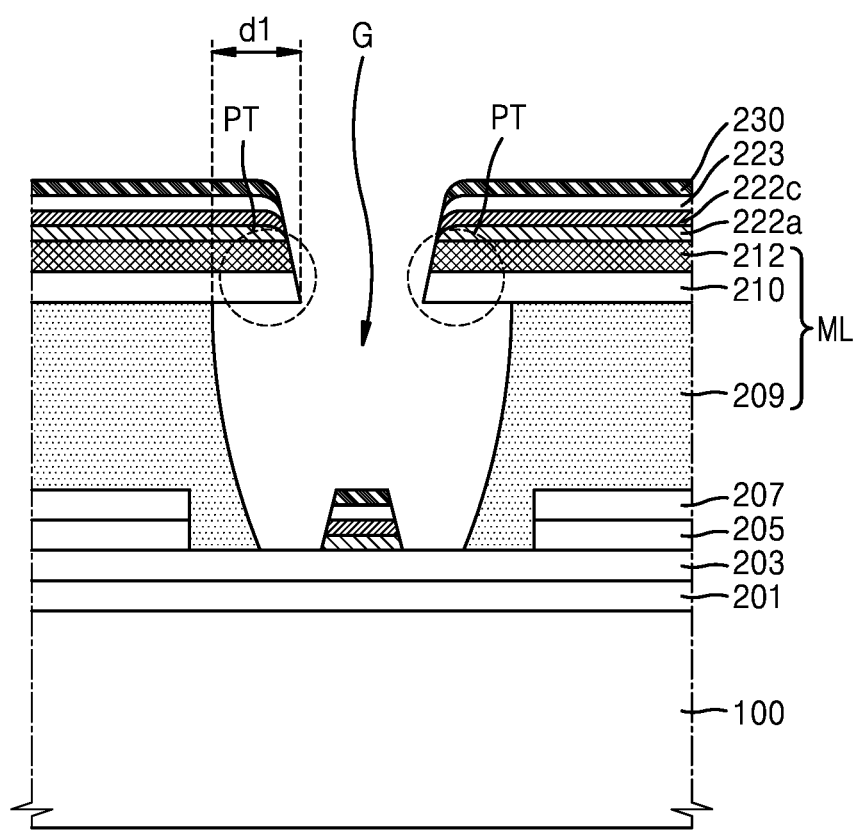
FIG. 21 is a cross-sectional view of a groove of a display panel according to another embodiment.

Referring to FIG. 21, the multi-layered film ML may include the first organic insulating layer 209, which is an organic layer, and the metal layer 210 and the inorganic insulating layer 212, which are inorganic layers. Each of the metal layer 210 and the inorganic insulating layer 212 may constitute an inorganic layer, which is the second sub-layer of the multi-layered film ML.

The groove G is formed in the multi-layered film ML, and the tip PT of the groove G is formed by a stacked structure including inorganic layers, for example, the metal layer 210 and the inorganic insulating layer 212. For example, the stacked structure including the metal layer 210 and the inorganic insulating layer 212 may protrude from the inner surface of the first organic insulating layer 209 to the center of the groove G, thereby constituting the tip PT.

Figure 22:
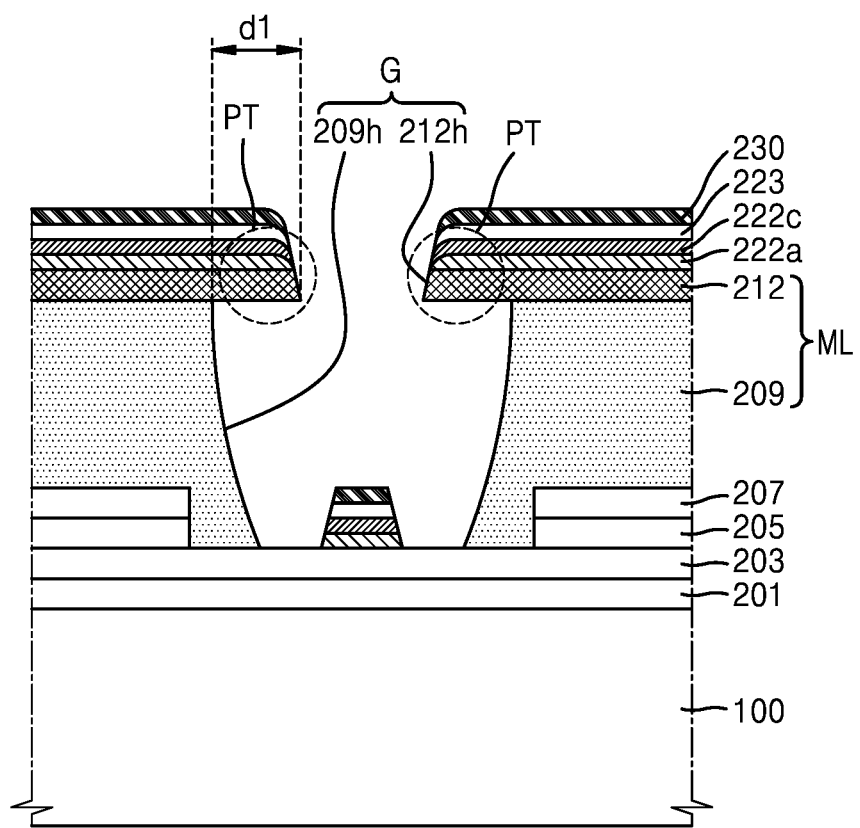
FIG. 22 is a cross-sectional view of a groove of a display panel according to another embodiment.

Referring to FIG. 22, the multi-layered film ML may include the first organic insulating layer 209, which is an organic layer, and the inorganic insulating layer 212, which is an inorganic layer.

The second hole 209h of the first organic insulating layer 209 and a sixth hole 212h of the inorganic insulating layer 212 may overlap each other and constitute the groove G formed in the multi-layered film ML. Though it is shown in FIG. 22 that the second hole 209h is formed in the first organic insulating layer 209, the first recess 209r that does not pass through the first organic insulating layer 209 may be formed in the first organic insulating layer 209 in one or more embodiments as described with reference to FIG. 13A.

An end of the inorganic insulating layer 212 that defines the sixth hole 212h may protrude from the inner surface of the first organic insulating layer 209 to constitute the tip PT. The protruding length d1 of the tip PT may be about 1 μm to about 1.5 μm as described above.

Figure 23:
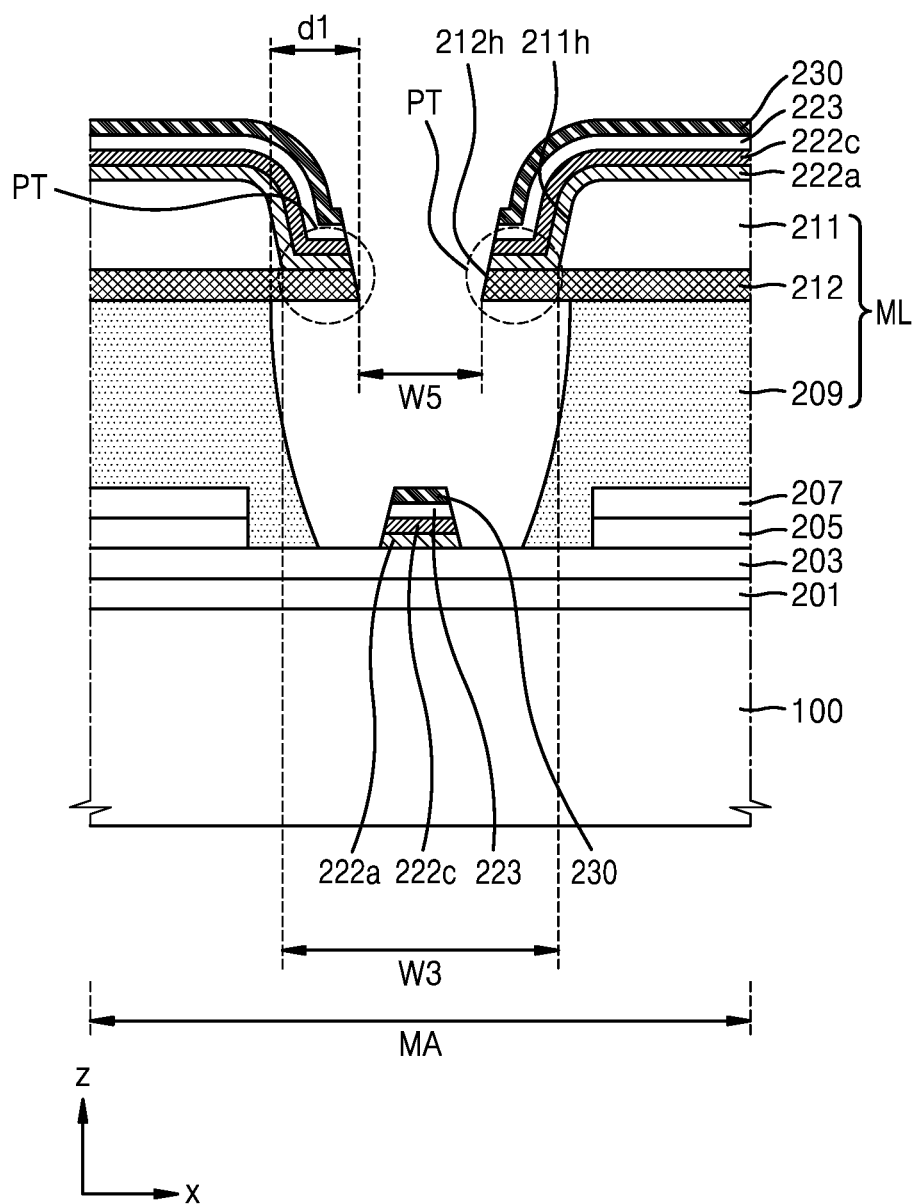
FIG. 23 is a cross-sectional view of a groove of a display panel according to another embodiment.
Figure 24:
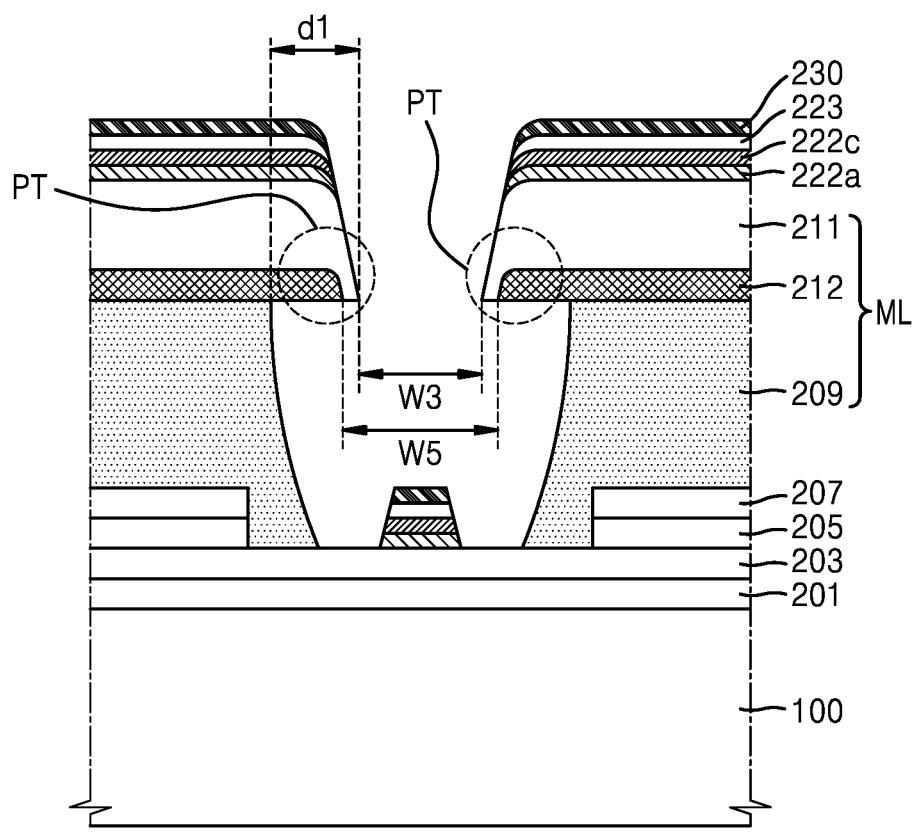
FIG. 24 is a cross-sectional view of a groove of a display panel according to another embodiment.

Referring to FIGS. 23 and 24, the second organic insulating layer 211 as a top insulating layer may be arranged on the inorganic insulating layer 212.

In one or more embodiments, as shown in FIG. 23, the third width W3 of the fifth hole 211h of the second organic insulating layer 211 may be equal to or greater than a fifth width W5 of the sixth hole 212h of the inorganic insulating layer 212. In this case, the second organic insulating layer 211 may cover only a top surface of an end of the inorganic insulating layer 212.

In one or more embodiments, as shown in FIG. 24, the third width W3 of the fifth hole 211h of the second organic insulating layer 211 may be less than the fifth width W5 of the sixth hole 212h of the inorganic insulating layer 212. In this case, a lateral surface of an end of the inorganic insulating layer 212 that defines the sixth hole 212h may be covered by the second organic insulating layer 211. The end of the inorganic insulating layer 212 and an end of the second organic insulating layer 211 may constitute the tip PT. A protruding length d1 of the tip PT corresponds to a horizontal distance from the inner surface of the first organic insulating layer 209 to the end of the second organic insulating layer 211.

Figure 25:
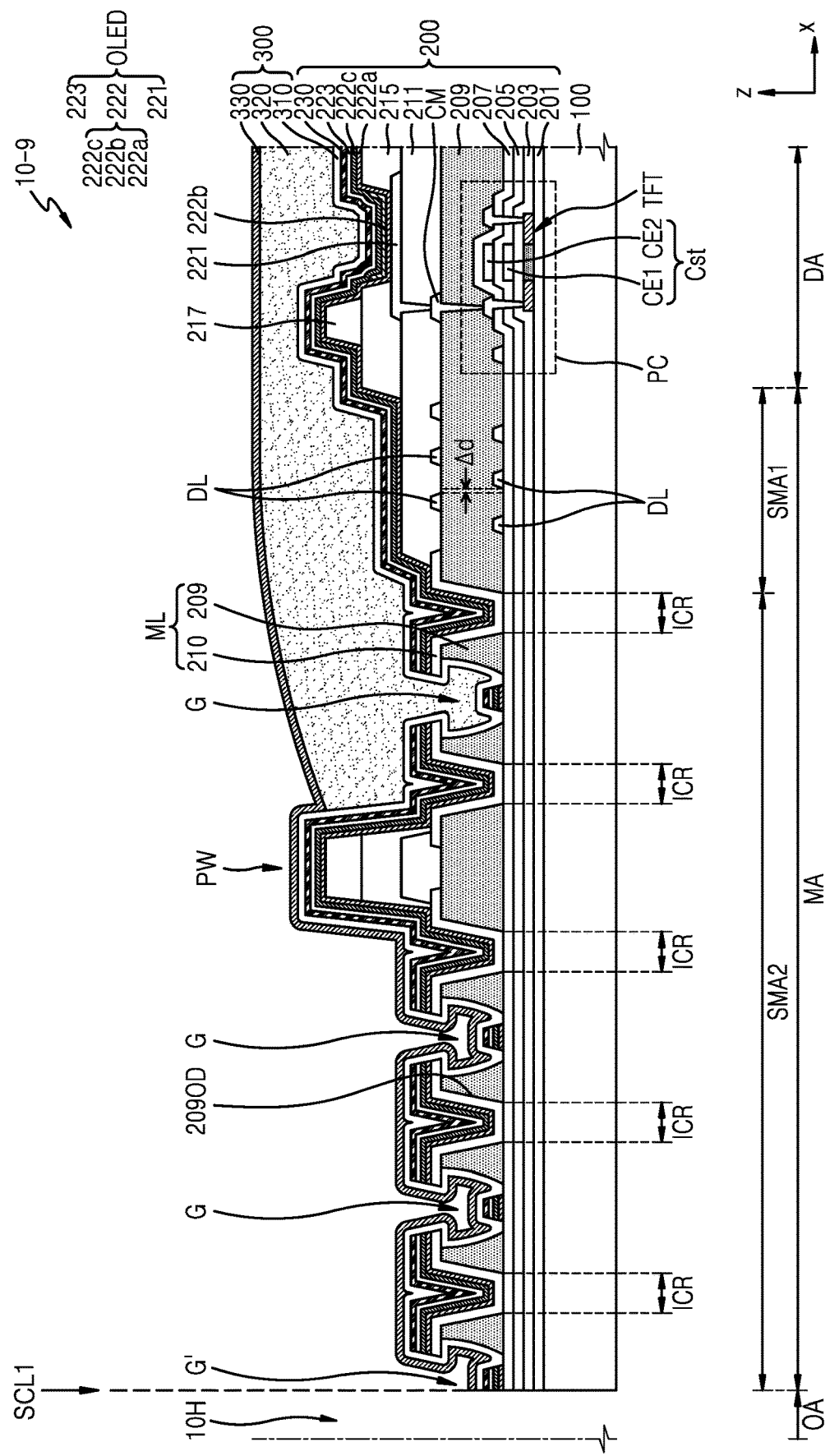
FIG. 25 is a cross-sectional view of a display panel according to another embodiment.

FIG. 25 is a cross-sectional view of a display panel 10-9 according to one or more embodiments.

Referring to FIG. 25, in the display panel 10-9, characteristics of other elements excluding the groove G arranged in the intermediate area MA are substantially the same as those of the display panel 10-1 described with reference to FIG. 8.

The display panel 10-9 may include three or more grooves G arranged in the intermediate area MA. An inorganic contact region ICR may be arranged between neighboring grooves G. The first functional layer 222a, the second functional layer 222c, the opposite electrode 223, and/or the capping layer 230 may be disconnected by each groove G. Though it is shown in FIG. 25 that the groove G and the inorganic contact region ICR have substantially the same structures as those described with reference to FIGS. 8 to 9D, the present disclosure is not limited thereto. In one or more embodiments, the groove G, the partition wall PW, and/or the inorganic contact region ICR may have the same structures as those of the embodiment(s) described with reference to FIGS. 10A to 24 or structures derived therefrom.

The display panel 10-9 may include the first opening 10H located in the first area OA. The first opening 10H may be formed by removing elements located in the first area OA by a scribing or cutting process. The scribing or cutting process may be performed along a first line SCL1, and FIG. 25 shows the display panel 10-9 on which the scribing or cutting process, etc. have been performed along the first line SCL1.

One groove G' among the grooves G may pass through the first line SCL1. In this case, a stacked body including the first functional layer 222a, the second functional layer 222c, the opposite electrode 223, and the capping layer 230 may each be disconnected (or separated, or patterned) by the groove G' face the first opening 10H. In one or more embodiments, the first line SCL1 may be located between two neighboring grooves G among the grooves G. In this case, a lateral surface of the display panel that defines the first opening 10H may be the same as that shown in FIG. 8. For example, as shown in FIG. 8, a structure located in an inorganic contact region ICR may face the first opening 10H.

Figure 26:
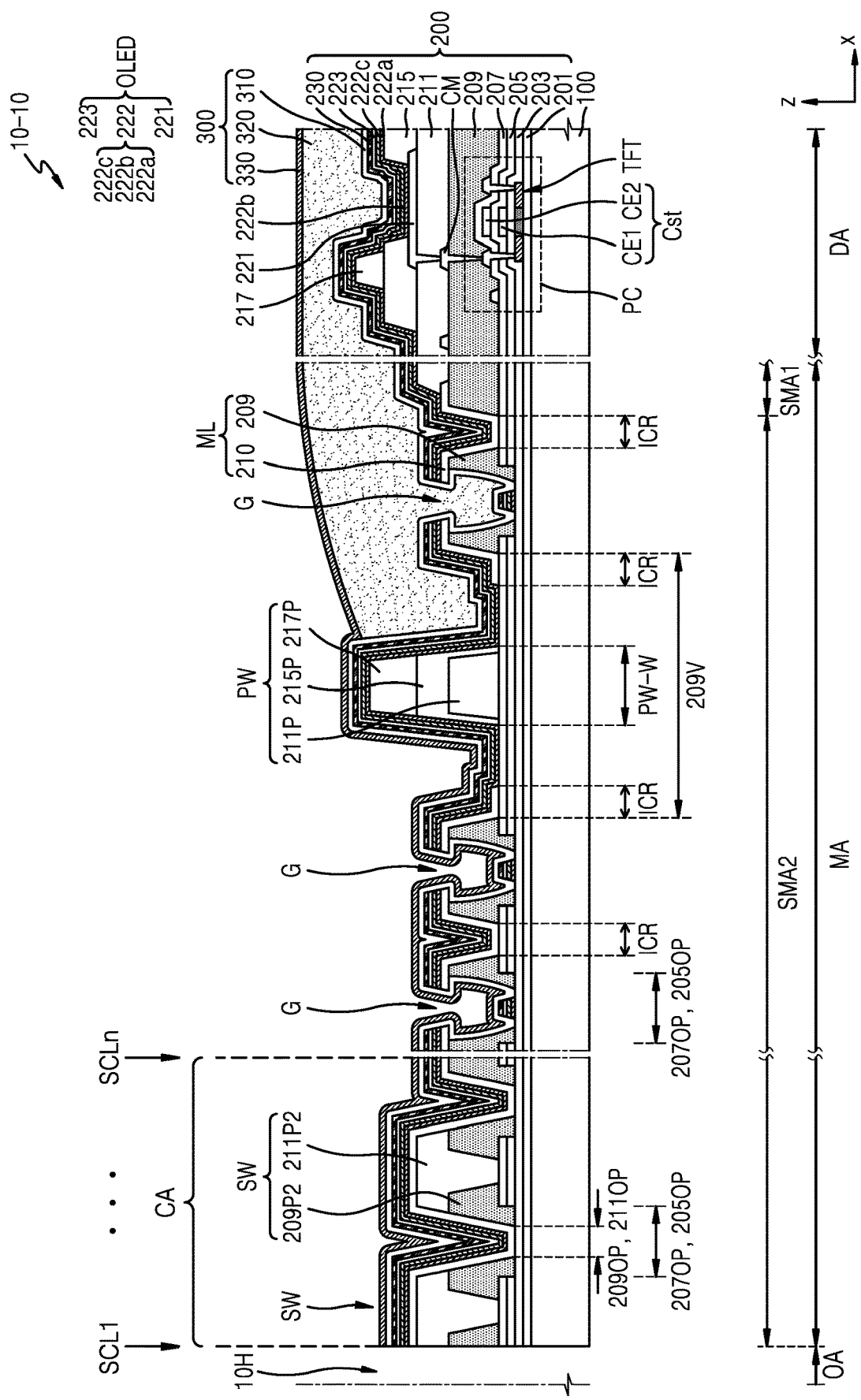
FIG. 26 is a cross-sectional view of a display panel according to another embodiment.

FIG. 26 is a cross-sectional view of a display panel 10-10 according to one or more embodiments.

Referring to FIG. 26, an organic element SW as a crack prevention (or reduction) structure may be located in a portion of the intermediate area MA, for example, a partial region of the second sub-intermediate area SMA2 that is adjacent to the first area OA. The organic element SW may include a portion 209P2 of the first organic insulating layer 209 and a portion 211P2 of the second organic insulating layer 211 that are stacked.

As described above, the first opening 10H of the display panel 10-10 may be formed by removing elements located in the first area OA by a scribing or cutting process. Though it is shown in FIG. 26 that the scribing or cutting process has been performed along a first line SCL1, the cutting process may be performed along one of the first line SCL1 to an n-th line SCLn in one or more embodiments. A region ranging from the first line SCL1 to the n-th line SCLn may be understood as a scribing or cutting area CA.

One or more organic elements SW may be arranged in the scribing or cutting area CA. The organic element SW may absorb or buffer an impact that may occur during the above-described scribing or cutting process and/or an impact, etc. that may occur during the manufacturing of the display panel 10-10 or after the display panel 10-10 is manufactured. Therefore, the occurrence of a crack in layer(s) including an inorganic material may be prevented, reduced, or minimized.

A portion 209P2 of the first organic insulating layer 209 and a portion 211P2 of the second organic insulating layer 211 included in the organic element SW may directly contact each other. In one or more embodiments, since a hole is formed in a portion 209P2 of the first organic insulating layer 209 and a portion 211P2 of the second organic insulating layer 211 is located in the formed hole, a contact area thereof may be increased.

As described above, the first opening 10H of the display panel 10-10 may be formed through the scribing or cutting process. The cutting process may use a laser. When a layer including a metal is arranged between the portion 209P2 of the first organic insulating layer 209 and the portion 211P2 of the second organic insulating layer 211, the laser may be reflected and thus it may be difficult to form the first opening 10H. In contrast, according to the present disclosure, since the portion 211P2 of the second organic insulating layer 211 directly contacts the portion 209P2 of the first organic insulating layer 209, the reflection issue may be prevented or reduced.

The partition wall PW arranged between neighboring grooves G in the intermediate area MA may include a plurality of layers. In the above, though it is shown in FIG. 25 that the partition wall PW is arranged on the first organic insulating layer 209, and a portion of the first organic insulating layer 209 is an element of the partition wall PW, referring to FIG. 26, the first organic insulating layer 209 may not be provided in a region in which the partition wall PW is located. For example, the first organic insulating layer 209 may include an interval portion 209V overlapping the partition wall PW. The interval portion 209V includes an opening (e.g., a hole or through hole) in the first organic insulating layer 209. A width of the interval portion 209V may be greater than a width PW-W of the partition wall PW. The partition wall PW may be spaced apart from a lateral surface of the first organic insulating layer 209 that defines the interval portion 209V.

The partition wall PW may have a structure in which a portion 211P of the second organic insulating layer 211, a portion 215P of the pixel-defining layer 215, and a portion 217P of the spacer 217 are stacked. A height of the partition wall PW may be determined by the above-described portions.

Figure 27:
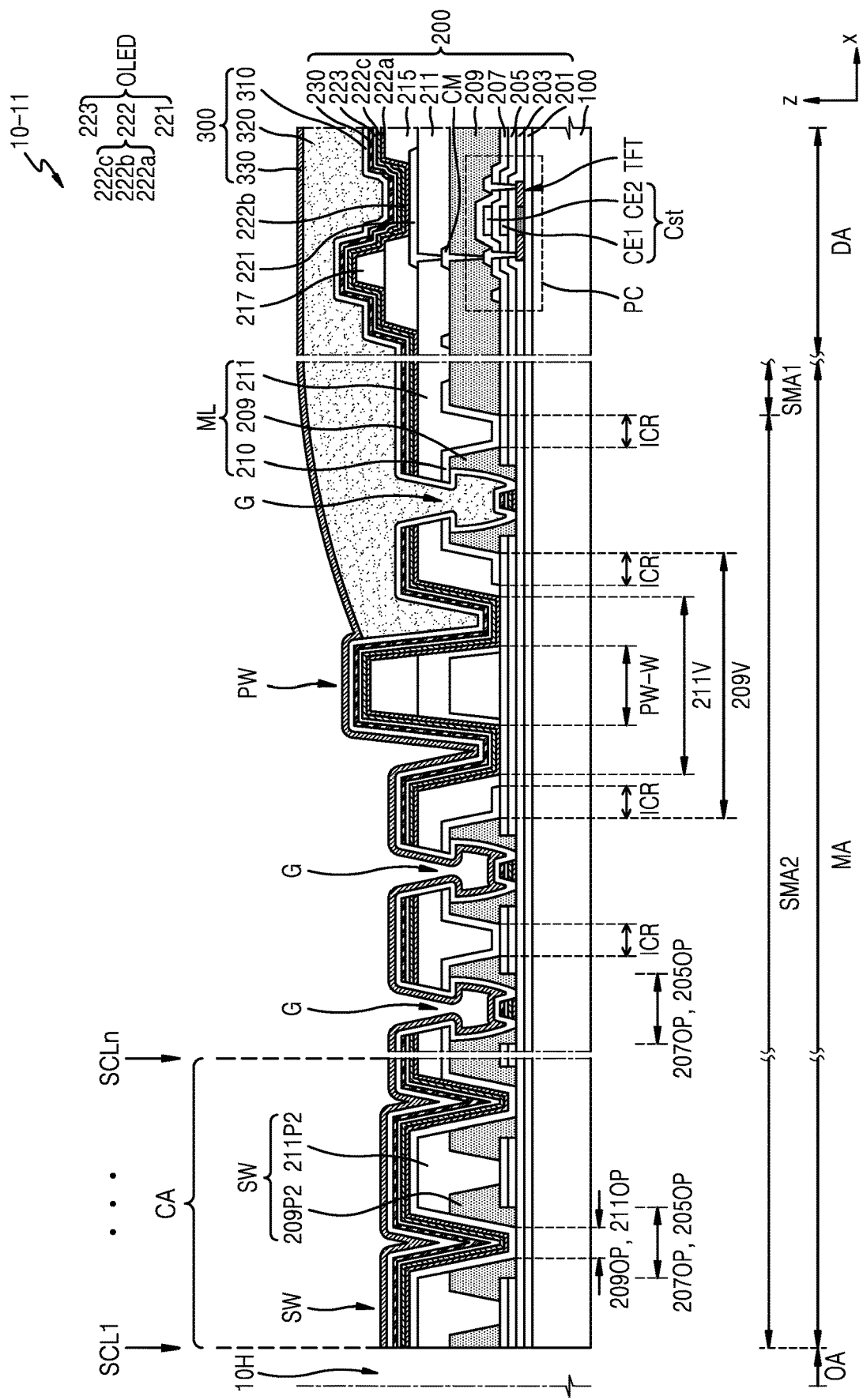
FIG. 27 is a cross-sectional view of a display panel according to another embodiment.

FIG. 27 is a cross-sectional view of a display panel 10-11 according to one or more embodiments.

Referring to FIG. 27, characteristics of other elements of the display panel 10-11 are substantially the same as those of the display panel 10-10 described with reference to FIG. 26 except the grooves G arranged in the intermediate area MA. For example, the display panel 10-11 may include an organic element SW that is located in the intermediate area MA and is adjacent to the first opening 10H. A region in which the organic element SW is arranged is a cutting area CA. The display panel 10-11 may or may not include the organic element SW depending on a line (e.g. the first line SCL1 to the n-th line SCLn) along which a scribing or cutting process is performed while the display panel 10-11 is manufactured.

The grooves G may be arranged in the intermediate area MA and arranged between the organic element SW and organic light-emitting diodes OLED in the display area DA. Each of the grooves G may be formed in the multi-layered film ML including the first organic insulating layer 209, the metal layer 210, and the second organic insulating layer 211. A specific structure thereof may have a structure according to the embodiments described with reference to FIGS. 15F, 15G to 17, or embodiments derived therefrom.

The partition wall PW may be arranged between neighboring grooves G. The first organic insulating layer 209 and the second organic insulating layer 211 may respectively include interval portions 209V and 211V, each corresponding to the partition wall PW (e.g., overlapping the region in which the partition wall PW is located). Each of the interval portions 209V and 211V is an opening (e.g., a hole or through hole).

The interval portion 209V of the first organic insulating layer 209 and the interval portion 211V of the second organic insulating layer 211 may overlap the partition wall PW. A width of the interval portion 209V of the first organic insulating layer 209 may be greater than a width of the interval portion 211V of the second organic insulating layer 211. A width of the interval portion 211V of the second organic insulating layer 211 may be greater than a width PW-W of the partition wall PW. The partition wall PW may be spaced apart from a lateral surface of the first organic insulating layer 209 and a lateral surface of the second organic insulating layer 211 that respectively define the interval portions 209V and 211V.

Figure 28:
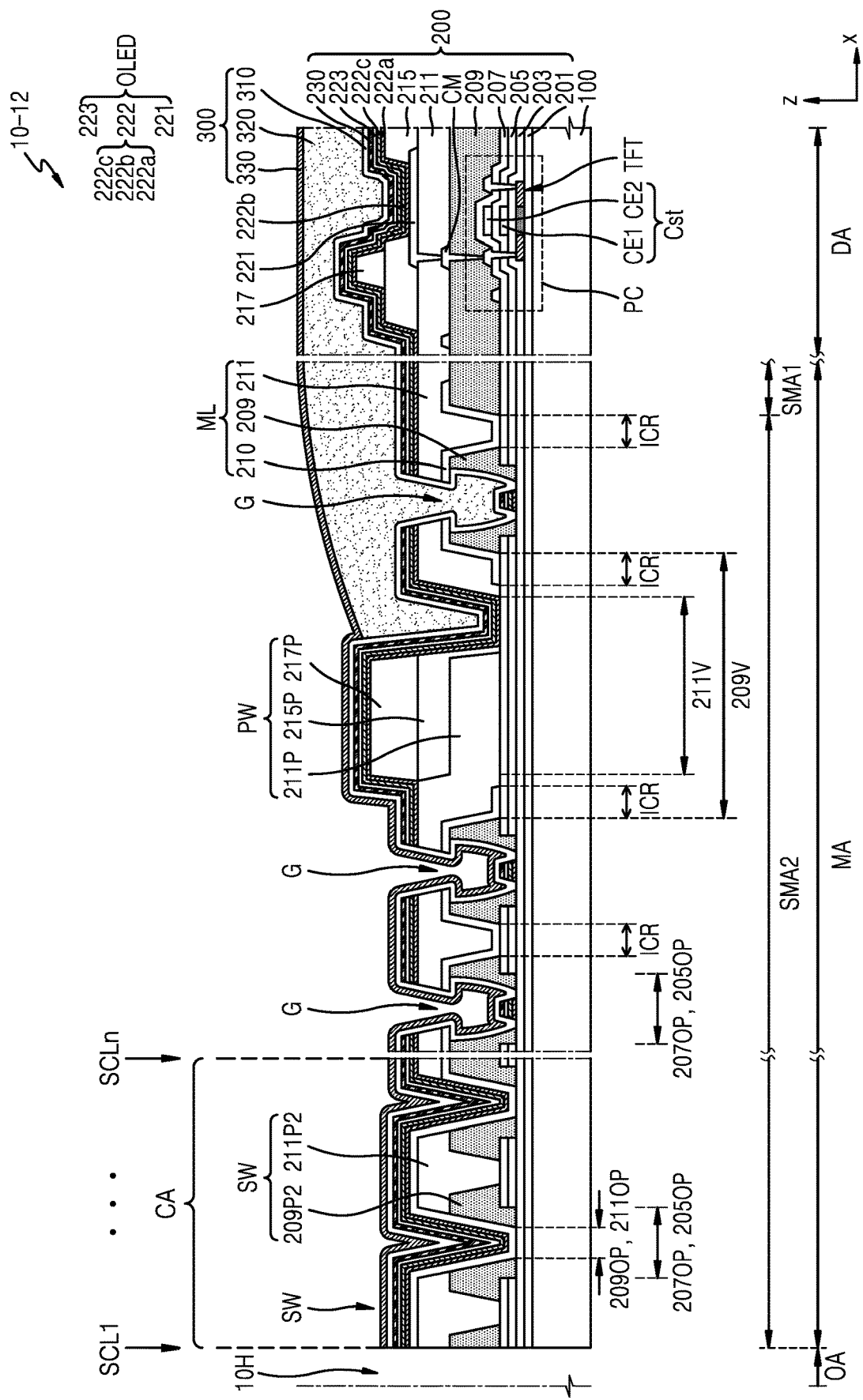
FIG. 28 is a cross-sectional view of a display panel according to another embodiment.

FIG. 28 is a cross-sectional view of a display panel 10-12 according to one or more embodiments.

Referring to FIG. 28, like the display panel 10-11 described with reference to FIG. 27, the display panel 10-12 includes the organic element SW, the grooves G, and the partition wall PW arranged in the intermediate area MA. Since structures of the organic element SW and the grooves G are the same as those described above, a structure of the partition wall PW is mainly described below.

The partition wall PW is arranged between neighboring grooves G. The first organic insulating layer 209 and the second organic insulating layer 211 may respectively include the interval portions 209V and 211V, each overlapping the partition wall PW. The partition wall PW may have a structure in which a portion 211P of the second organic insulating layer 211, a portion 215P of the pixel-defining layer 215, and a portion 217P of the spacer 217 are stacked. In this case, the portion 211P of the second organic insulating layer 211 may correspond to a sub-layer of the multi-layered film ML constituting the groove G.

Figure 29:
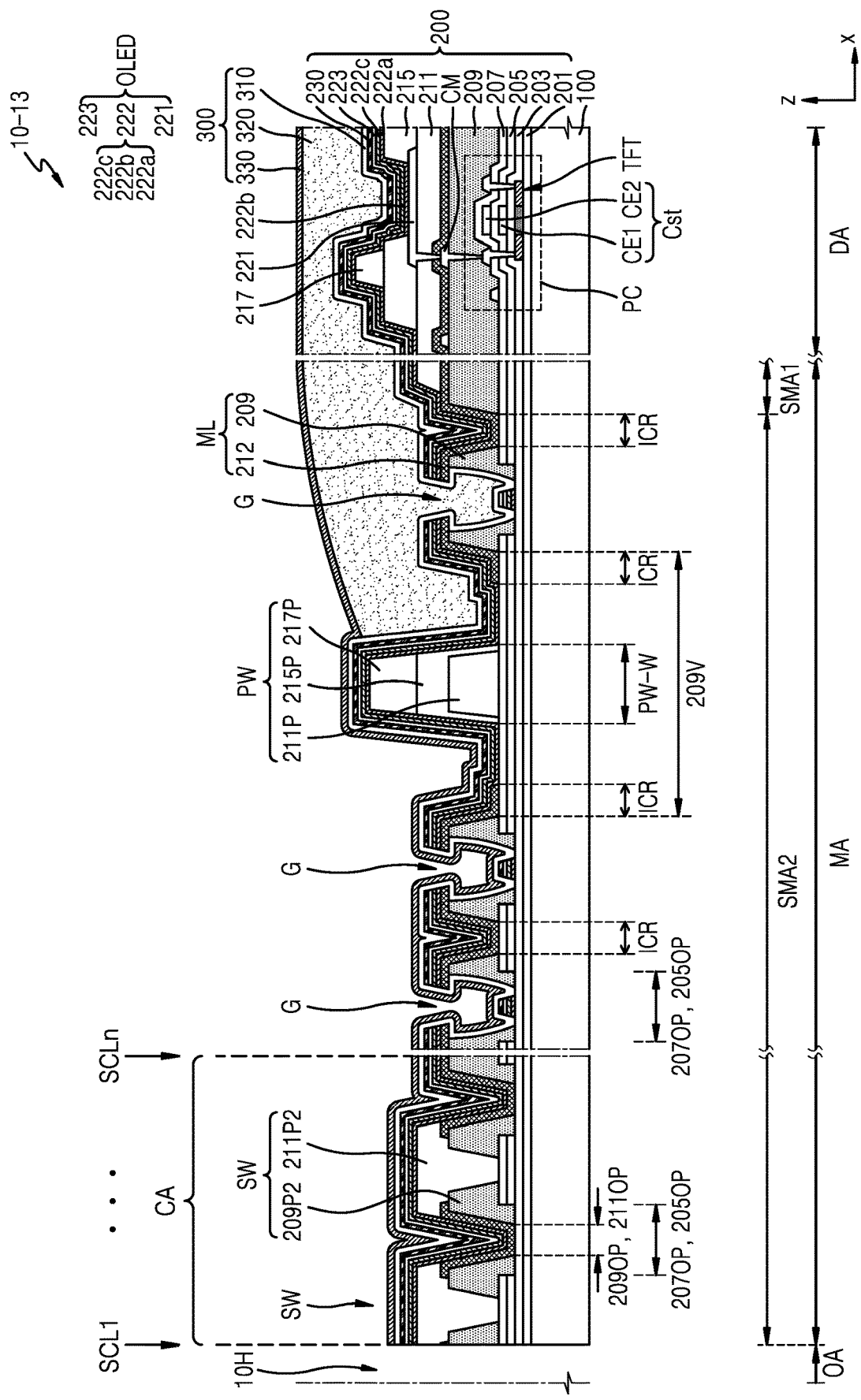
FIG. 29 is a cross-sectional view of a display panel according to another embodiment.

FIG. 29 is a cross-sectional view of a display panel 10-13 according to one or more embodiments.

Referring to FIG. 29, the display panel 10-13 may include the grooves G arranged in the intermediate area MA. The groove G may be formed in the multi-layered film ML including the first organic insulating layer 209 and the inorganic insulating layer 212. The inorganic insulating layer 212 is a layer arranged between the first organic insulating layer 209 and the second organic insulating layer 211 and may be located in the display area DA and the intermediate area MA. The inorganic insulating layer 212 may cover a portion of the contact metal layer CM in the display area DA. Since a specific structure of the groove G is the same as that of the embodiment described with reference to FIG. 22, duplicative description thereof is not provided here. In one or more embodiments, the display panel 10-13 may have a structure of one of the embodiments described with reference to FIGS. 18, 21, 23, and 24.

Figure 30:
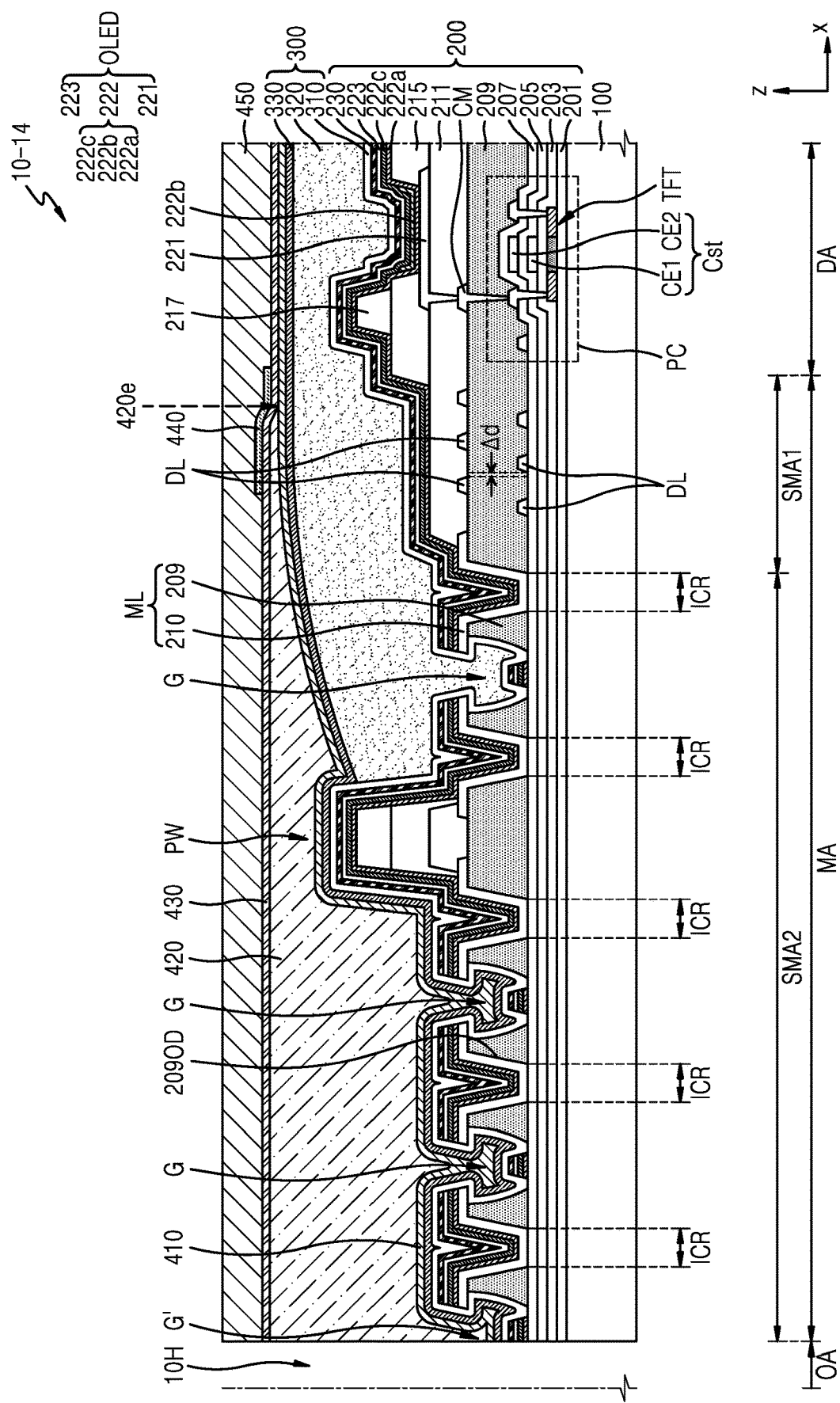
FIG. 30 is a cross-sectional view of a display panel according to another embodiment.

The display panel 10-13 may include the organic element SW that is arranged in the intermediate area MA and is adjacent to the first opening 10H. There may or may not be the organic element SW in the display panel 10-13 depending on a scribing or cutting process. FIG. 30 is a cross-sectional view of a display panel 10-14 according to one or more embodiments.

Referring to FIG. 30, the display panel 10-14 may include a planarization layer 420 arranged over the thin-film encapsulation layer 300 and located in the intermediate area MA. In one or more embodiments, the planarization layer 420 may be arranged in only the intermediate area MA.

The planarization layer 420 may include an organic insulating layer. The planarization layer 420 may include a polymer-based material. For example, the planarization layer 420 may include a silicon-based resin, an acrylic-based resin, an epoxy-based resin, polyimide, and/or polyethylene.

In one or more embodiments, the planarization layer 420 may include a material different from that of the organic encapsulation layer 320.

The planarization layer 420 may cover at least one groove G located in the intermediate area MA. The planarization layer 420 may increase flatness of the display panel 10-14 around the first opening OA by covering a region that is not covered by the organic encapsulation layer 320 in the intermediate area MA. Therefore, separation or floating issue of the input sensing layer 40 (see FIGS. 2A and/or 2B) and/or the optical functional layer 50 (see FIGS. 2A and/or 2B) of the display panel 10-14 may be prevented or reduced. A portion of the planarization layer 420 may overlap the organic encapsulation layer 320. One end of the planarization layer 420, for example, a first edge 420e adjacent to the display area DA may be located over the organic encapsulation layer 320.

The planarization layer 420 may be formed in the intermediate area MA through exposure and development processes, etc. During some of processes (e.g. a washing process) of forming the planarization layer 420, in the case where external foreign substance (for example, moisture) progresses in a lateral direction of the display panel 10-14 the organic light-emitting diode OLED in the display area DA may be damaged. In contrast, according to embodiments, since insulating layers (for example, a first insulating layer 410 and a second insulating layer 430) are respectively arranged under and on the planarization layer 420, the above-described issue due to moisture penetration and/or float, etc. of a neighboring layer may be prevented or reduced during and after a process of forming the planarization layer 420.

The first insulating layer 410 and the second insulating layer 430 may respectively directly contact a bottom surface and a top surface of the planarization layer 420. The first insulating layer 410 and the second insulating layer 430 may each independently include an inorganic insulating material such as silicon oxide, silicon nitride, and/or silicon oxynitride. Each of the first insulating layer 410 and the second insulating layer 430 may include a single layer or a multi-layer including the above materials.

The planarization layer 420 may have a step difference with respect to layer(s) therebelow. A portion of the planarization layer 420 that includes the first edge 420e may have a step difference with respect to a top surface of the first insulating layer 410. During and/or after a process of manufacturing the display panel 10-14 to prevent or reduce separation or float of the planarization layer 420 from a layer therebelow due to the step difference, a cover layer 440 may be located over the first edge 420e.

The cover layer 440 may include a metal. Each of the first insulating layer 410, the second insulating layer 430, and a third insulating layer 450 described below extends to not only the intermediate area MA but also the display area DA. In contrast, the cover layer 440 may cover the first edge 420e of the planarization layer 420 with a predetermined (or set) width. The cover layer 440 over the planarization layer 420 may extend toward the display area DA beyond the first edge 420e of the planarization layer 420 but may not extend toward the display area DA.

The third insulating layer 450 may be located on the cover layer 440. The third insulating layer 450 may include an organic insulating material. For example, the organic insulating material of the third insulating layer 450 may include a photoresist (a negative or positive photoresist) and/or a polymer-based organic material and may extend toward the display area DA to cover the display area DA.

The characteristics described with reference to FIG. 30 are also equally applicable to the display panel according to the embodiments described with reference to FIGS. 8 to 29 and embodiments derived therefrom.

A display panel according to embodiments may block or reduce the external foreign substances such as moisture that may damage the display elements around the first area OA. However, this effect is provided as an example and embodiments of the present disclosure are not limited thereto.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and equivalents thereof.

What is claimed is:

1. A display panel comprising:
   a substrate comprising a first region in which a through hole is formed, a second region surrounding the first region, and a third region, the third region being between the first region and the second region;
   a display element in the second region and comprising a pixel electrode, an opposite electrode, and an intermediate layer comprising at least one organic material layer, the intermediate layer being between the pixel electrode and the opposite electrode;
   a first metal layer in the third region and separated from the opposite electrode,
   a second metal layer in the third region and separated from the opposite electrode; and
   a lower layer in the third region, wherein a groove is defined in the lower layer, a first lateral surface of the lower layer and a second lateral surface of the lower layer face each other with the groove therebetween and define the groove,
   wherein the first metal layer and the second metal layer are directly on above the lower layer in the third region, the first metal layer comprises a first protruding part protruding to the groove more than a first point at which a bottom surface of the first metal layer and the first lateral surface of the lower layer meet, and the second metal layer comprises a second protruding part protruding to the groove more than a second point at which a bottom surface of the second metal layer and the second lateral surface of the lower layer meet,
   wherein the first protruding part of the first metal layer and the second protruding part of the second metal layer face each other with a gap therebetween, and
   wherein the at least one organic material layer of the intermediate layer is disconnected by the first protruding part and the second protruding part such that the at least one organic material layer comprises:
   a first portion on an upper surface of first protruding part;
   a second portion on an upper surface of the second protruding part; and
   a third portion in the groove, wherein the first, second, and third portions are separated from each other,
   wherein a vertical distance from an upper surface of the substrate to an upper surface of the third portion is less than a vertical distance from the upper surface of the substrate to an upper surface of the first portion.

2. The display panel of claim 1, wherein
   the opposite electrode is disconnected by the first protruding part of the first metal layer and the second protruding part of the second metal layer.

3. The display panel of claim 1, wherein
   the opposite electrode comprises a first portion, a second portion, and a third portion that are separated and disconnected by the first protruding part of the first metal layer and the second protruding part of the second metal layer, and
   the first portion of the opposite electrode is disposed on the first protruding part of the first metal layer and overlaps the first portion of the at least one organic material layer,
   the second portion of the opposite electrode is disposed on the second protruding part of the second metal layer and overlaps the second portion of the at least one organic material layer, and
   the third portion of the opposite electrode is positioned in an area under the first protruding part of the first metal layer and the second protruding part of the second metal layer and overlaps the third portion of the at least one organic material layer.

4. The display panel of claim 3, wherein
   the third portion of the opposite electrode and the third portion of the at least one organic material layer overlap each other and are positioned in the groove.

5. The display panel of claim 1, wherein
   a material of each of the first metal layer and the second metal layer is different from a material of the lower layer.

6. The display panel of claim 1, further comprising:
   a first inorganic encapsulation layer on the display element and extending toward the third region, wherein a portion of the first inorganic encapsulation layer overlaps a top surface, a lateral surface, and a bottom surface of the first protruding part of the first metal layer.

7. The display panel of claim 6, wherein
   the portion of the first inorganic encapsulation layer continuously extends in order to overlap the top surface, the lateral surface, and the bottom surface of the first protruding part of the first metal layer.

8. The display panel of claim 1, wherein a depth of the groove is equal to or less than a thickness of the lower layer.

* * * * *